(12) United States Patent
Fujita et al.

(10) Patent No.: US 10,515,907 B2
(45) Date of Patent: Dec. 24, 2019

(54) THREE-DIMENSIONAL MEMORY DEVICE CONTAINING HYDROGEN DIFFUSION BLOCKING STRUCTURES AND METHOD OF MAKING THE SAME

(71) Applicant: SANDISK TECHNOLOGIES LLC, Plano, TX (US)

(72) Inventors: Takahito Fujita, Yokkaichi (JP); Kiyokazu Shishido, Yokkaichi (JP); Hiroyuki Ogawa, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/982,188

(22) Filed: May 17, 2018

(65) Prior Publication Data
US 2019/0355672 A1    Nov. 21, 2019

(51) Int. Cl.
| | |
|---|---|
| *H01L 23/00* | (2006.01) |
| *H01L 23/522* | (2006.01) |
| *H01L 27/11556* | (2017.01) |
| *H01L 21/768* | (2006.01) |
| *H01L 27/1157* | (2017.01) |
| *H01L 27/11524* | (2017.01) |
| *H01L 27/11582* | (2017.01) |

(52) U.S. Cl.
CPC ...... *H01L 23/564* (2013.01); *H01L 21/76802* (2013.01); *H01L 23/5226* (2013.01); *H01L 27/1157* (2013.01); *H01L 27/11524* (2013.01); *H01L 27/11556* (2013.01); *H01L 27/11582* (2013.01)

(58) Field of Classification Search
CPC combination set(s) only.
See application file for complete search history.

(56) References Cited

U.S. PATENT DOCUMENTS

| | | |
|---|---|---|
| 5,915,167 A | 6/1999 | Leedy |
| 6,858,442 B2 | 2/2005 | Hilliger et al. |
| 6,876,021 B2 | 4/2005 | Martin et al. |
| 6,998,275 B2 | 2/2006 | Zhao et al. |
| 7,101,788 B2 | 9/2006 | Smith et al. |
| 7,323,407 B2 | 1/2008 | Lee et al. |
| 7,579,277 B2 | 8/2009 | Owada et al. |
| 8,847,302 B2 | 9/2014 | Alsmeier et al. |

(Continued)

FOREIGN PATENT DOCUMENTS

| | | |
|---|---|---|
| KR | 1020100104908 A | 9/2010 |
| WO | WO2017112014 A1 | 6/2017 |

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Matthew L Reames
(74) *Attorney, Agent, or Firm* — The Marbury Law Group PLLC

(57) ABSTRACT

A semiconductor structure includes a semiconductor device, an overlying silicon nitride diffusion barrier layer, and an interconnect structure extending through the silicon nitride diffusion barrier layer. The interconnect structure includes a titanium diffusion barrier structure in contact with the silicon nitride diffusion barrier layer to form a continuous hydrogen diffusion barrier structure.

17 Claims, 73 Drawing Sheets

(56) References Cited

U.S. PATENT DOCUMENTS

| | | |
|---|---|---|
| 9,559,117 B2 | 1/2017 | Pachamuthu et al. |
| 9,570,463 B1 | 2/2017 | Zhang et al. |
| 9,876,031 B1 | 1/2018 | Shimizu et al. |
| 9,960,181 B1 | 5/2018 | Cui et al. |
| 2002/0092780 A1 | 7/2002 | Nadanami et al. |
| 2002/0141920 A1 | 10/2002 | Alvin et al. |
| 2002/0187075 A1 | 12/2002 | Nadanami et al. |
| 2003/0158273 A1 | 8/2003 | Kosako et al. |
| 2003/0162384 A1 | 8/2003 | Smith et al. |
| 2004/0026265 A1 | 2/2004 | Nadanami et al. |
| 2004/0099893 A1 | 5/2004 | Martin et al. |
| 2004/0134768 A1 | 7/2004 | Wang et al. |
| 2004/0134769 A1 | 7/2004 | Wang et al. |
| 2004/0166629 A1 | 8/2004 | Hilliger et al. |
| 2004/0203176 A1 | 10/2004 | Zhao et al. |
| 2005/0208756 A1 | 9/2005 | Matsushita et al. |
| 2006/0051910 A1 | 3/2006 | Tababe |
| 2006/0063376 A1 | 3/2006 | Lee et al. |
| 2006/0071264 A1 | 4/2006 | Hemink et al. |
| 2006/0094219 A1 | 5/2006 | Soda |
| 2006/0170020 A1* | 8/2006 | Ohta ............... H01L 21/76834 257/295 |
| 2007/0197032 A1 | 8/2007 | Owada et al. |
| 2007/0232016 A1 | 10/2007 | Hayashi et al. |
| 2008/0099067 A1 | 5/2008 | Ito et al. |
| 2009/0007960 A1 | 1/2009 | Ito et al. |
| 2010/0123175 A1* | 5/2010 | Kanaya ............ H01L 27/11507 257/295 |
| 2010/0261028 A1 | 10/2010 | Kondoh et al. |
| 2010/0261294 A1 | 10/2010 | Hayashi et al. |
| 2010/0295136 A1 | 11/2010 | Or-Bach et al. |
| 2012/0001250 A1 | 1/2012 | Alsmeier |
| 2012/0306026 A1 | 12/2012 | Guo et al. |
| 2014/0027809 A1 | 1/2014 | Taniguchi et al. |
| 2016/0181761 A1 | 6/2016 | Taniguchi et al. |
| 2016/0276360 A1 | 9/2016 | Doda et al. |
| 2016/0322374 A1 | 11/2016 | Sano et al. |
| 2016/0336342 A1 | 11/2016 | Ramaswamy et al. |
| 2017/0373079 A1 | 12/2017 | Sharangpani et al. |
| 2017/0373197 A1 | 12/2017 | Sharangpani et al. |
| 2018/0122904 A1 | 5/2018 | Matsumoto et al. |
| 2018/0122905 A1 | 5/2018 | Ogawa et al. |
| 2018/0122906 A1 | 5/2018 | Yu et al. |
| 2019/0006386 A1* | 1/2019 | Yamazaki ......... H01L 27/11582 |

OTHER PUBLICATIONS

U.S. Appl. No. 15/581,575, filed Apr. 28, 2017, SanDisk Technologies LLC.
U.S. Appl. No. 15/593,916, filed May 12, 2017, SanDisk Technologies LLC.
U.S. Appl. No. 15/605,204, filed May 25, 2017, SanDisk Technologies LLC.
U.S. Appl. No. 15/638,672, filed Jun. 30, 2017, SanDisk Technologies LLC.
U.S. Appl. No. 15/863,205, filed Jan. 5, 2018, SanDisk Technologies LLC.
U.S. Appl. No. 15/933,947, filed Mar. 23, 2018, SanDisk Technologies LLC.
U.S. Appl. No. 15/947,378, filed Apr. 6, 2018, SanDisk Technologies LLC.
U.S. Appl. No. 15/982,215, filed May 17, 2018, SanDisk Technologies LLC.
Notification of Transmittal of the International Search Report and Written Opinion of the International Searching Authority for International Patent Application No. PCTU/US2019/019034, dated Jun. 7, 2019, 12 pages.
Notification of Transmittal of the International Search Report and Written Opinion of the International Searching Authority for International Patent Application No. PCTU/US2019/018621, dated Jun. 5, 2019, 11 pages.

* cited by examiner

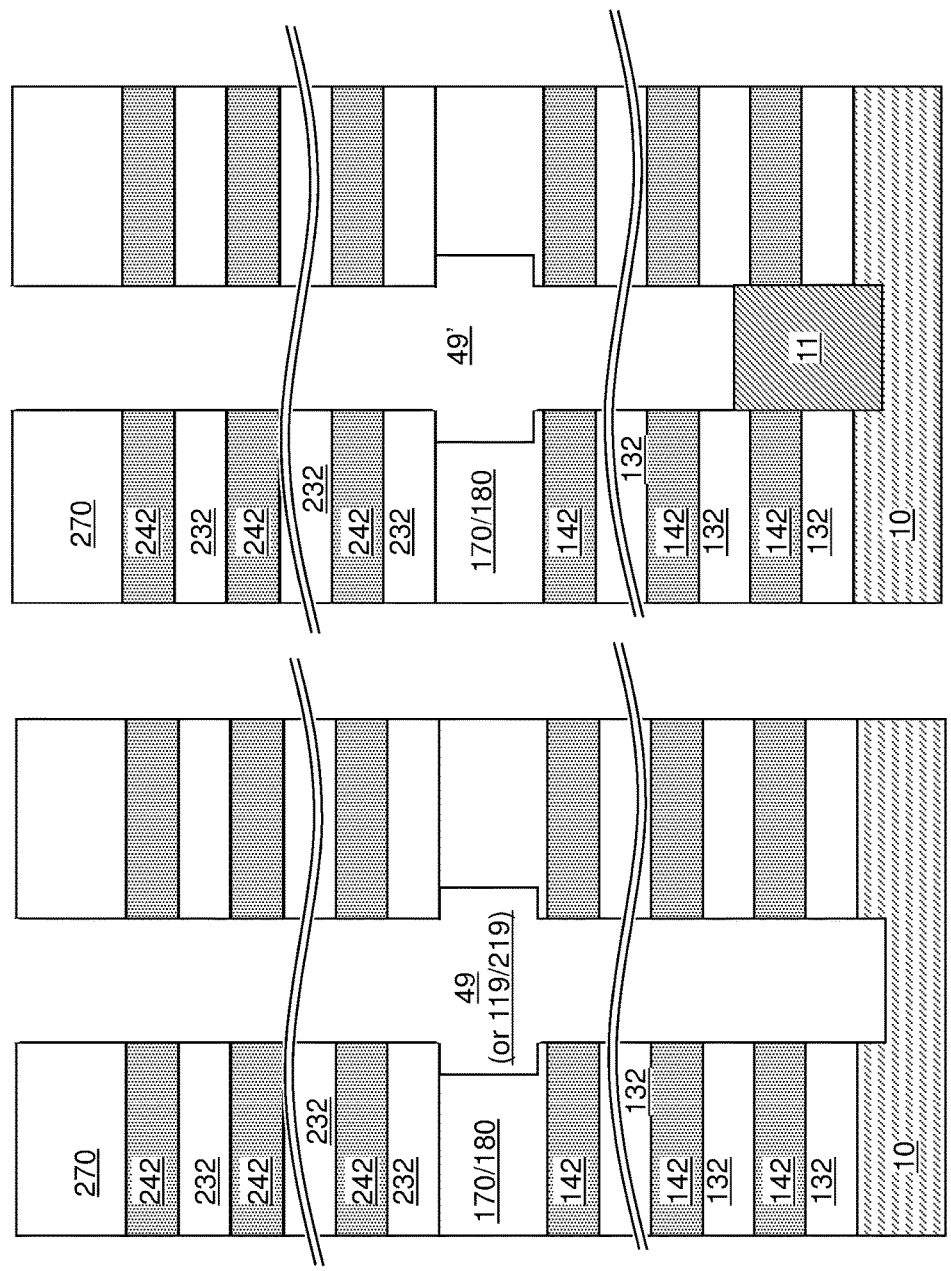

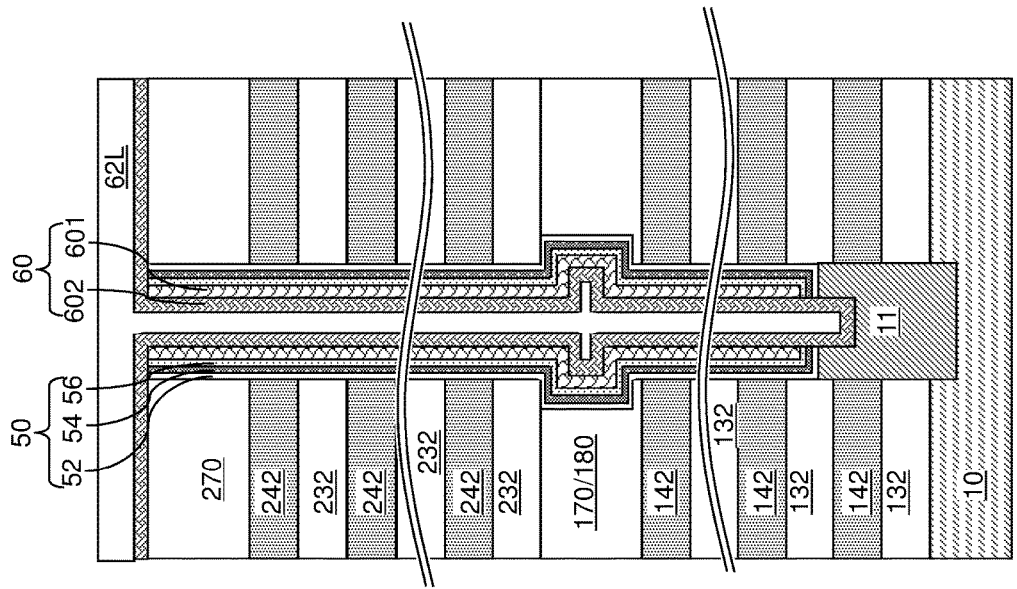
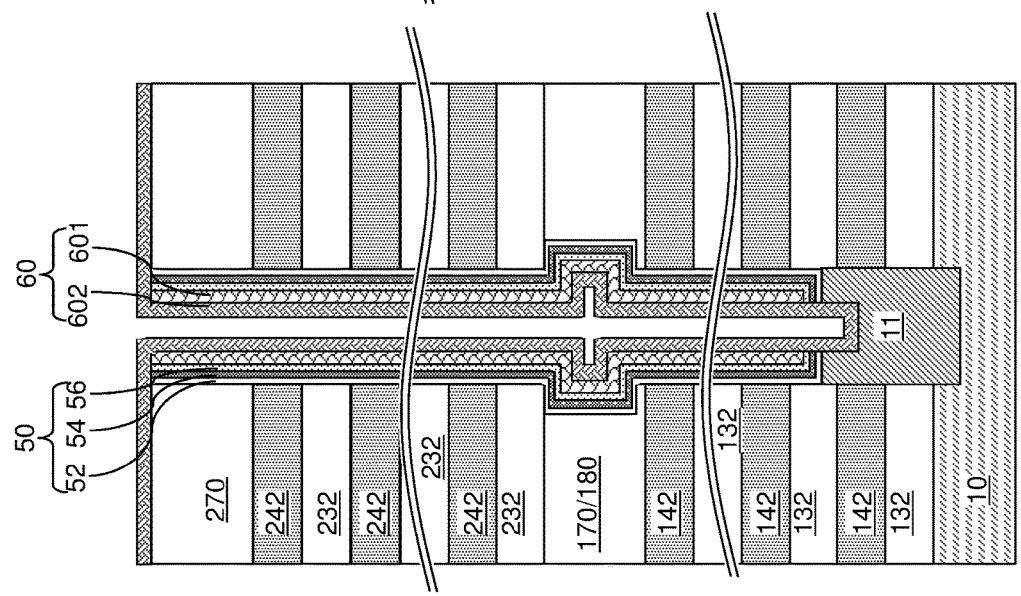

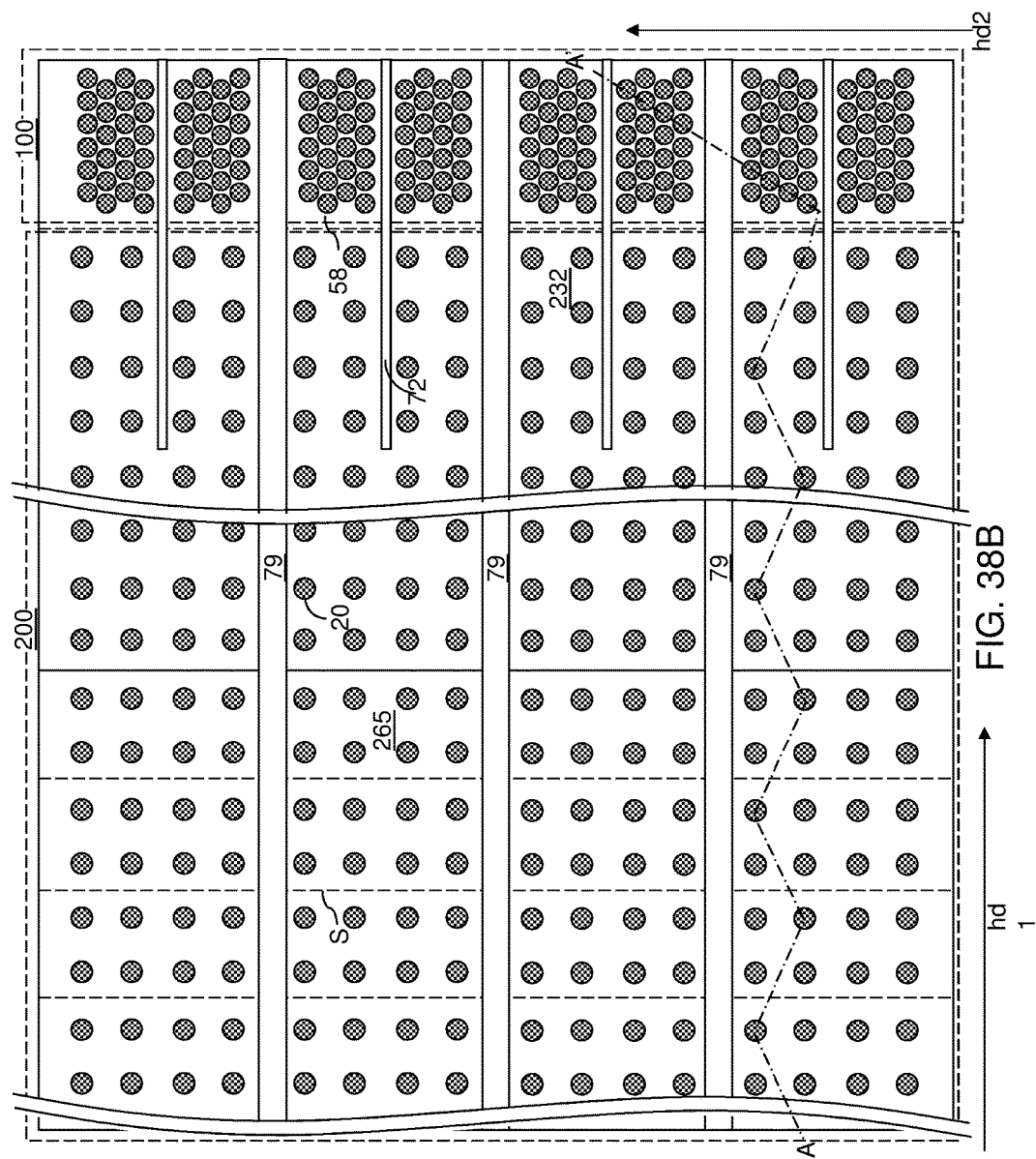

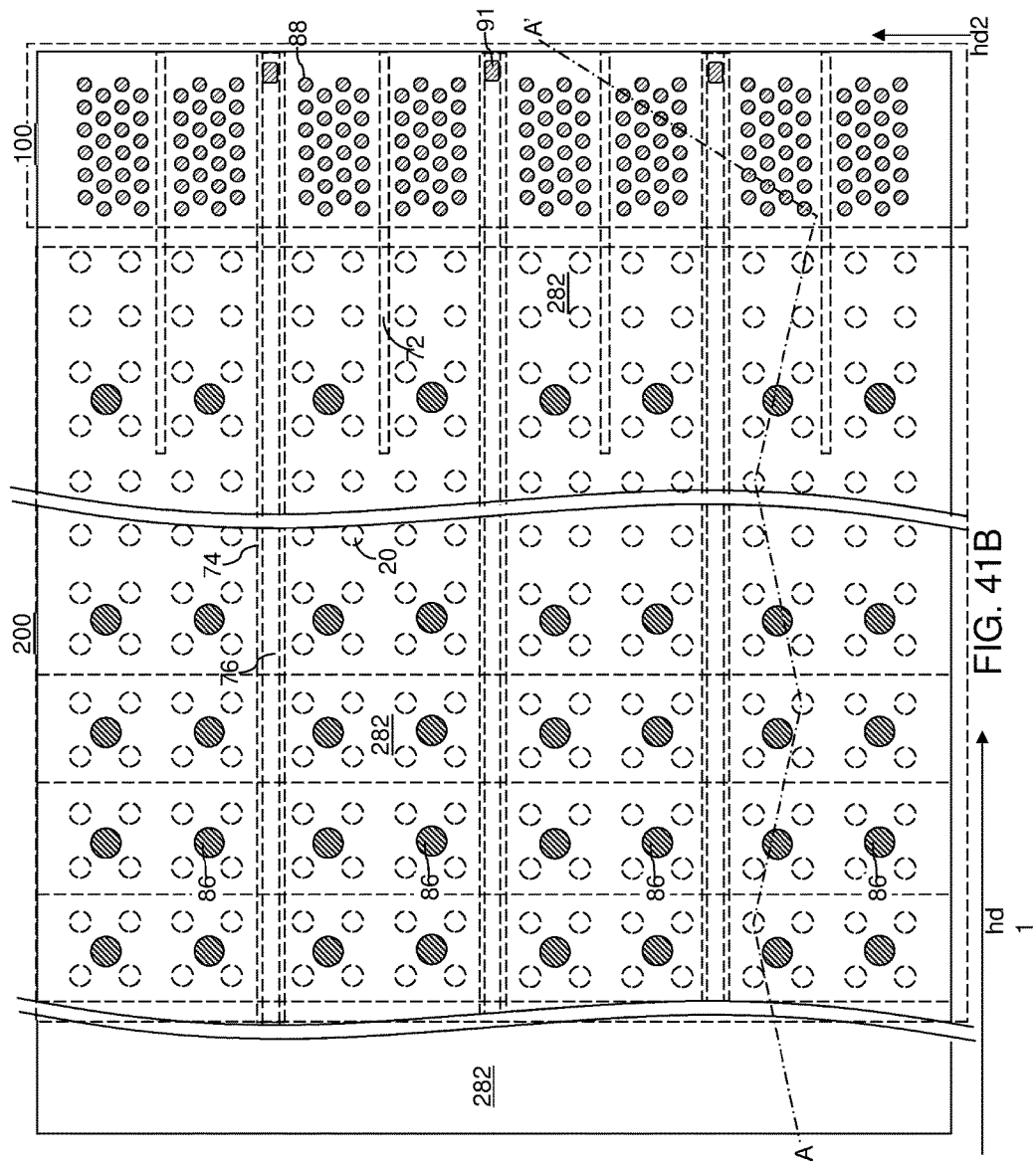

THREE-DIMENSIONAL MEMORY DEVICE CONTAINING HYDROGEN DIFFUSION BLOCKING STRUCTURES AND METHOD OF MAKING THE SAME

FIELD

The present disclosure relates generally to the field of semiconductor devices and specifically to hydrogen diffusion barrier via structures for a three-dimensional memory device and methods of making the same.

BACKGROUND

A three-dimensional 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a semiconductor structure is provided, which comprises: a semiconductor device located on a semiconductor substrate; a planarization dielectric layer located on the semiconductor device and over the semiconductor substrate; a silicon nitride diffusion barrier layer located on the planarization dielectric layer; a via level dielectric layer overlying the silicon nitride diffusion barrier layer; and a composite contact via structure in contact with a component of the semiconductor device and extending through the planarization dielectric layer, the silicon nitride diffusion barrier layer, and the via level dielectric layer. The composite contact via structure comprises, from bottom to top: a lower metallic via structure in contact with the component of the semiconductor device; a titanium diffusion barrier structure in contact with a top surface of the lower metallic via structure and contacting the silicon nitride diffusion barrier layer; and an upper metallic via structure overlying, and electrically connected to the titanium diffusion barrier structure and extending through the via level dielectric layer.

According to another aspect of the present disclosure, a method of forming a semiconductor structure is provided, which comprises: forming a semiconductor device on a semiconductor substrate; forming a planarization dielectric layer on the semiconductor device and over the semiconductor substrate; forming a silicon nitride diffusion barrier layer on the planarization dielectric layer; forming a lower metallic via structure in contact with the component of the semiconductor device; forming a titanium diffusion barrier structure on a top surface of the lower metallic via structure and in contact with the silicon nitride diffusion barrier layer; forming a via level dielectric layer over the silicon nitride diffusion barrier layer; and forming an upper metallic via structure over the titanium diffusion barrier structure and through the via level dielectric layer.

According to yet another aspect of the present disclosure, a semiconductor structure is provided, which comprises semiconductor devices, a silicon nitride diffusion barrier layer overlying the semiconductor devices, and an interconnect structure extending through the silicon nitride diffusion barrier layer. The interconnect structure includes a titanium diffusion barrier structure in contact with the silicon nitride diffusion barrier layer to form a continuous hydrogen diffusion barrier structure.

According to still another aspect of the present disclosure, a method of forming a semiconductor structure is provided, which comprises: forming semiconductor devices on a semiconductor substrate; forming a first dielectric material layer over a portion of the semiconductor devices, wherein a conductive structure selected from a component of the semiconductor devices and a first metal interconnect structure is laterally surrounded by the first dielectric material layer; forming a silicon nitride diffusion barrier layer over the first dielectric material layer; forming a set of openings through the silicon nitride diffusion barrier layer; forming a set of titanium plates in the set of openings, wherein the silicon nitride diffusion barrier layer and the set of titanium plates complimentarily provide a continuous hydrogen diffusion barrier structure extending over the semiconductor substrate, and a titanium plate among the set of titanium plates is formed directly on a top surface the conductive structure; and forming second metal interconnect structures embedded within a second dielectric material layer over the silicon nitride diffusion barrier layer, wherein one of the second metal interconnect structures is formed on a top surface of the titanium plate among the set of titanium plates.

BRIEF DESCRIPTION OF THE DRAWINGS

FIGS. 37A-37H are sequential vertical cross-sectional views of an inter-tier memory opening during formation of a pillar channel portion, a memory stack structure, a dielectric core, and a drain region according to an embodiment of the present disclosure.

FIG. 38B is a horizontal cross-sectional view of the first exemplary structure along the horizontal plane B-B' in FIG. 30A. The zig-zag vertical plane A-A' corresponds to the plane of the vertical cross-sectional view of FIG. 38A.

FIG. 41B is a horizontal cross-sectional view of the first exemplary structure along the horizontal plane B-B' in FIG. 41A. The zig-zag vertical plane A-A' corresponds to the plane of the vertical cross-sectional view of FIG. 41A.

DETAILED DESCRIPTION

Figure 1:
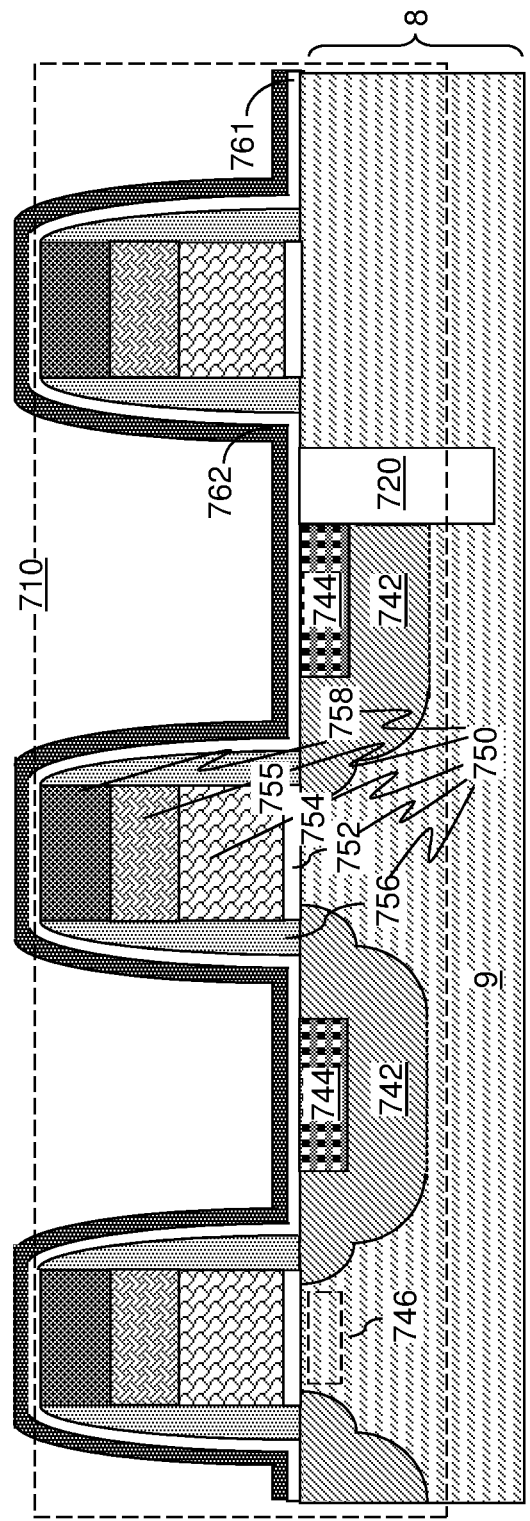
FIG. 1 is a vertical cross-sectional view of a first configuration of a first exemplary structure after formation of semiconductor devices, a silicon oxide liner, and a silicon nitride liner over a semiconductor substrate according to an embodiment of the present disclosure.

As discussed above, the present disclosure is directed to hydrogen diffusion barrier via structures for a three-dimensional memory device and methods of making the same, the various aspects of which are described herein in detail. As three-dimensional memory devices scale to smaller device dimensions, the device area for peripheral devices can take up a significant portion of the total chip area. CMOS under array architecture has been proposed to stack a three-dimensional array of memory devices over underlying peripheral devices on a substrate. Hydrogen originating from various components of the three-dimensional array (such an alternating stack of hydrogen containing silicon oxide and silicon nitride layers) can diffuse to the CMOS transistors during the high temperature annealing of the device and deleteriously affect the device performance (e.g., increase in leakage current during the off-state) of the peripheral devices underlying the three-dimensional array of memory devices. Thus, embodiments of the present disclosure provide a structure and a method for blocking diffusion of hydrogen between the three-dimensional array of memory devices and the peripheral devices without disrupting the electrical continuity of the interconnect structures. The embodiments of the present disclosure can be employed to form various semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Referring to FIG. 1, a first configuration of a first exemplary structure according to an embodiment of the present disclosure is illustrated. The first exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices.

The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode (754, 755), a gate cap dielectric 758, and a dielectric gate spacer 756. Each gate electrode (754, 755) includes at least one gate electrode material portion, which can be, for example, a stack of a gate doped semiconductor portion 754 and a gate metal silicide portion 755. In one embodiment, at least one of the field effect transistors can include at least one metal silicide portion, which may be an active region metal silicide portion 744 and/or the gate metal silicide portion 755. Each active region metal silicide portion 744 can be formed on a transistor active region 742 by reacting a metal with a semiconductor material of the transistor active region 742 to form a metal silicide. Each gate metal silicide portion 755 can be formed by reacting a metal with a semiconductor material within an upper portion of an underlying gate doped semiconductor portion 754 to form a metal silicide. The metal silicide portions (744, 755) can include any metal silicide. Exemplary metal silicides include nickel silicide, cobalt silicide, titanium silicide, tantalum silicide, or tungsten silicide. The gate cap dielectrics 758 can include a dielectric diffusion barrier material that can block diffusion of hydrogen therethrough. For example, the gate cap dielectrics 758 can include silicon nitride.

The gate structures 750 can be formed, for example, by forming a layer stack of a continuous gate dielectric layer, a doped semiconductor material layer, a metal silicide layer, and a gate cap dielectric material layer, and by patterning the layer stack. Each patterned portion of the continuous gate dielectric layer constitutes a gate dielectric 752, each patterned portion of the doped semiconductor material layer constitutes a gate doped semiconductor portion 754, each patterned portion of the metal silicide layer constitutes a gate metal silicide portion 755, and each patterned portion of the gate cap dielectric material layer constitutes a gate cap dielectric 758. The dielectric gate spacers 756 can be formed by conformal deposition of at least one dielectric material layer (such as a silicon oxide layer) and an anisotropic etch that removes horizontal portions of the at least one dielectric material layer. Remaining vertical portions of the at least one dielectric material layer constitute the dielectric gate spacers 756.

The semiconductor devices 710 can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

A silicon oxide liner 761 can be formed to cap the semiconductor substrate 8 and the semiconductor devices 710 (e.g., the gate structures 750 of the semiconductor devices 710). The silicon oxide liner 761 can be formed directly on the top surface of the semiconductor substrate 8 and the gate structures 750 by a conformal deposition process. The thickness of the silicon oxide liner 761 can be in a range from 2 nm to 20 nm, although lesser and greater thicknesses can also be employed. Alternatively, the silicon oxide liner 761 can be formed prior to forming the dielectric gate spacers 756 and be located under the dielectric gate spacers 756. The silicon oxide liner 761 can passivate surface states on the top surface of the transistor active regions 742. A silicon nitride liner 762 can be formed on the silicon oxide liner 761 by a conformal deposition process. In one embodiment, the silicon nitride liner 762 may apply a tensile stress or a compressive stress to underlying semiconductor devices to enhance performance of the underlying semiconductor devices. In one embodiment, two separate silicon nitride layers covering different regions of the semiconductor substrate 8 may be employed as the silicon nitride liner 762. In this case, a first silicon nitride layer of the silicon nitride liner 762 can cover first semiconductor devices in a first device region, and may apply a tensile stress to the first semiconductor devices (which may include n-type field effect transistors), and a second silicon nitride layer of the silicon nitride liner 762 can cover second semiconductor devices in a second device region, and may apply a compressive stress to the second semiconductor devices (which may include p-type field effect transistors). In one embodiment, the first silicon nitride layer and the second silicon nitride layer can complementarily cover the entire area of the semiconductor substrate 8, and collectively form the silicon nitride liner 762. The thickness of the silicon nitride liner 762 can be in a range from 10 nm to 100 nm, such as from 20 nm to 60 nm, although lesser and greater thicknesses can also be employed. The silicon nitride liner 762 can function as a hydrogen diffusion barrier after formation of overlying dielectric material layers and devices.

Figure 2:
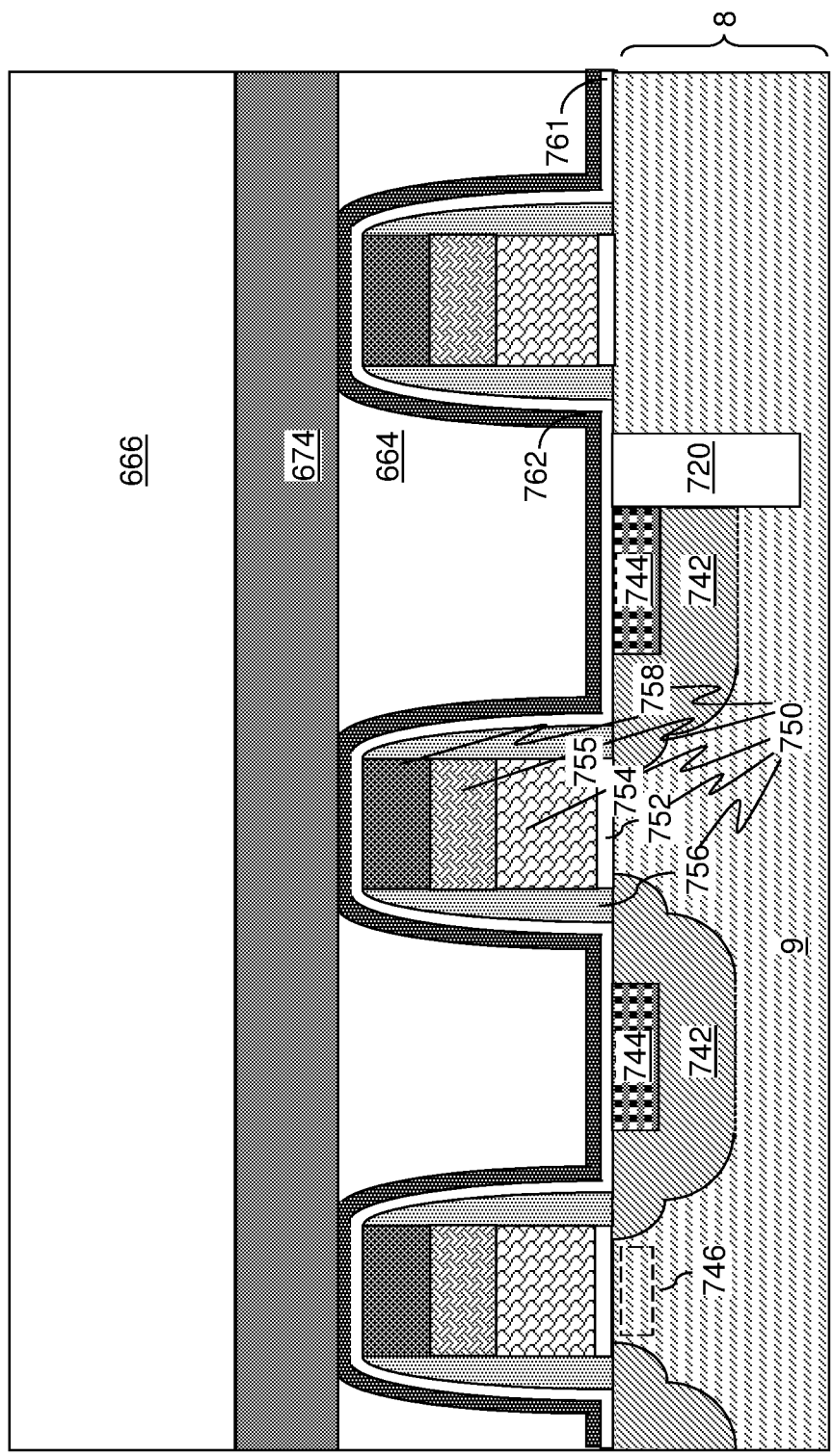
FIG. 2 is a vertical cross-sectional view of the first configuration of the first exemplary structure after formation of a planarization dielectric layer, a silicon nitride diffusion barrier layer, and a via level dielectric layer according to an embodiment of the present disclosure.

Referring to FIG. 2, a planarizable dielectric material can be deposited over the silicon nitride liner 762 to form a planarization dielectric layer 664. The planarizable dielectric material can include undoped silicate glass (which is a low hydrogen content silicon oxide), and can be deposited by plasma enhanced chemical vapor deposition. A densification anneal may be performed to reduce hydrogen content in the deposited undoped silicate glass. The planarization dielectric layer 664 can be subsequently planarized employing top surfaces of portions of the silicon nitride liner 762 that overlie the gate structures 750. The planarization of the planarizable dielectric material can be performed, for example, by chemical mechanical planarization. Top surfaces of the portions of the silicon nitride liner 762 that overlie the gate structures 750 can be employed as stopping surfaces during the planarization process. The planarization dielectric layer 664 overlies the transistor active regions 742 in the semiconductor substrate 8, and laterally surrounds the gate structures 750. The planarized top surface of the planarization dielectric layer 664 can be within a same horizontal plane as the topmost surfaces of the silicon nitride liner 762 that overlie the gate structures 750.

A silicon nitride diffusion barrier layer 674, and a via level dielectric layer 666 can be sequentially deposited over the planarization dielectric layer 664. The silicon nitride diffusion barrier layer 674 is a diffusion barrier layer that forms a continuous diffusion barrier structure in combination with diffusion blocking conductive material portions to be subsequently formed therethrough. The silicon nitride diffusion barrier layer 674 can be formed by low pressure chemical vapor deposition (LPCVD) process employing dichlorosilane (DCS) and ammonia as reactant gases at a temperature in a range from 600 degrees Celsius and 900 degrees Celsius and at a pressure in a range from 100 mTorr to 500 mTorr. However, other materials, pressures and temperatures may be used. For example, the silicon nitride may be deposited from other reactant gases or by a method other than LPCVD, or another dielectric material may be used instead of or in addition to silicon nitride. The silicon nitride diffusion barrier layer 674 can be stoichiometric, i.e., have an atomic ratio of 3:4 between silicon atoms and nitrogen atoms. The thickness of the silicon nitride diffusion barrier layer 674 can be in a range from 10 nm to 200 nm, such as from 20 nm to 60 nm, or from 40 nm to 100 nm, although lesser and greater thicknesses can also be employed. In one embodiment, the silicon nitride diffusion barrier layer 674 has a planar top surface.

The via level dielectric layer 666 includes a dielectric material such as an undoped silicate glass, a doped silicate glass, a non-porous organosilicate glass, or a porous organosilicate glass. The thickness of the via level dielectric layer 666 can be in a range from 60 nm to 600 nm, such as from 120 nm to 300 nm, although lesser and greater thicknesses can also be employed. The via level dielectric layer 666 can be deposited by chemical vapor deposition or atomic layer deposition. The via level dielectric layer 666 can have a planar top surface, i.e., a top surface located within a two-dimensional horizontal plane.

Figure 3:
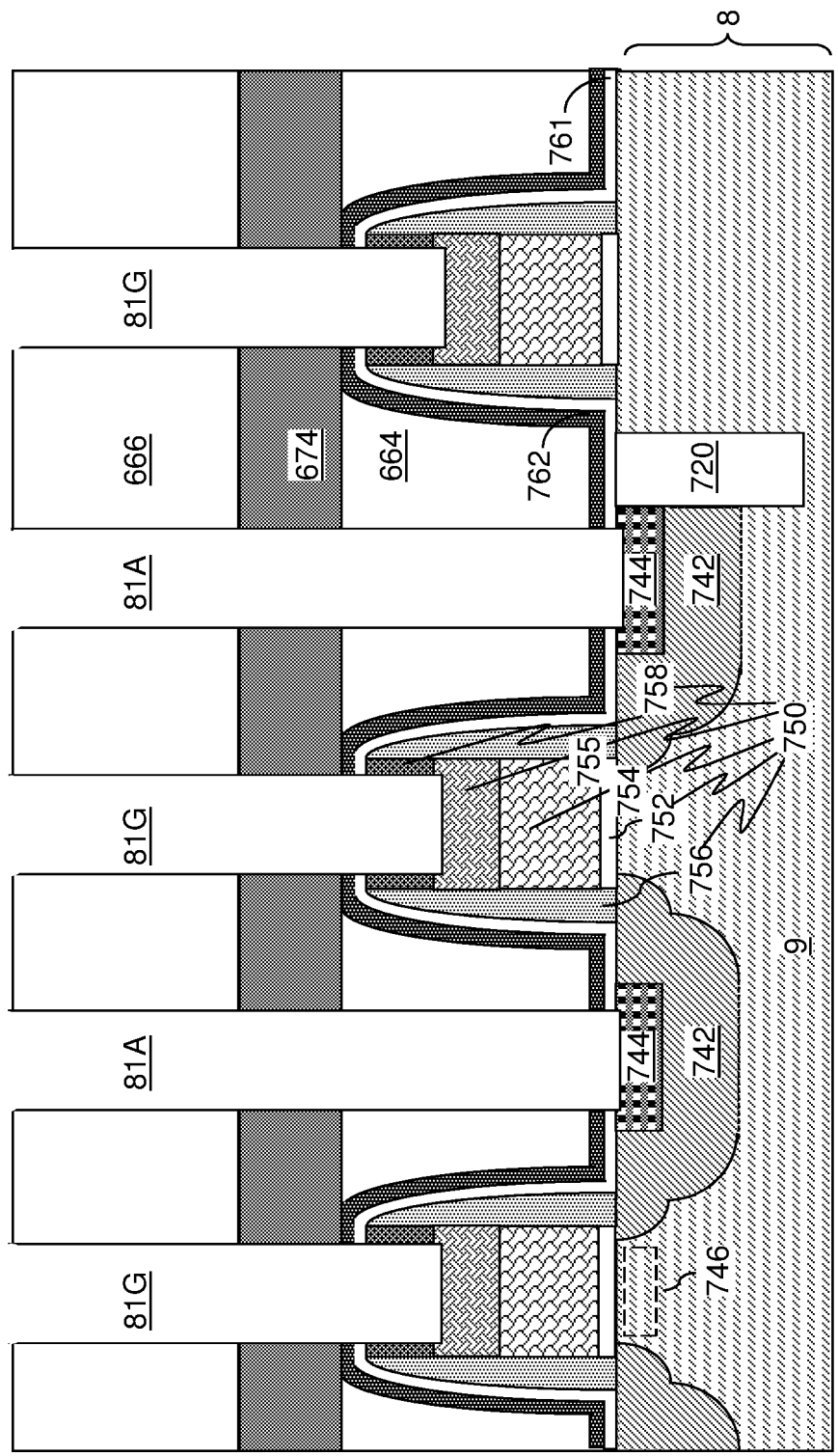
FIG. 3 is a vertical cross-sectional view of the first configuration of the first exemplary structure after formation of via cavities according to an embodiment of the present disclosure.

Referring to FIG. 3, a photoresist layer (not shown) can be applied over the via level dielectric layer 666, and can be lithographically patterned to form openings in areas in which contact via structures are to be subsequently formed. In one embodiment, the areas of the openings in the photoresist layer can overlie the areas of the metal silicide portions (744, 755). In one embodiment, the areas of the openings in the photoresist layer can be entirely within the areas enclosed by peripheries of the metal silicide portions (744, 755).

An anisotropic etch process can be performed to transfer the pattern of the openings through the underlying layers. Active region contact via cavities 81A are formed through the via level dielectric layer 666, the silicon nitride diffusion barrier layer 674, the planarization dielectric layer 664, the silicon nitride liner 762, and the silicon oxide liner 761 onto top surfaces of the active region metal silicide portions 744. A top surface (which may, or may not, be recessed due to the anisotropic etch) of an active region metal silicide portion 744 is physically exposed at the bottom of each active region contact via cavity 81A. Gate contact via cavities 81G are formed through the via level dielectric layer 666, the silicon nitride diffusion barrier layer 674, the silicon nitride liner 762, and the silicon oxide liner 761 onto top surface of each gate electrode (754, 755). A top surface (which may, or may not, be recessed due to the anisotropic etch) of a gate metal silicide portion 755 can be physically exposed at the bottom of each gate contact via cavity 81G.

The anisotropic etch process can include a series of etch steps including a respective etch chemistry so that the series of etch steps sequentially etches the various layers between the photoresist layer and the metal silicide portions (744, 755). In one embodiment, the series of etch steps can include an etch step for etching the via level dielectric layer 666, an etch step for etching the silicon nitride diffusion barrier layer 674, an etch step that etches the silicon oxide material of the planarization dielectric layer 664 selective to silicon nitride to prevent overetching into the silicon nitride liner 762, an etch step for etching the silicon nitride liner 762, and an etch step for etching the silicon oxide liner 761. In one embodiment, the metal silicide portions (744, 755) can function as etch stop structures for the anisotropic etch process.

Generally, a top surface of the semiconductor devices 710 can be physically exposed at the bottom of each contact via cavity (81A, 81G), which may be an active region contact via cavity 81A or a gate contact via cavity 81G. Each contact via cavity (81A, 81G) can have a vertical profile or a tapered profile with a straight sidewall that extends between the top surface of the via level dielectric layer 666 and a surface of the semiconductor devices 710. The photoresist layer is subsequently removed, for example, by ashing.

While the present disclosure is described employing an embodiment in which metal silicide portions (744, 755) are provided at the bottom of the contact via cavities (81A, 81G), embodiments are expressly contemplated herein in which a metal silicide portion is not provided at the bottom a contact via trench, and a contact via structure is formed directly on a semiconductor material portion or a metal portion within the semiconductor substrate 8 or within the gate structures 750. For example, a metal gate electrode portion may replace a gate metal silicide portion 755 in one or more of the gate structures 750. In this case, a top surface of a metal gate electrode can be physically exposed at the bottom of each gate contact via cavity 81G.

Figure 4:
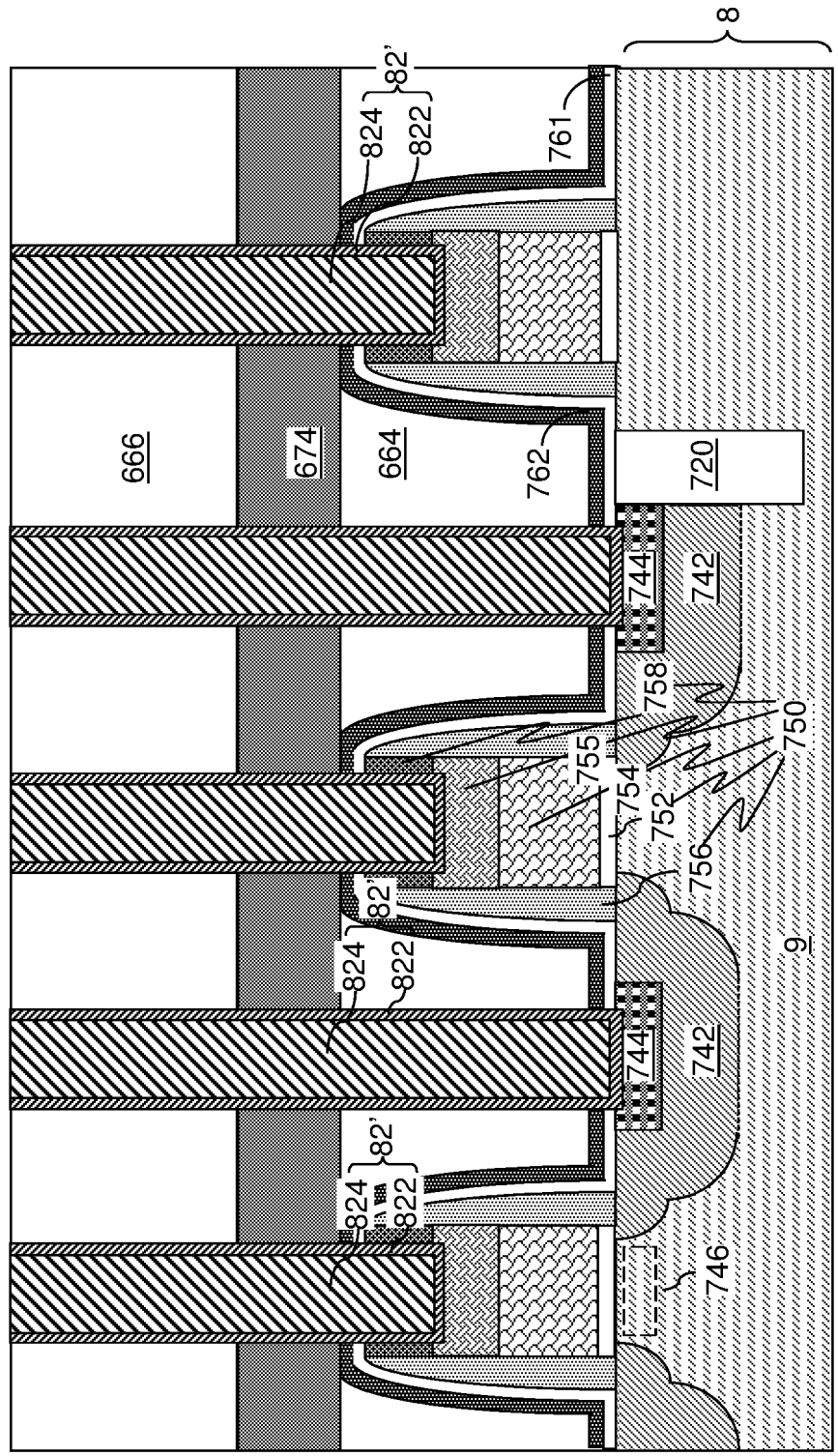
FIG. 4 is a vertical cross-sectional view of the first configuration of the first exemplary structure after deposition of at least one first metallic material in the via cavities to form in-process metallic via structures according to an embodiment of the present disclosure.

Referring to FIG. 4, an in-process lower metallic via structure 82' is formed within each of the contact via cavities (81A, 81G) by depositing at least one first metallic material in each of the contact via cavities (81A, 81G). As discussed above, an "in-process" element is a transient element that is subsequently modified. Thus, each in-process lower metallic via structure 82' is subsequently modified (and specifically, vertically recessed) to provide a respective lower metallic via structure.

For example, a lower metal nitride liner 822 can be deposited in each of the contact via cavities (81A, 81G). The lower metal nitride liner 822 can include a conductive metallic nitride material such as TiN, TaN, and/or WN, and can function as a diffusion barrier layer for elemental metal to be subsequently deposited. The lower metal nitride liner 822 can contact the physically exposed surfaces of the semiconductor devices 710 such as the metal silicide portions (744, 755). The lower metal nitride liner 822 can be formed as a continuous material layer by physical vapor deposition or chemical vapor deposition.

Subsequently, a metal such as tungsten, copper, or aluminum can be deposited in remaining volumes of the contact via cavities (81A, 81G) by physical vapor deposition, chemical vapor deposition, or electroplating. In one embodiment, the metal can consist essentially of at least one metallic element, which can be a single elemental metallic element or a plurality of metallic elements provided as a layer stack or as an alloy.

Portions of the deposited metal and the lower metal nitride liner 822 deposited over the top surface of the via level dielectric layer 666 can be removed by a planarization process such as a recess etch or chemical mechanical planarization. Each remaining portion of the deposited metal in a contact via cavity (81A, 81G) constitutes a lower metal fill portion 824. The lower metal nitride liner 822 is divided into multiple portions, each of which is located entirely within a respective one of the contact via cavities (81A, 81G). Each contiguous combination of a lower metal nitride liner 822 and a lower metal fill portion 824 constitutes an in-process lower metallic via structure 82'. The in-process lower metallic via structures 82' can have a top surface that is within the horizontal plane including the top surface of the via level dielectric layer 666.

Figure 5:
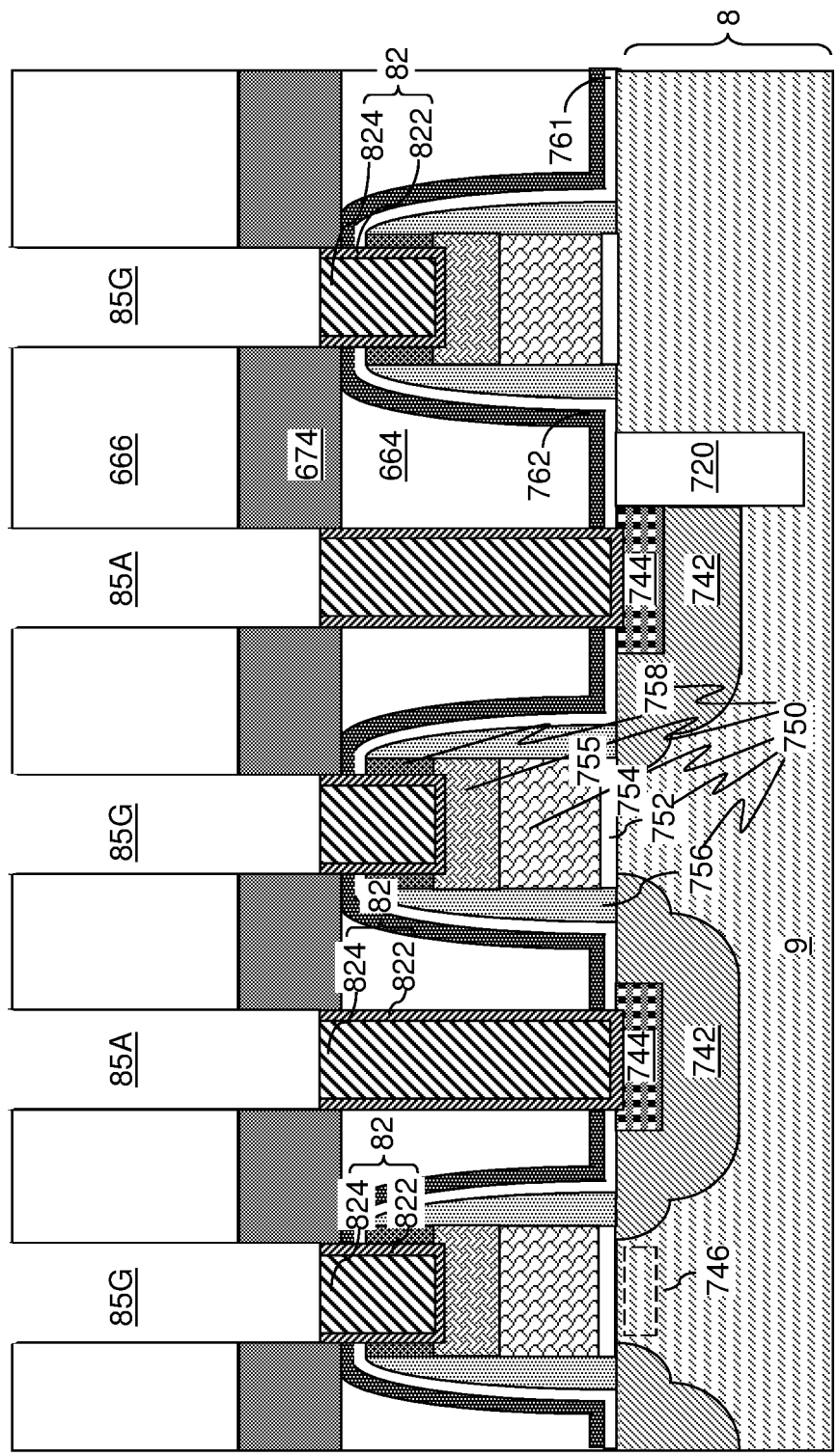
FIG. 5 is a vertical cross-sectional view of the first configuration of the first exemplary structure after formation of lower metallic via structures by recessing the in-process metallic via structures according to an embodiment of the present disclosure.

Referring to FIG. 5, the at least one conductive material of the in-process lower metallic via structures 82' can be vertically recessed by an etch process, which can include an anisotropic etch (such as a reactive ion etch) or an isotropic etch (such as a wet etch). The duration of the etch process can be controlled so that the top surface of each remaining portion of the in-process lower metallic via structures 82' is located between a horizontal plane including the top surface of the silicon nitride diffusion barrier layer 674 and a horizontal plane including the bottom surface of the silicon nitride diffusion barrier layer 674. In other words, the duration of the etch process can be controlled so that the entire periphery of a top surface of each remaining portion of the in-process lower metallic via structures 82' is located on a sidewall surface of the silicon nitride diffusion barrier layer 674. Each remaining portion of the in-process lower metallic via structures 82' is a lower metallic via structure 82. Each lower metallic via structure 82 is formed in a lower portion of a respective one of the contact via cavities (81A, 81G).

A recess cavity (85A, 85G) is present in an upper portion of each of the contact via cavities (81A, 81G) above an underlying lower metallic via structure 82. The recess cavities (85A, 85G) include active region recess cavities 85A that include vacant volumes of the active region contact via cavities 81A, and gate recess cavities 85G that include vacant volumes of the gate contact via cavities 81G. The active region recess cavities 85A and the gate recess cavities 85G can have the same depth, which is greater than the thickness of the via level dielectric layer 666 and is less than the sum of the thickness of the via level dielectric layer 666 and the thickness of the silicon nitride diffusion barrier layer 674.

Figure 6:
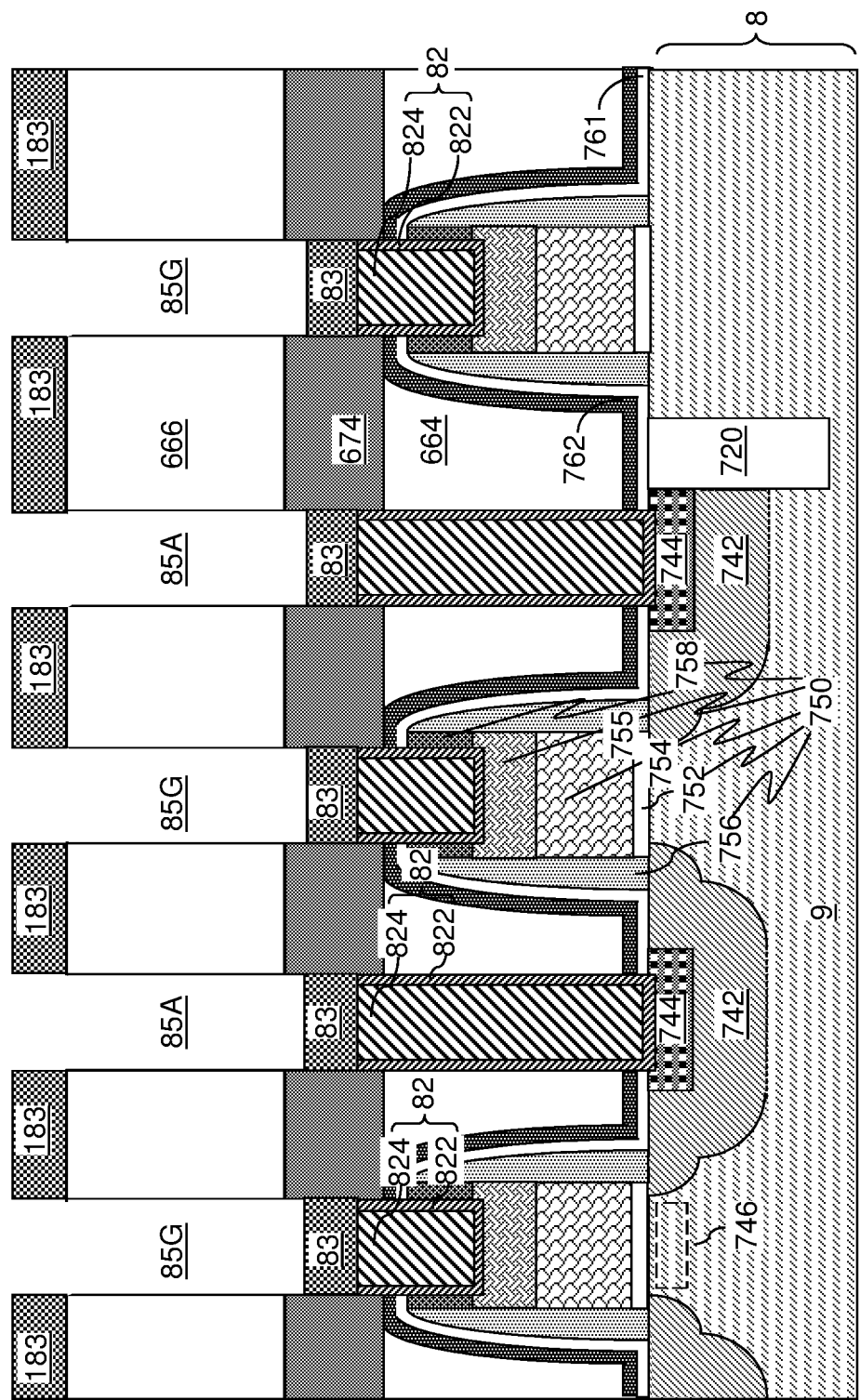
FIG. 6 is a vertical cross-sectional view of the first configuration of the first exemplary structure after formation of titanium diffusion barrier structures according to an embodiment of the present disclosure.

Referring to FIG. 6, titanium can be deposited on horizontal top surfaces of the first exemplary structure by an anisotropic deposition process. For example, a collimated physical vapor deposition (PVD) process can be performed to deposit titanium on the horizontal top surfaces of the first exemplary structure, which include top surfaces of the via level dielectric layer 666 and top surfaces of the lower metallic via structures 82. Titanium is a metal that functions as an effective hydrogen diffusion barrier material. Generally, about 10 nm-20 nm of titanium is sufficient to provide effective hydrogen blocking function. The anisotropic deposition process deposits titanium with a high degree of directionality. For example, more than 50% all titanium flux directed at the first exemplary structure within a deposition chamber can be with 10 degrees, such as within 5 degrees, of the downward normal direction that is perpendicular to the top surface of the via level dielectric layer. The amount of titanium material deposited on the sidewalls of the recess cavities (85G, 85A) can be insignificant compared to the amount of titanium deposited on the horizontal surfaces of the first exemplary structure.

Titanium diffusion barrier structures 83 are formed at the bottom of each recess cavity (85A, 85G) directly on top surfaces of the lower metallic via structures 82. The titanium diffusion barrier structures 83 can consist essentially of titanium. Each titanium diffusion barrier structures 83 is formed on a respective sidewall of the silicon nitride barrier layer 674. A titanium layer 183 can be formed on the top surface of the via level dielectric layer 666. The thickness of the titanium diffusion barrier structures 83 can be in a range from 10 nm to 120 nm, such as from 15 nm to 60 nm, although lesser and greater thicknesses can also be employed. The thickness deposited titanium on sidewalls of the recess cavities (85A, 85G) can be in a range from 1% to 20% of the thickness of the titanium diffusion barrier structures 83. Optionally but not necessarily, an isotropic etch back process can be performed to etch back deposited titanium from sidewalls of the recess cavities (85A, 85G). In one embodiment, the isotropic etch back process can be a wet etch process employing a combination of hydrofluoric acid, nitric acid, ammonium hydroxide, and/or hydrogen peroxide.

Figure 7:
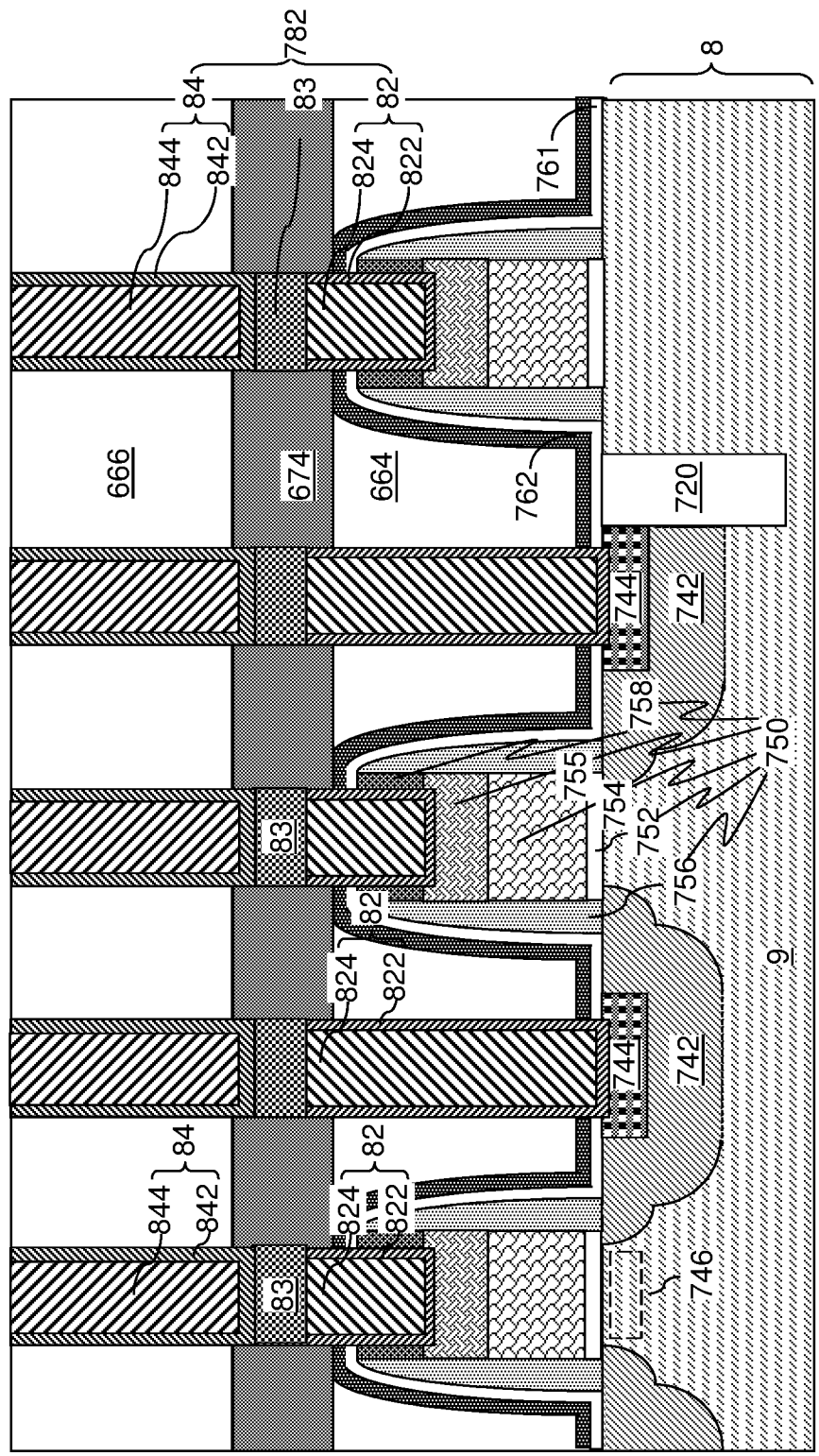
FIG. 7 is a vertical cross-sectional view of the first configuration of the first exemplary structure after formation of upper metallic via structures according to an embodiment of the present disclosure.

Referring to FIG. 7, at least one second metallic material is deposited in each of the recess cavities (85A, 85G). For example, a upper metal nitride liner 842 can be deposited in each of the recess cavities (85A, 85G). The upper metal nitride liner 842 can include a conductive metallic nitride material such as TiN, TaN, and/or WN, and can function as a diffusion barrier layer for elemental metal to be subsequently deposited. The upper metal nitride liner 842 can contact the physically exposed surfaces of the titanium diffusion barrier structures 83. The upper metal nitride liner 842 can be formed as a continuous material layer by physical vapor deposition or chemical vapor deposition.

Subsequently, a metal such as tungsten, copper, or aluminum can be deposited in remaining volumes of the recess cavities (85A, 85G) by physical vapor deposition, chemical vapor deposition, or electroplating. In one embodiment, the metal can consist essentially of at least one metallic element, which can be a single elemental metallic element or a plurality of metallic elements provided as a layer stack or as an alloy.

Portions of the deposited metal and the upper metal nitride liner 842 deposited over the top surface of the via level dielectric layer 666 and the titanium layer 183 can be removed by a planarization process such as a recess etch or chemical mechanical planarization. Each remaining portion of the deposited metal in a recess cavity (85A, 85G) constitutes an upper metal fill portion 844. The upper metal nitride liner 842 is divided into multiple portions, each of which is located entirely within a respective one of the recess cavities (85A, 85G). Each contiguous combination of an upper metal nitride liner 842 and an upper metal fill portion 844 constitutes an upper metallic via structure 84. Each upper metallic via structures 84 can have a top surface that is within the horizontal plane including the top surface of the via level dielectric layer 666.

Each contact via cavity (81A, 81G) is filled with a set of conductive material portions, which is herein referred to as a composite contact via structure 782. Each composite contact via structure 782 can include a lower metallic via structure 82, a titanium diffusion barrier structure 83, and an upper metallic via structure 84. Each lower metallic via structure 82 comprises a lower metal nitride liner 822 and a lower metal fill portion 824, and each upper metallic via structure 84 comprises an upper metal nitride liner 842 and an upper metal fill portion 844. Each composite contact via structure 782 can include a straight sidewall that does not include lateral protrusions or recesses between the top surface of the via level dielectric layer and a component of a semiconductor device, which can be a metal silicide portion (744, 755). The combination of the silicon nitride diffusion barrier layer 674 and the titanium diffusion barrier structures 83 can provide a continuous hydrogen diffusion barrier structure without any opening therethrough, thereby functioning as an effective hydrogen diffusion barrier structure between structures overlying the silicon nitride diffusion barrier layer 674 and structures underlying the silicon nitride diffusion barrier layer 674.

Figure 8:
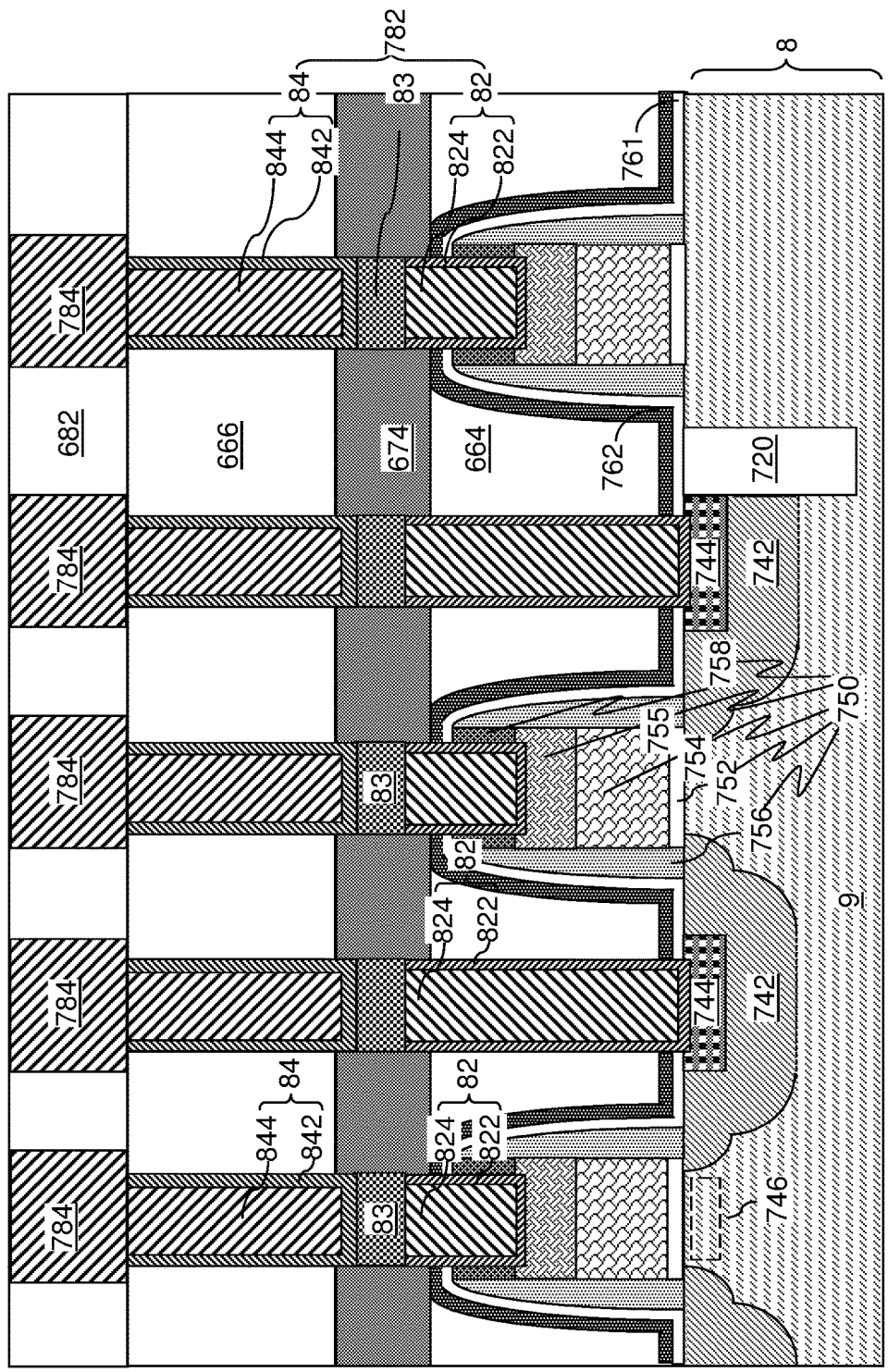
FIG. 8 is a vertical cross-sectional view of the first configuration of the first exemplary structure after formation of a line level dielectric layer and a metal interconnect lines according to an embodiment of the present disclosure.

Referring to FIG. 8, a line level dielectric layer 682 can be formed over the via level dielectric layer 666. The line level dielectric layer 682 includes a dielectric material such as silicon oxide. Metal interconnect lines, which are referred to as first level lower line structures 784, can be formed through the line level dielectric liner 682 on a respective one of the composite contact via structures 782.

Figure 9:
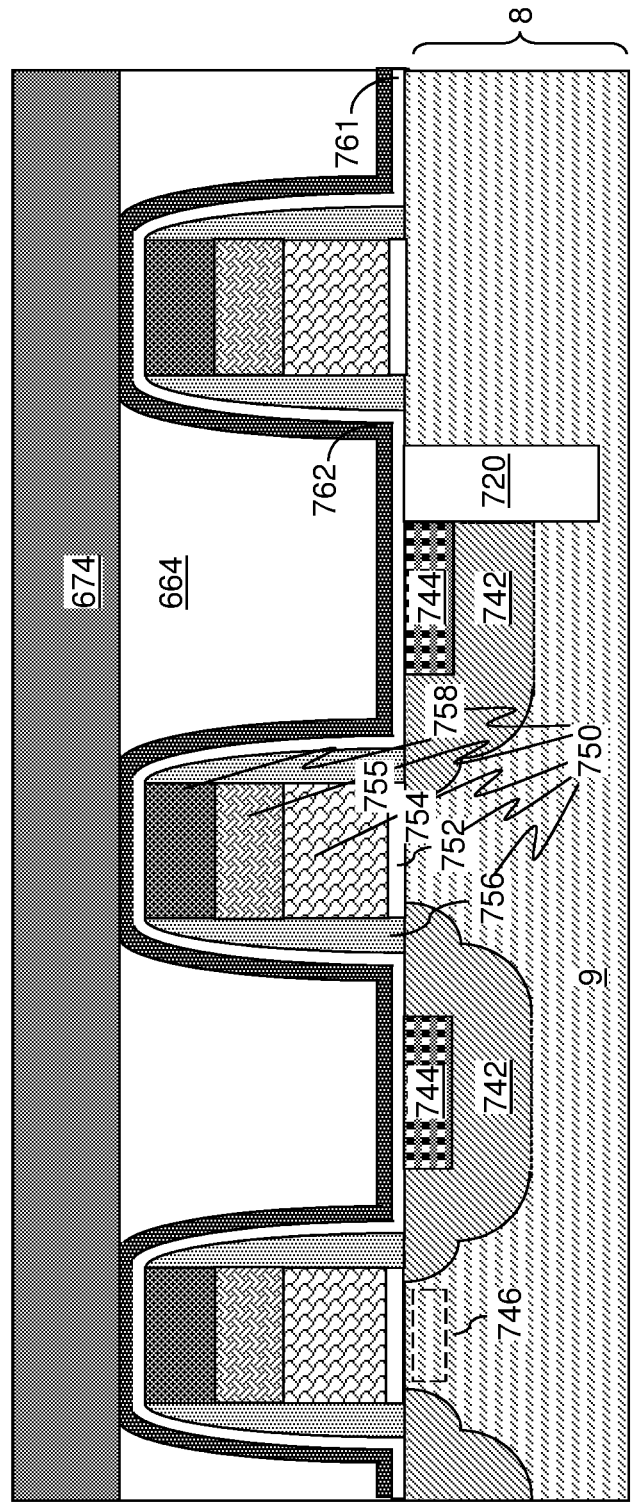
FIG. 9 is a vertical cross-sectional view of a second configuration of the first exemplary structure after formation of a planarization dielectric layer and a silicon nitride diffusion barrier layer according to an embodiment of the present disclosure.

Referring to FIG. 9, a second configuration of the first exemplary structure can be derived from the first configuration of the first exemplary structure illustrated in FIG. 2 by deferring formation of the via level dielectric layer 666.

Figure 10:
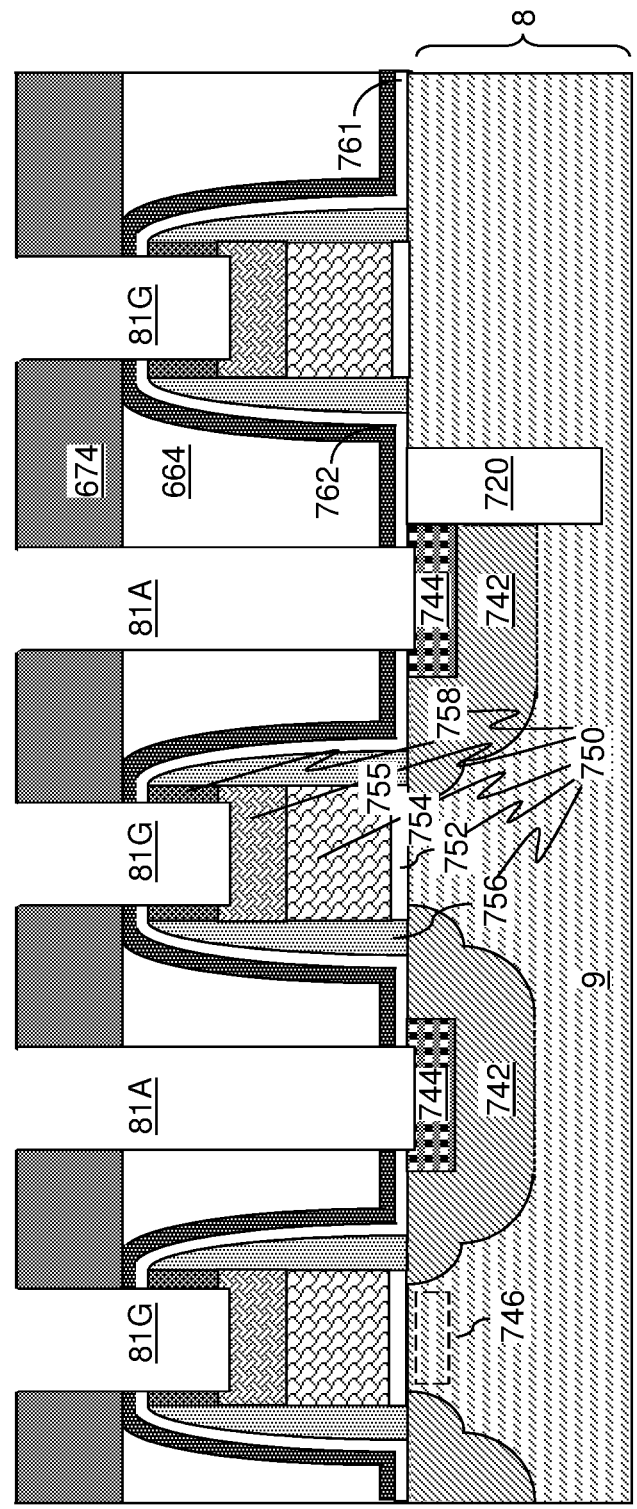
FIG. 10 is a vertical cross-sectional view of the second configuration of the first exemplary structure after formation of first via cavities according to an embodiment of the present disclosure.

Referring to FIG. 10, a photoresist layer (not shown) can be applied over the silicon nitride barrier layer 674, and can be lithographically patterned to form openings in areas in which contact via structures are to be subsequently formed. In one embodiment, the areas of the openings in the photoresist layer can overlie the areas of the metal silicide portions (744, 755). In one embodiment, the areas of the openings in the photoresist layer can be entirely within the areas enclosed by peripheries of the metal silicide portions (744, 755).

An anisotropic etch process can be performed to transfer the pattern of the openings through the underlying layers. Active region contact via cavities 81A are formed the silicon nitride diffusion barrier layer 674, the planarization dielectric layer 664, the silicon nitride liner 762, and the silicon oxide liner 761 onto top surfaces of the active region metal silicide portions 744. A top surface (which may, or may not, be recessed due to the anisotropic etch) of an active region metal silicide portion 744 is physically exposed at the bottom of each active region contact via cavity 81A. Gate contact via cavities 81G are formed through the silicon nitride diffusion barrier layer 674, the silicon nitride liner 762, and the silicon oxide liner 761 onto top surface of each gate electrode (754, 755). A top surface (which may, or may not, be recessed due to the anisotropic etch) of a gate metal silicide portion 755 can be physically exposed at the bottom of each gate contact via cavity 81G.

The anisotropic etch process can include a series of etch steps including a respective etch chemistry so that the series of etch steps sequentially etches the various layers between the photoresist layer and the metal silicide portions (744, 755). In one embodiment, the series of etch steps can include an etch step for etching the silicon nitride diffusion barrier layer 674, an etch step that etches the silicon oxide material of the planarization dielectric layer 664 selective to silicon nitride to prevent overetching into the silicon nitride liner 762, an etch step for etching the silicon nitride liner 762, and an etch step for etching the silicon oxide liner 761. In one embodiment, the metal silicide portions (744, 755) can function as etch stop structures for the anisotropic etch process.

Generally, a top surface of the semiconductor devices 710 can be physically exposed at the bottom of each contact via cavity (81A, 81G), which may be an active region contact via cavity 81A or a gate contact via cavity 81G. Each contact via cavity (81A, 81G) can have a vertical profile or a tapered profile with a straight sidewall that extends between the top surface of the silicon nitride diffusion barrier layer 674 and a surface of the semiconductor devices 710. The photoresist layer is subsequently removed, for example, by ashing.

While the present disclosure is described employing an embodiment in which metal silicide portions (744, 755) are provided at the bottom of the contact via cavities (81A, 81G), embodiments are expressly contemplated herein in which a metal silicide portion is not provided at the bottom a contact via trench, and a contact via structure is formed directly on a semiconductor material portion or a metal portion within the semiconductor substrate 8 or within the gate structures 750. For example, a metal gate electrode portion may replace a gate metal silicide portion 755 in one or more of the gate structures 750. In this case, a top surface of a metal gate electrode can be physically exposed at the bottom of each gate contact via cavity 81G.

Figure 11:
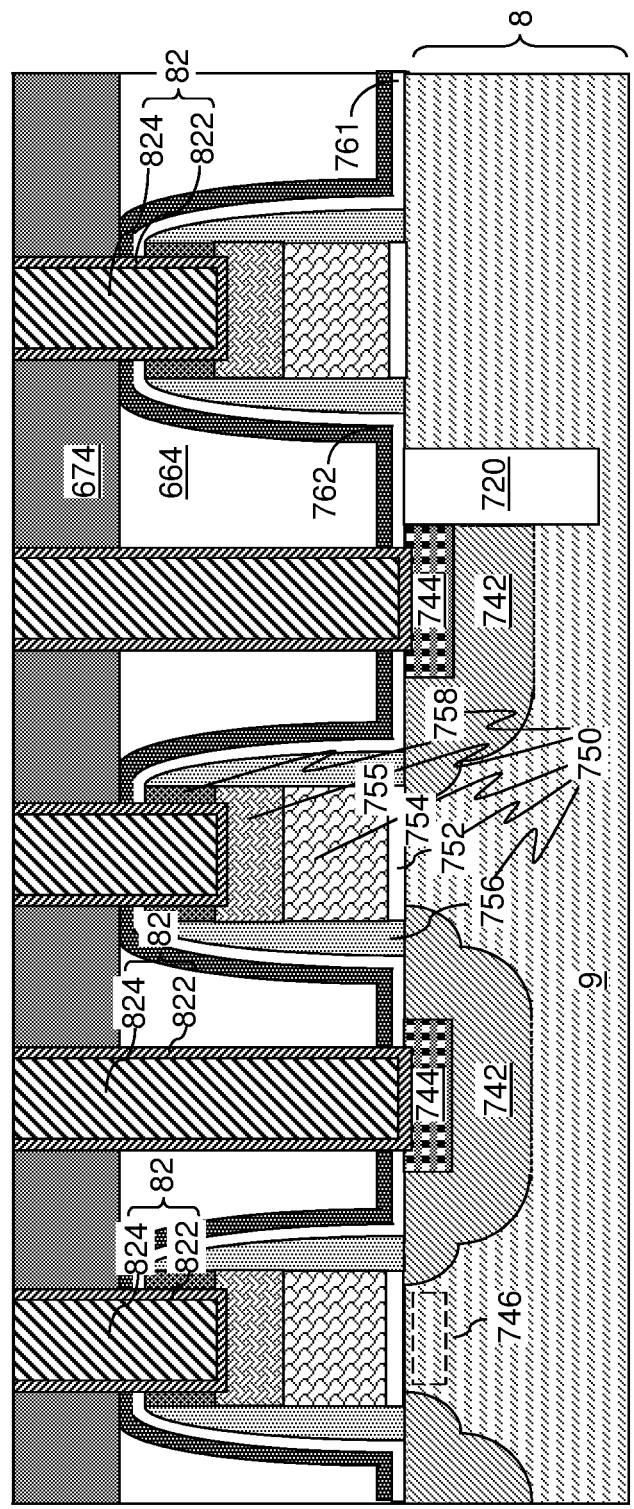
FIG. 11 is a vertical cross-sectional view of the second configuration of the first exemplary structure after formation of first metallic via structures according to an embodiment of the present disclosure.

Referring to FIG. 11, a lower metallic via structure 82 is formed within each of the contact via cavities (81A, 81G) by depositing at least one first metallic material in each of the contact via cavities (81A, 81G). For example, a lower metal nitride liner 822 can be deposited in each of the contact via cavities (81A, 81G). The lower metal nitride liner 822 can include a conductive metallic nitride material such as TiN, TaN, and/or WN, and can function as a diffusion barrier layer for elemental metal to be subsequently deposited. The lower metal nitride liner 822 can contact the physically exposed surfaces of the semiconductor devices 710 such as the metal silicide portions (744, 755). The lower metal nitride liner 822 can be formed as a continuous material layer by physical vapor deposition or chemical vapor deposition.

Subsequently, a metal such as tungsten, copper, or aluminum can be deposited in remaining volumes of the contact via cavities (81A, 81G) by physical vapor deposition, chemical vapor deposition, or electroplating. In one embodiment, the metal can consist essentially of at least one metallic element, which can be a single elemental metallic element or a plurality of metallic elements provided as a layer stack or as an alloy.

Portions of the deposited metal and the lower metal nitride liner 822 deposited over the top surface of the silicon nitride diffusion barrier layer 674 can be removed by a planarization process such as a recess etch or chemical mechanical planarization. Each remaining portion of the deposited metal in a contact via cavity (81A, 81G) constitutes a lower metal fill portion 824. The lower metal nitride liner 822 is divided into multiple portions, each of which is located entirely within a respective one of the contact via cavities (81A, 81G). Each contiguous combination of a lower metal nitride liner 822 and a lower metal fill portion 824 constitutes a lower metallic via structure 82. The lower metallic via structures 82 can have a top surface that is within the horizontal plane including the top surface of the silicon nitride diffusion barrier layer 674.

Figure 12:
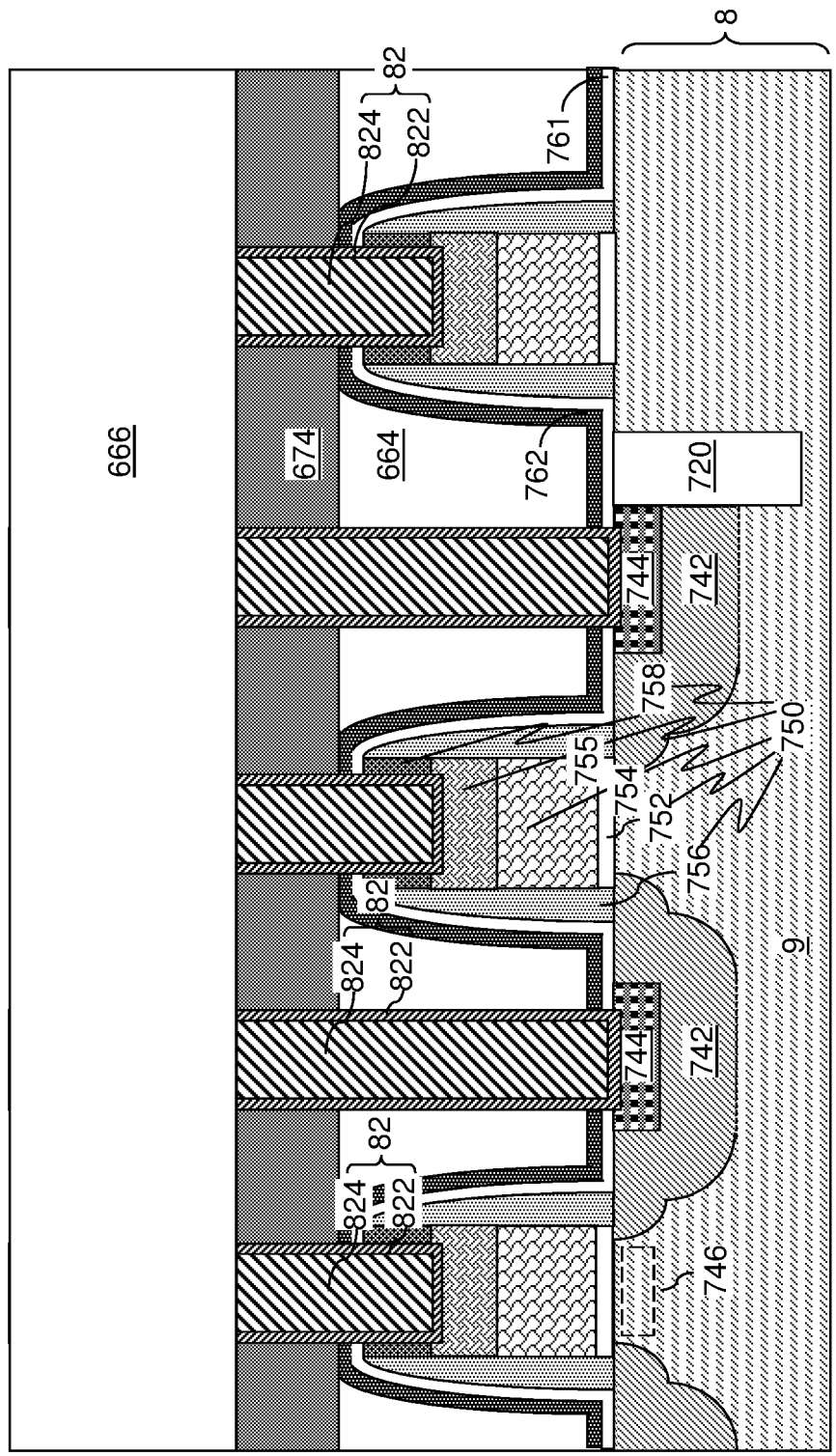
FIG. 12 is a vertical cross-sectional view of the second configuration of the first exemplary structure after formation of a via level dielectric layer according to an embodiment of the present disclosure.

Referring to FIG. 12, a via level dielectric layer 666 is deposited over the silicon nitride diffusion barrier layer 674 and the lower metallic via structures 82. The via level dielectric layer 666 includes a dielectric material such as an undoped silicate glass, a doped silicate glass, a non-porous organosilicate glass, or a porous organosilicate glass. The thickness of the via level dielectric layer 666 can be in a range from 60 nm to 600 nm, such as from 120 nm to 300 nm, although lesser and greater thicknesses can also be employed. The via level dielectric layer 666 can be deposited by chemical vapor deposition or atomic layer deposition. The via level dielectric layer 666 can have a planar top surface, i.e., a top surface located within a two-dimensional horizontal plane.

Figure 13:
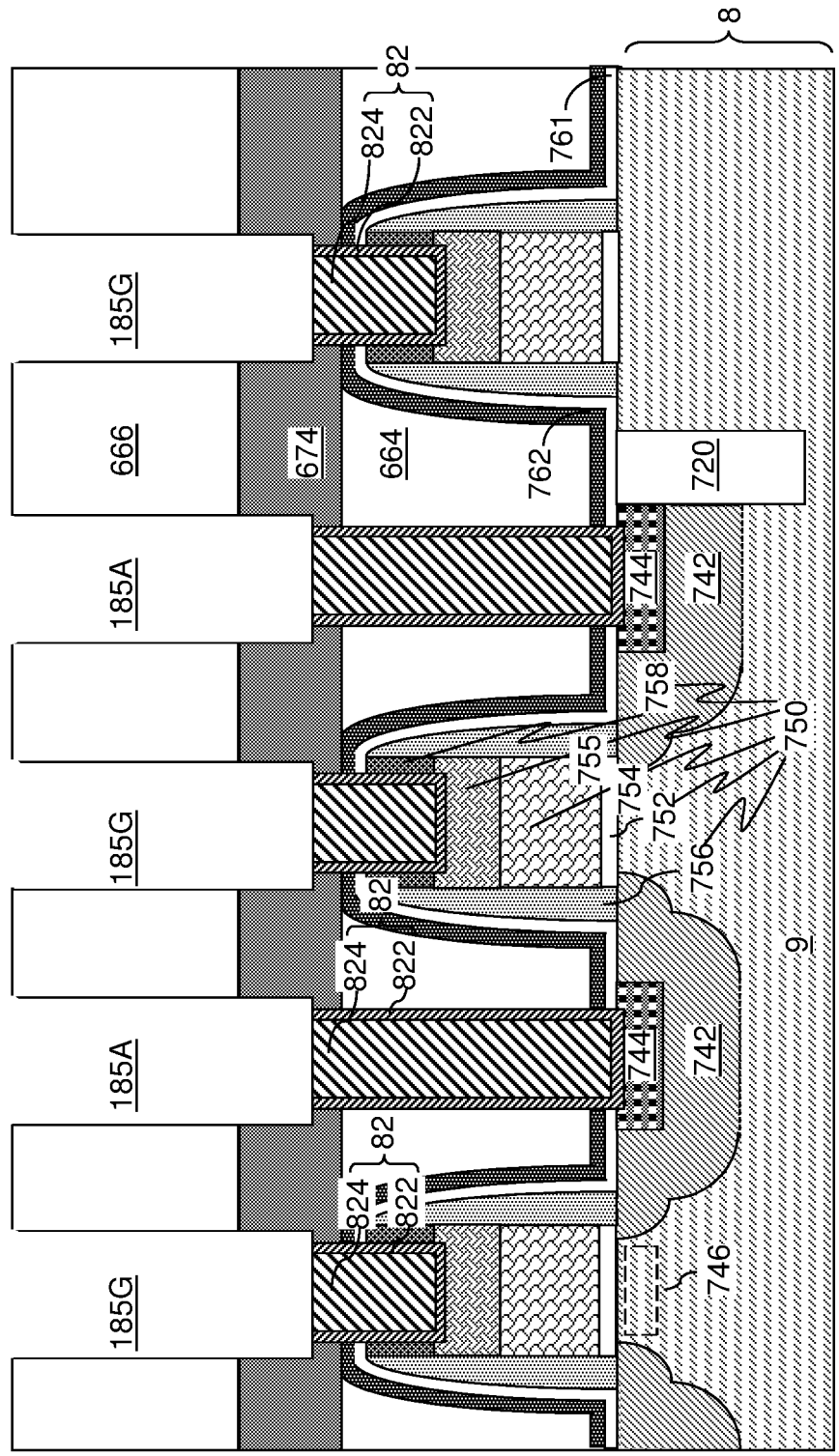
FIG. 13 is a vertical cross-sectional view of the second configuration of the first exemplary structure after formation of second via cavities according to an embodiment of the present disclosure.

Referring to FIG. 13, a photoresist layer (not shown) can be applied over the via level dielectric layer 666, and can be lithographically patterned to form openings over areas of the lower metallic via structures 82. An anisotropic etch process can be performed to transfer the pattern of the openings in the photoresist layer through the via level dielectric layer 666. Second via cavities (185A, 185G) are formed through the via level dielectric layer 666. The via cavities (81A, 81G) are herein referred to as first via cavities (81A, 81G) in contrast to the second via cavities (185A, 185G). Upper portions of the lower metallic via structures 82 can be vertically recessed below a horizontal plane including the top surface of the silicon nitride diffusion barrier layer 674.

In one embodiment, the second via cavities (185A, 185G) can have a greater width (and a greater horizontal cross-sectional area) than a respective underlying lower metal via structure 82. In one embodiment, the entire top surface of an underlying lower metal via structure 82 can be physically exposed at the bottom of each second via cavity (185A, 185G). In one embodiment, a top surface of a lower metallic via structure 82 and an annular horizontal surface of the silicon nitride diffusion barrier layer 674 can be physically exposed at a bottom of each second via cavity (185A, 185G). As used herein, an "annular" surface refers to a two-dimensional surface that is homeomorphic to an annulus. Thus, an annular surface can be defined by a pair of an outer periphery of any first closed two-dimensional shape and an inner periphery of any second two-dimensional shape that does not touch the first closed two-dimensional shape.

The second via cavities (185A, 185G) include second active region via cavities 185A that overlie a respective lower metal via structure 82 that fills a first active region contact via cavity 81A, and second gate via cavities 185G that overlie a respective lower metal via structure 82 that fills a first gate contact via cavity 81G. The second active region via cavities 185A and the second gate via cavities 185G can have the same depth, which is greater than the thickness of the via level dielectric layer 666 and is less than the sum of the thickness of the via level dielectric layer 666 and the thickness of the silicon nitride diffusion barrier layer 674.

Figure 14:
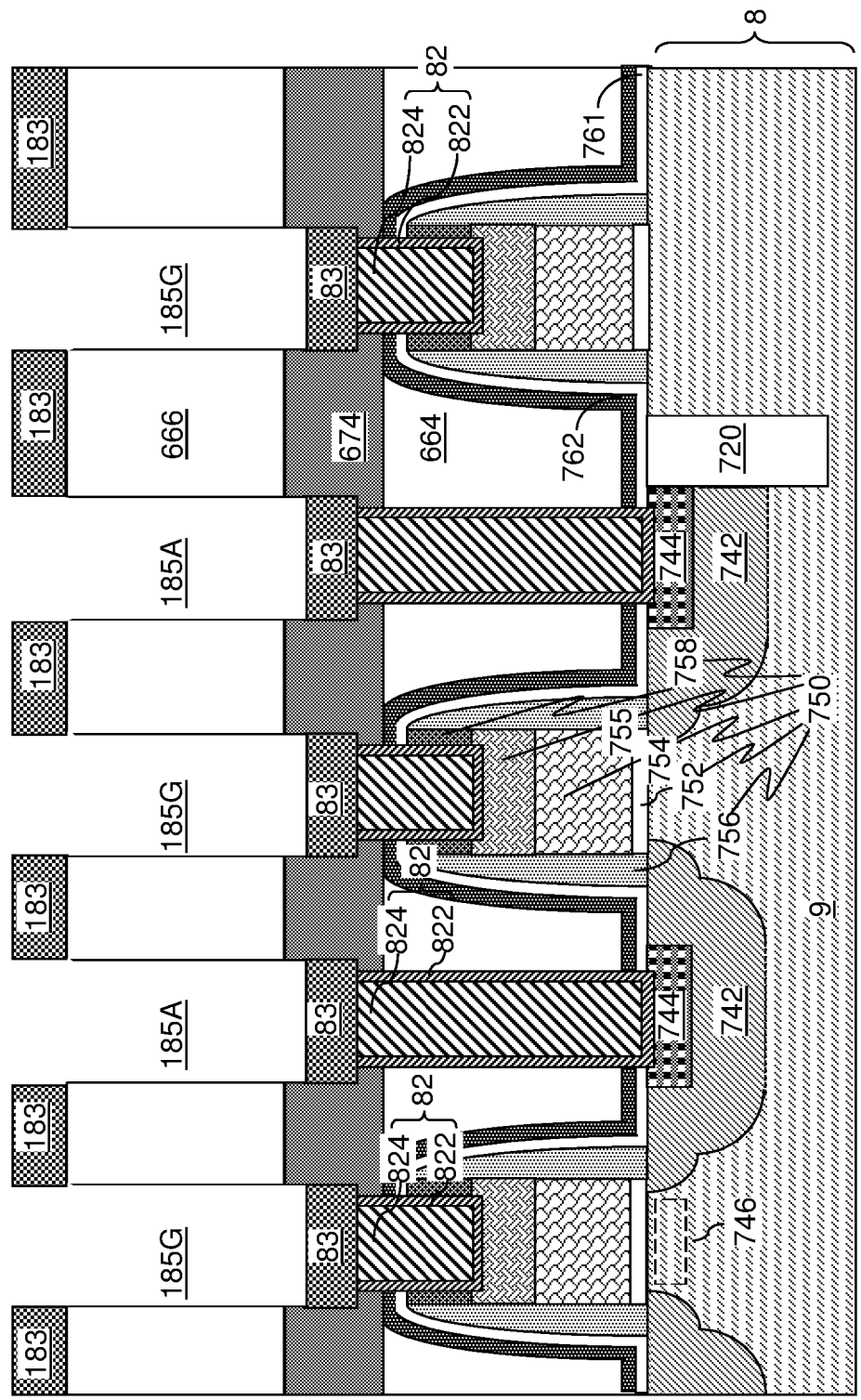
FIG. 14 is a vertical cross-sectional view of the second configuration of the first exemplary structure after formation of titanium diffusion barrier structures according to an embodiment of the present disclosure.

Referring to FIG. 14, titanium can be deposited on horizontal top surfaces of the first exemplary structure by an anisotropic deposition process. For example, a collimated physical vapor deposition (PVD) process can be performed to deposit titanium on the horizontal top surfaces of the first exemplary structure, which include top surfaces of the via level dielectric layer 666 and top surfaces of the lower metallic via structures 82. The anisotropic deposition process deposits titanium with a high degree of directionality. For example, more than 50% all titanium flux directed at the first exemplary structure within a deposition chamber can be with 10 degrees, such as within 5 degrees, of the downward normal direction that is perpendicular to the top surface of the via level dielectric layer. The amount of titanium material deposited on the sidewalls of the second via cavities (185G, 185A) can be insignificant compared to the amount of titanium deposited on the horizontal surfaces of the first exemplary structure.

Titanium diffusion barrier structures 83 are formed at the bottom of each second via cavity (185A, 185G) directly on top surfaces of the lower metallic via structures 82. The titanium diffusion barrier structures 83 can consist essentially of titanium. Each titanium diffusion barrier structures 83 is formed on a respective sidewall of the silicon nitride barrier layer 674. In one embodiment, one or more of the titanium diffusion barrier structures 83 can contact horizontal surfaces of the silicon nitride diffusion barrier layer 674. A titanium layer 183 can be formed on the top surface of the via level dielectric layer 666. The thickness of the titanium diffusion barrier structures 83 can be in a range from 10 nm to 120 nm, such as from 15 nm to 60 nm, although lesser and greater thicknesses can also be employed. The thickness deposited titanium on sidewalls of the second via cavities (185A, 185G) can be in a range from 1% to 20% of the thickness of the titanium diffusion barrier structures 83. Optionally but not necessarily, an isotropic etch back process can be performed to etch back deposited titanium from sidewalls of the second via cavities (185A, 185G). In one embodiment, the isotropic etch back process can be a wet etch process employing a combination of hydrofluoric acid, nitric acid, ammonium hydroxide, and/or hydrogen peroxide.

Figure 15:
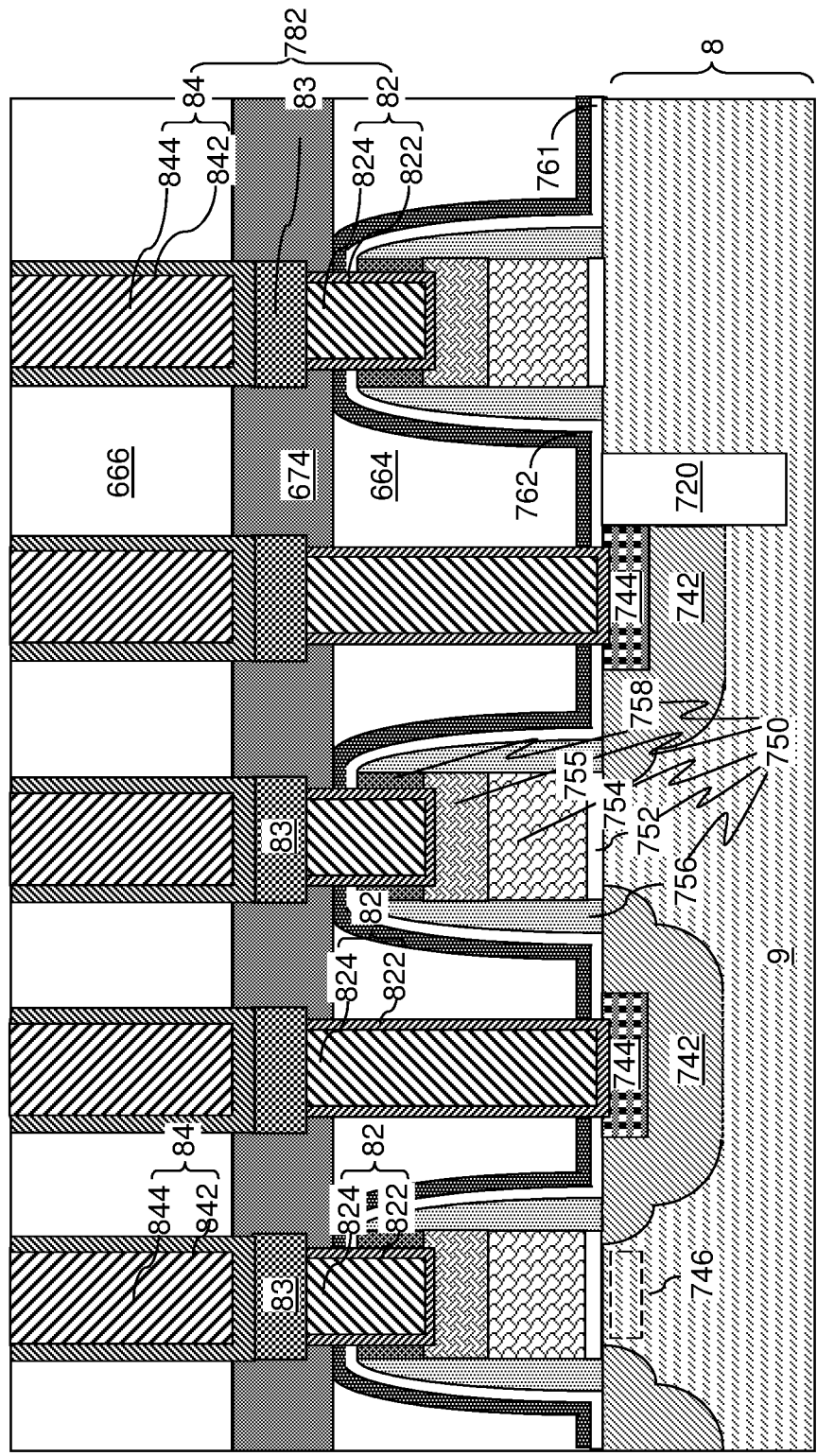
FIG. 15 is a vertical cross-sectional view of the second configuration of the first exemplary structure after formation of upper metallic via structures according to an embodiment of the present disclosure.

Referring to FIG. 15, at least one second metallic material is deposited in each of the second via cavities (185A, 185G). For example, an upper metal nitride liner 842 can be deposited in each of the second via cavities (185A, 185G). The upper metal nitride liner 842 can include a conductive metallic nitride material such as TiN, TaN, and/or WN, and can function as a diffusion barrier layer for elemental metal to be subsequently deposited. The upper metal nitride liner 842 can contact the physically exposed surfaces of the titanium diffusion barrier structures 83. The upper metal nitride liner 842 can be formed as a continuous material layer by physical vapor deposition or chemical vapor deposition.

Subsequently, a metal such as tungsten, copper, or aluminum can be deposited in remaining volumes of the second via cavities (185A, 185G) by physical vapor deposition, chemical vapor deposition, or electroplating. In one embodiment, the metal can consist essentially of at least one metallic element, which can be a single elemental metallic element or a plurality of metallic elements provided as a layer stack or as an alloy.

Portions of the deposited metal and the upper metal nitride liner 842 deposited over the top surface of the via level dielectric layer 666 and the titanium layer 183 can be removed by a planarization process such as a recess etch or chemical mechanical planarization. Each remaining portion of the deposited metal in a second via cavity (185A, 185G) constitutes an upper metal fill portion 844. The upper metal nitride liner 842 is divided into multiple portions, each of which is located entirely within a respective one of the second via cavities (185A, 185G). Each contiguous combination of an upper metal nitride liner 842 and an upper metal fill portion 844 constitutes an upper metallic via structure 84. Each upper metallic via structures 84 can have a top surface that is within the horizontal plane including the top surface of the via level dielectric layer 666.

A composite contact via structure 782 is formed within the combined volumes of a first via cavity (81A or 81G) and a second via cavity (185A or 185G). Each composite contact via structure 782 can include a lower metallic via structure 82, a titanium diffusion barrier structure 83, and an upper metallic via structure 84. Each lower metallic via structure 82 comprises a lower metal nitride liner 822 and a lower metal fill portion 824, and each upper metallic via structure 84 comprises an upper metal nitride liner 842 and an upper metal fill portion 844. Each combination of a titanium diffusion barrier structure 83 and an upper metallic via structure 84 can have a straight sidewall that extends from the top surface of the via level dielectric layer 666 to a horizontal plane including an interface between the lower metallic via structures 82 and the upper metallic via structures 84. The combination of the silicon nitride diffusion barrier layer 674 and the titanium diffusion barrier structures 83 can provide a continuous hydrogen diffusion barrier structure without any opening therethrough, thereby functioning as an effective hydrogen diffusion barrier structure between structures overlying the silicon nitride diffusion barrier layer 674 and structures underlying the silicon nitride diffusion barrier layer 674.

Figure 16:
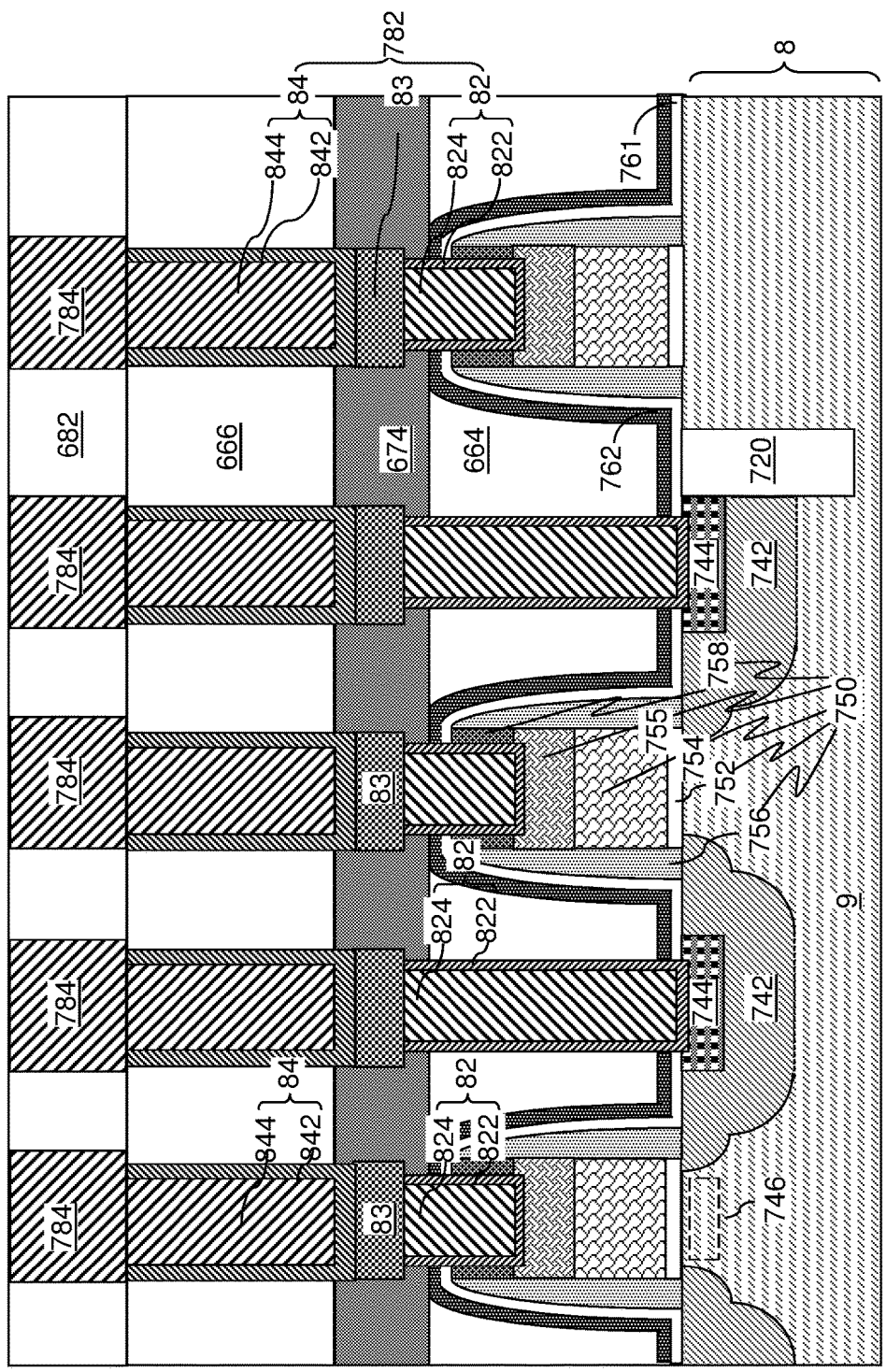
FIG. 16 is a vertical cross-sectional view of the second configuration of the first exemplary structure after formation of a line level dielectric layer and a metal interconnect lines according to an embodiment of the present disclosure.

Referring to FIG. 16, a line level dielectric layer 682 can be formed over the via level dielectric layer 666. The line level dielectric layer 682 includes a dielectric material such as silicon oxide. Metal interconnect lines, which are referred to as first level lower line structures 784, can be formed through the line level dielectric liner 682 on a respective one of the composite contact via structures 782.

Figure 17:
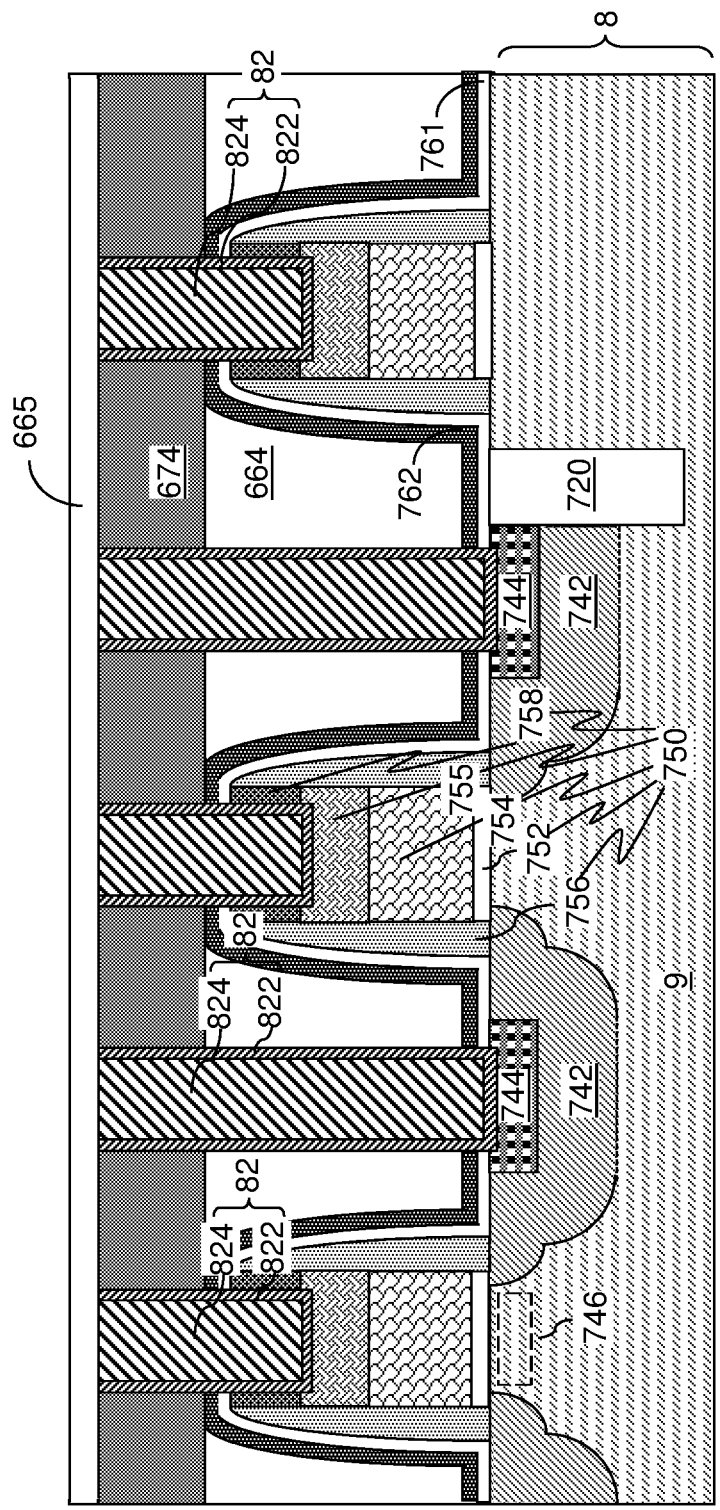
FIG. 17 is a vertical cross-sectional view of a third configuration of the first exemplary structure after formation of a planarization dielectric layer, a silicon nitride diffusion barrier layer, lower metal via structures, and an intermediate dielectric material layer according to an embodiment of the present disclosure.

Referring to FIG. 17, a third configuration of the first exemplary structure according to an embodiment of the present disclosure can be derived from the second exemplary configuration of the first exemplary structure at the processing steps of FIG. 11 by depositing an intermediate dielectric material layer 665 over the top surface of the silicon diffusion barrier layer 674. The intermediate dielectric material layer 665 includes a dielectric material such as silicon oxide. The intermediate dielectric material layer 665 can be deposited by a conformal deposition method or a non-conformal deposition method. The thickness of the intermediate dielectric material layer 665 can be in a range from 10 nm to 100 nm, although lesser and greater thicknesses can also be employed.

Figure 18:
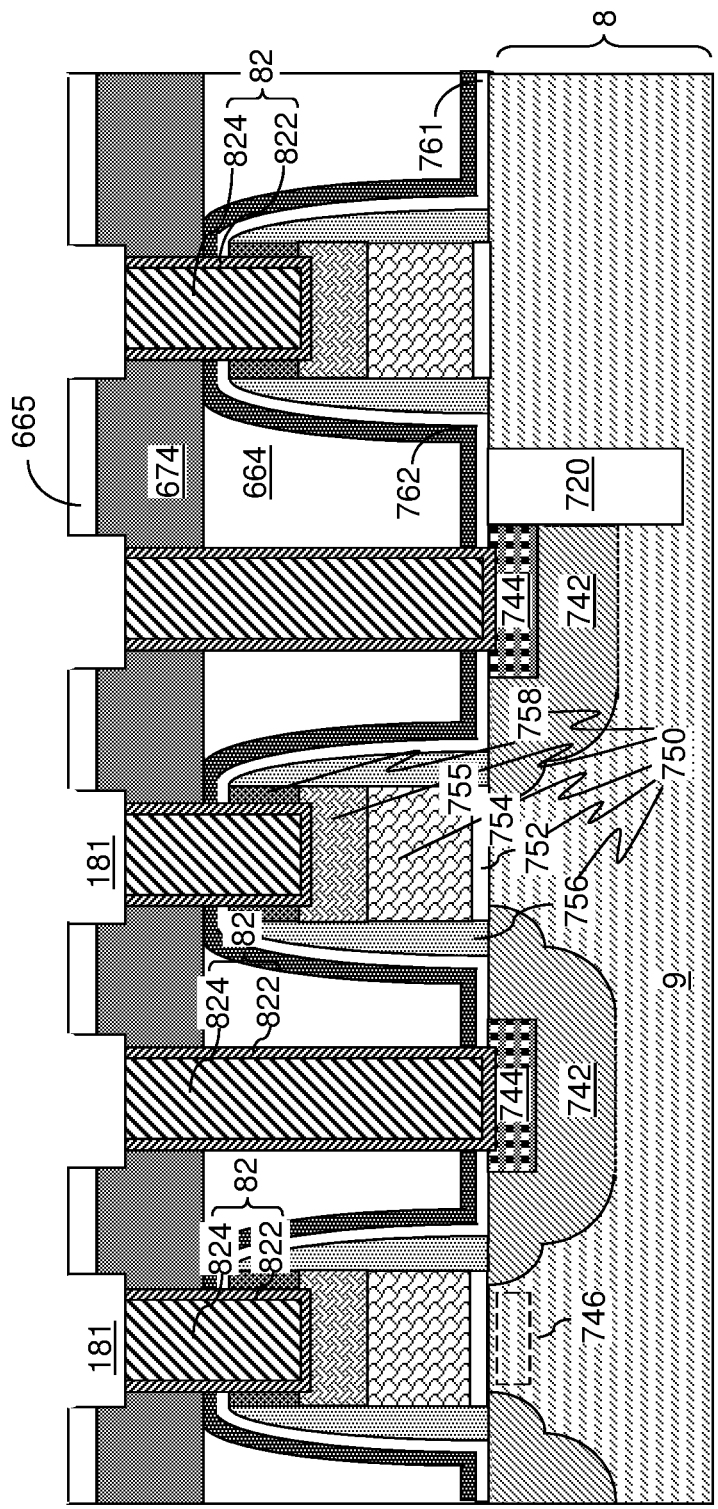
FIG. 18 is a vertical cross-sectional view of the third configuration of the first exemplary structure after formation of recess cavities according to an embodiment of the present disclosure.

Referring to FIG. 18, a photoresist layer (not shown) can be applied over the intermediate dielectric material layer 665, and can be lithographically patterned to form openings over areas of the lower metallic via structures 82. An anisotropic etch process can be performed to transfer the pattern of the openings in the photoresist layer through the intermediate dielectric material layer 665. Recess cavities 181 are formed through the intermediate dielectric material layer 665. Upper portions of the lower metallic via structures 82 can be vertically recessed below a horizontal plane including the top surface of the silicon nitride diffusion barrier layer 674.

In one embodiment, the recess cavities 181 can have a greater width (and a greater horizontal cross-sectional area) than a respective underlying lower metal via structure 82. In one embodiment, the entire top surface of an underlying lower metal via structure 82 can be physically exposed at the bottom of each recess cavity 181. In one embodiment, a top surface of a lower metallic via structure 82 and an annular horizontal surface of the silicon nitride diffusion barrier layer 674 can be physically exposed at a bottom of each recess cavity 181. The depth of the recess cavities 181 can be greater than the thickness of the intermediate dielectric material layer 665 and less than the sum of the thickness of the intermediate dielectric material layer 665 and the thickness of the silicon nitride diffusion barrier layer 674.

Figure 19:
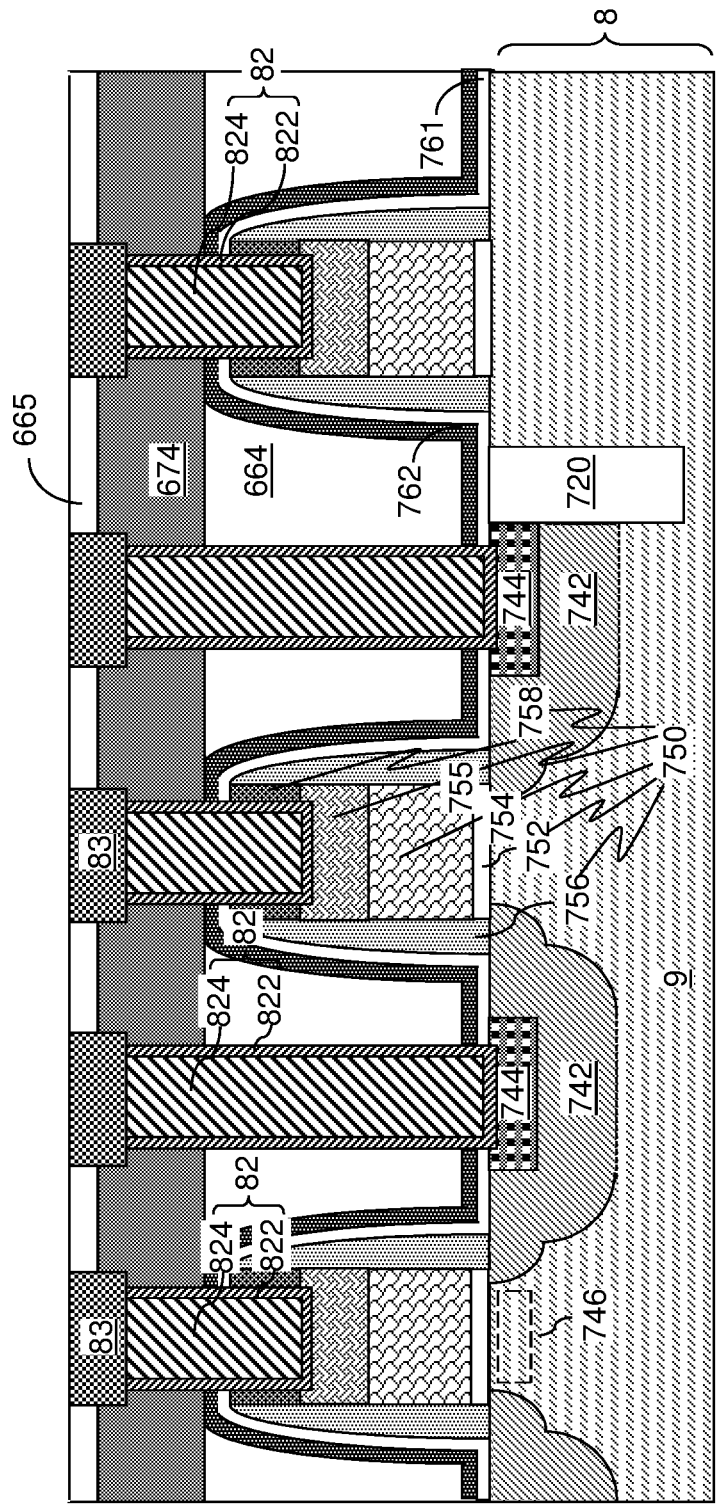
FIG. 19 is a vertical cross-sectional view of the third configuration of the first exemplary structure after formation of titanium diffusion barrier structures according to an embodiment of the present disclosure.

Referring to FIG. 19, titanium can be deposited on horizontal top surfaces of the first exemplary structure by a conformal or non-conformal deposition process. For example, a physical vapor deposition (PVD) process or a chemical vapor deposition (CVD) process can be employed to deposit titanium on the horizontal top surfaces of the first exemplary structure, which include top surfaces of the intermediate dielectric material layer 665 and top surfaces of the lower metallic via structures 82. The thickness of the deposited titanium material can be greater than the depth of the recess cavities.

Portions of the deposited titanium material located above the horizontal plane including the top surface of the intermediate dielectric material layer 665 can be removed by a chemical mechanical planarization (CMP) process. Remaining portions of the deposited titanium material filling the recess cavities 181 constitute titanium diffusion barrier structures 83. Top surfaces of the titanium diffusion barrier structures 83 can be coplanar with the top surface of the intermediate dielectric material layer 665. The titanium diffusion barrier structures 83 can consist essentially of titanium. The thickness of the titanium diffusion barrier structures 83 can be in a range from 10 nm to 120 nm, such as from 15 nm to 60 nm, although lesser and greater thicknesses can also be employed.

Figure 20:
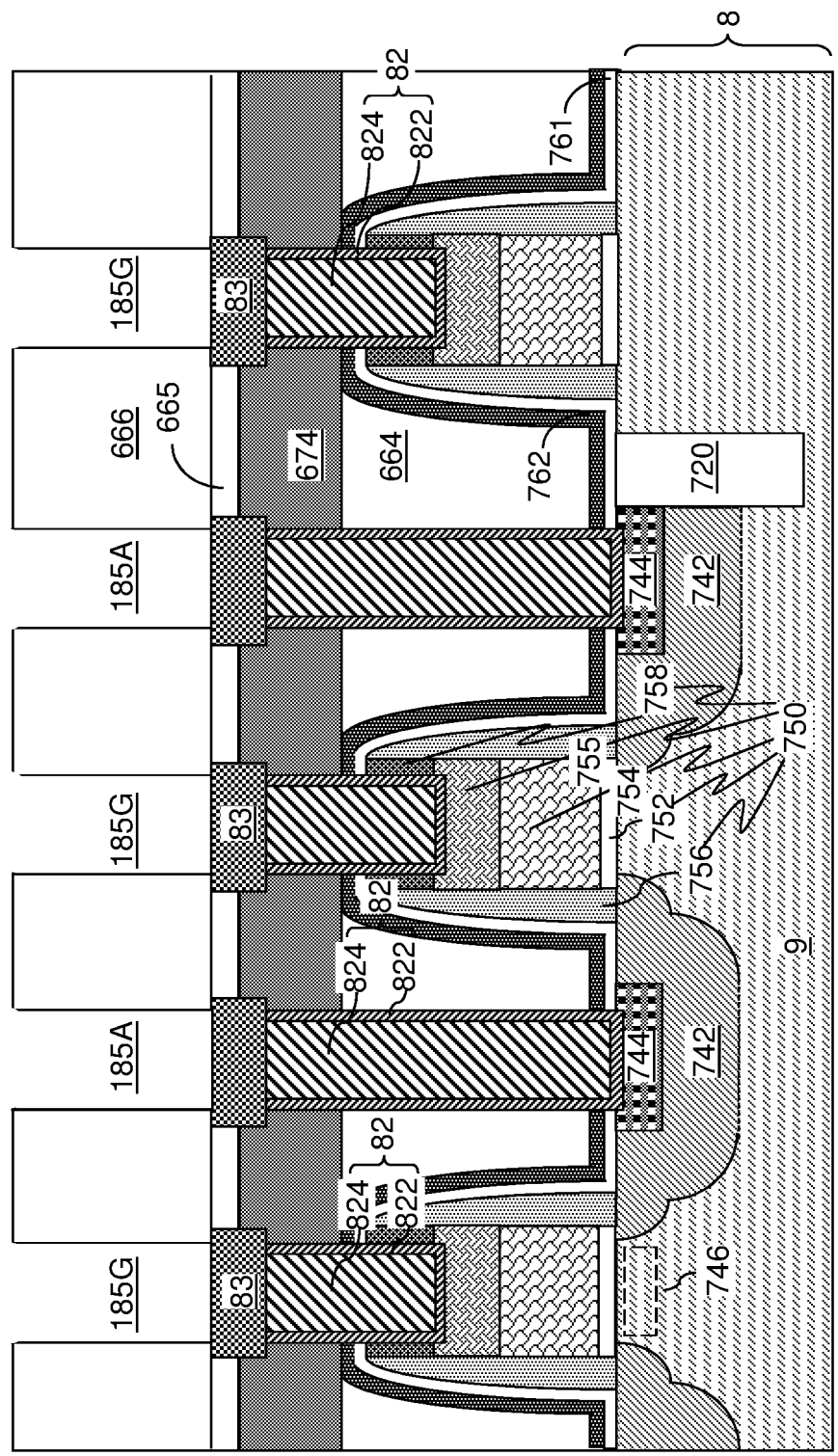
FIG. 20 is a vertical cross-sectional view of the third configuration of the first exemplary structure after formation of a via level dielectric layer and second via cavities according to an embodiment of the present disclosure.

Referring to FIG. 20, a via level dielectric layer 666 is deposited over the silicon nitride diffusion barrier layer 674 and the titanium diffusion barrier structures 83. The via level dielectric layer 666 includes a dielectric material such as an undoped silicate glass, a doped silicate glass, a non-porous organosilicate glass, or a porous organosilicate glass. The thickness of the via level dielectric layer 666 can be in a range from 60 nm to 600 nm, such as from 120 nm to 300 nm, although lesser and greater thicknesses can also be employed. The via level dielectric layer 666 can be deposited by chemical vapor deposition or atomic layer deposition. The via level dielectric layer 666 can have a planar top surface, i.e., a top surface located within a two-dimensional horizontal plane.

A photoresist layer (not shown) can be applied over the via level dielectric layer 666, and can be lithographically patterned to form openings over areas of the titanium diffusion barrier structures 83. An anisotropic etch process can be performed to transfer the pattern of the openings in the photoresist layer through the via level dielectric layer 666. Second via cavities (185A, 185G) are formed through the via level dielectric layer 666. The via cavities (81A, 81G) are herein referred to as first via cavities (81A, 81G) in contrast to the second via cavities (185A, 185G). A top surface of a titanium diffusion barrier structure 83 can be physically exposed below each second via cavity (185A, 185G).

In one embodiment, the second via cavities (185A, 185G) can have a lesser width (and a lesser horizontal cross-sectional area) than a respective underlying titanium diffusion barrier structure 83. In one embodiment, a center region of the top surface of an underlying titanium diffusion barrier structure 83 can be physically exposed at the bottom of each second via cavity (185A, 185G), while peripheral portions of the top surface of the underlying titanium diffusion barrier structure 83 are not physically exposed, i.e., contact a bottom surface of the via level dielectric layer 666. In one embodiment, an annular surface of a titanium diffusion barrier structure 83 can contact a bottom surface of the via level dielectric layer 666.

The second via cavities (185A, 185G) include second active region via cavities 185A that overlie a respective lower metal via structure 82 that fills a first active region contact via cavity 81A, and second gate via cavities 185G that overlie a respective lower metal via structure 82 that fills a first gate contact via cavity 81G. The second active region via cavities 185A and the second gate via cavities 185G can have the same depth, which may be the same as the thickness of the via level dielectric layer 666.

Figure 21:
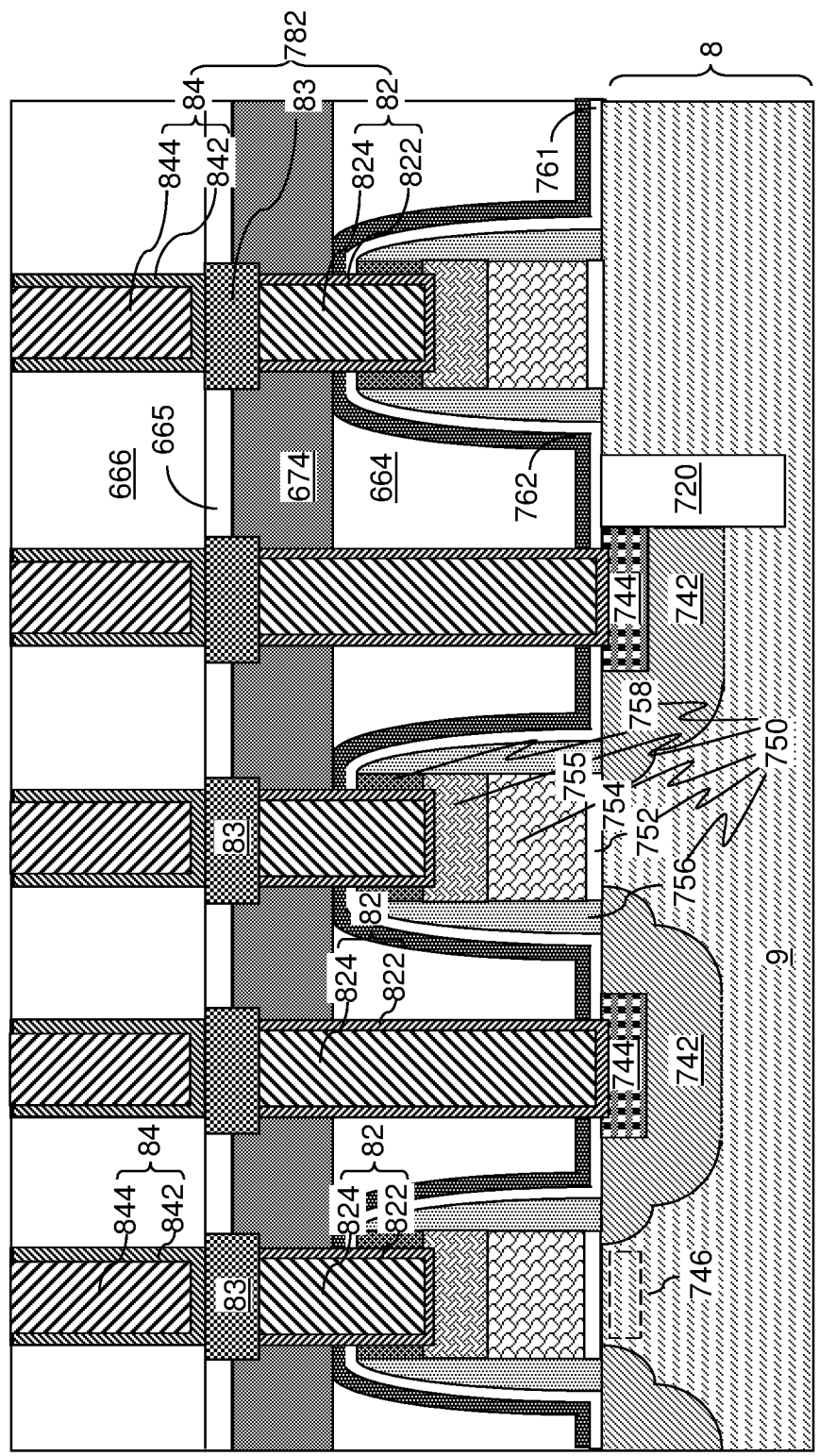
FIG. 21 is a vertical cross-sectional view of the third configuration of the first exemplary structure after formation of upper metallic via structures according to an embodiment of the present disclosure.

Referring to FIG. 21, at least one second metallic material is deposited in each of the second via cavities (185A, 185G). For example, an upper metal nitride liner 842 can be deposited in each of the second via cavities (185A, 185G). The upper metal nitride liner 842 can include a conductive metallic nitride material such as TiN, TaN, and/or WN, and can function as a diffusion barrier layer for elemental metal to be subsequently deposited. The upper metal nitride liner 842 can contact the physically exposed surfaces of the titanium diffusion barrier structures 83. The upper metal nitride liner 842 can be formed as a continuous material layer by physical vapor deposition or chemical vapor deposition.

Subsequently, a metal such as tungsten, copper, or aluminum can be deposited in remaining volumes of the second via cavities (185A, 185G) by physical vapor deposition, chemical vapor deposition, or electroplating. In one embodiment, the metal can consist essentially of at least one metallic element, which can be a single elemental metallic element or a plurality of metallic elements provided as a layer stack or as an alloy.

Portions of the deposited metal and the upper metal nitride liner 842 deposited over the top surface of the via level dielectric layer 666 can be removed by a planarization process such as a recess etch or chemical mechanical planarization. Each remaining portion of the deposited metal in a second via cavity (185A, 185G) constitutes an upper metal fill portion 844. The upper metal nitride liner 842 is divided into multiple portions, each of which is located entirely within a respective one of the second via cavities (185A, 185G). Each contiguous combination of an upper metal nitride liner 842 and an upper metal fill portion 844 constitutes an upper metallic via structure 84. Each upper metallic via structures 84 can have a top surface that is within the horizontal plane including the top surface of the via level dielectric layer 666.

A composite contact via structure 782 is formed within the combined volumes of a first via cavity (81A or 81G) and a second via cavity (185A or 185G). Each composite contact via structure 782 can include a lower metallic via structure 82, a titanium diffusion barrier structure 83, and an upper metallic via structure 84. Each lower metallic via structure 82 comprises a lower metal nitride liner 822 and a lower metal fill portion 824, and each upper metallic via structure 84 comprises an upper metal nitride liner 842 and an upper metal fill portion 844. In one embodiment, the composite contact via structures 782 can have lateral protrusions at the level of the titanium diffusion barrier structures 83. Specifically, a titanium diffusion barrier structure 83 can have a greater horizontal cross-sectional area than the horizontal cross-sectional area of an underlying lower metallic via structure 82. Further, the titanium diffusion barrier structure 83 can have a greater horizontal cross-sectional area than the horizontal cross-sectional area of an overlying upper metallic via structure 84. The combination of the silicon nitride diffusion barrier layer 674 and the titanium diffusion barrier structures 83 can provide a continuous hydrogen diffusion barrier structure without any opening therethrough, thereby functioning as an effective hydrogen diffusion barrier structure between structures overlying the silicon nitride diffusion barrier layer 674 and structures underlying the silicon nitride diffusion barrier layer 674.

Figure 22:
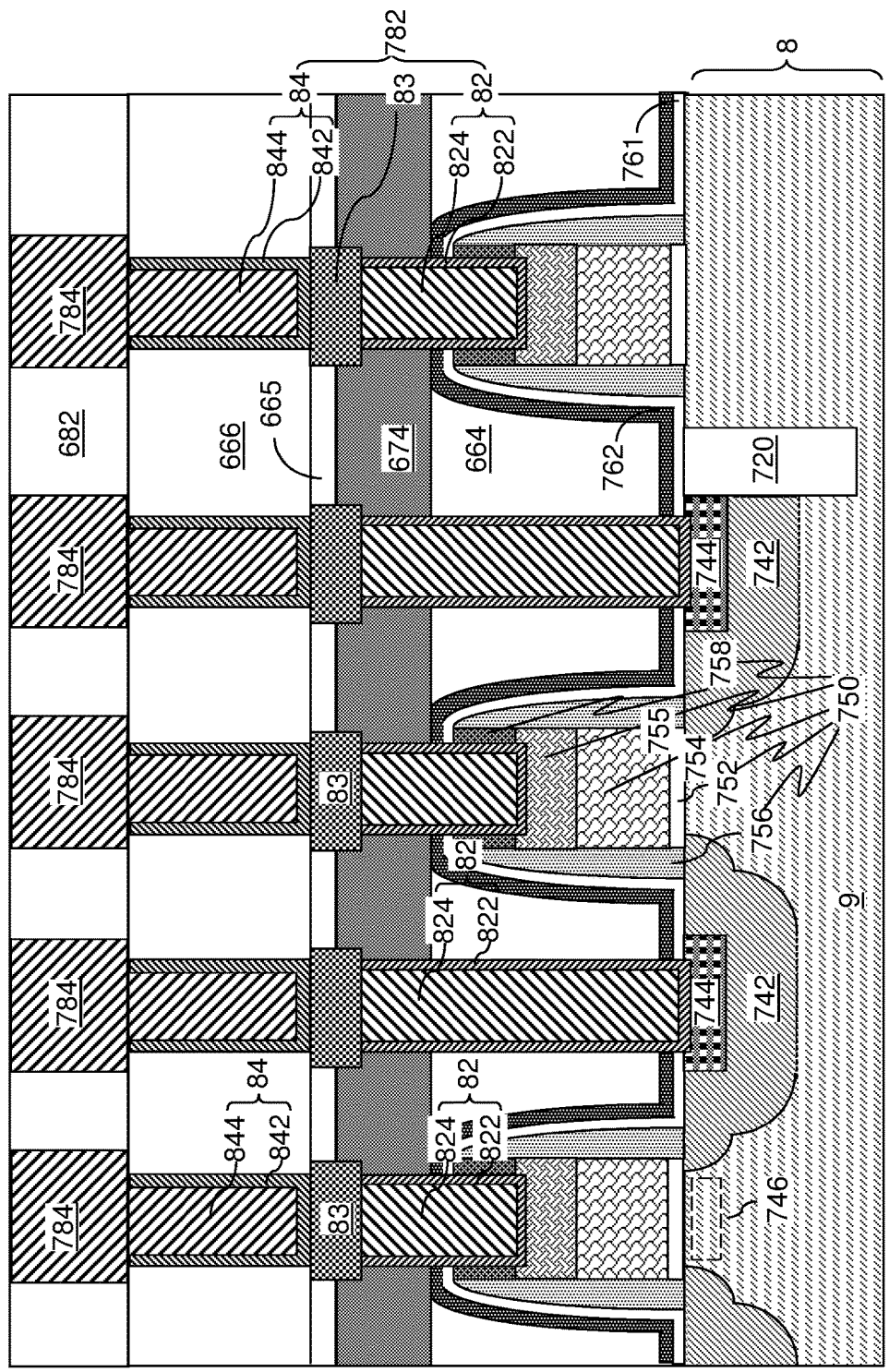
FIG. 22 is a vertical cross-sectional view of the third configuration of the first exemplary structure after formation of a line level dielectric layer and a metal interconnect lines according to an embodiment of the present disclosure.

Referring to FIG. 22, a line level dielectric layer 682 can be formed over the via level dielectric layer 666. The line level dielectric layer 682 includes a dielectric material such as silicon oxide. Metal interconnect lines, which are referred to as first level lower line structures 784, can be formed through the line level dielectric liner 682 on a respective one of the composite contact via structures 782.

Figure 23:
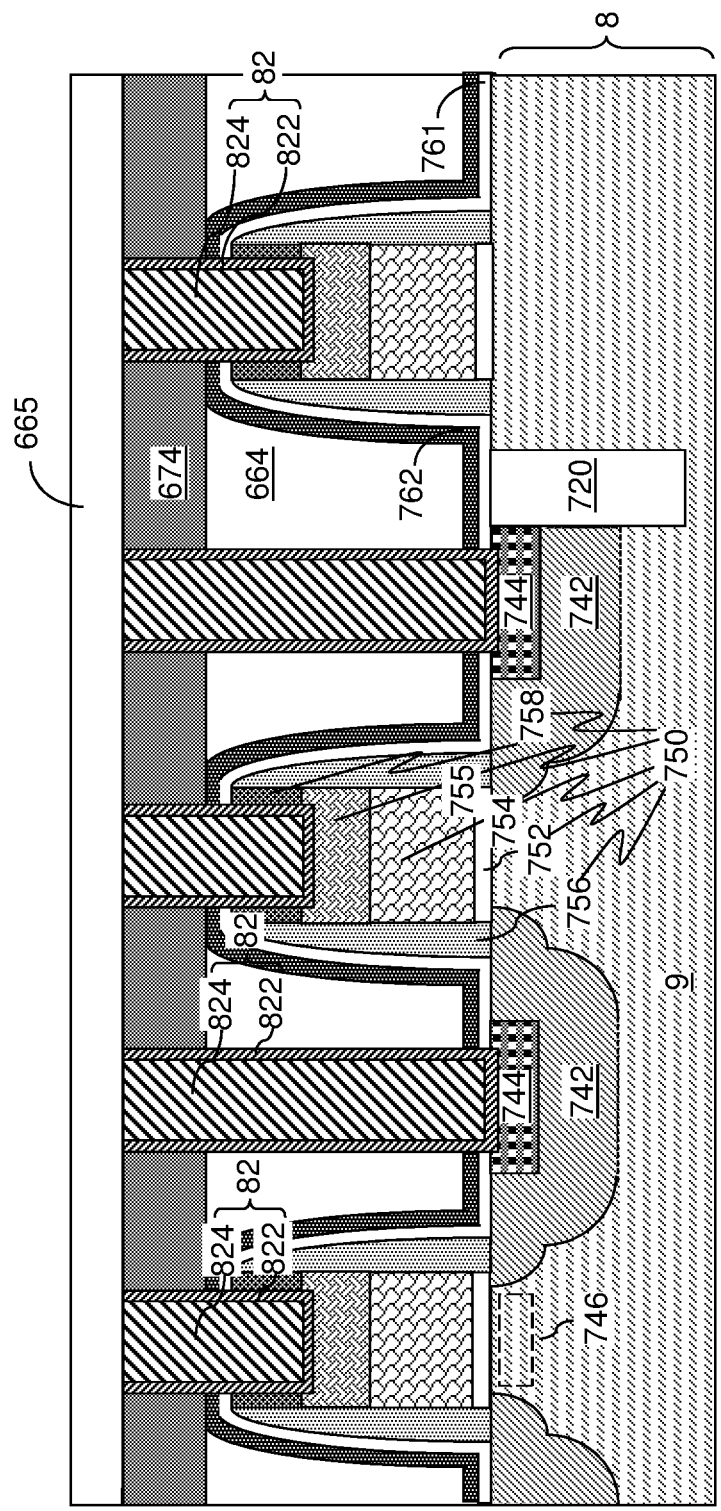
FIG. 23 is a vertical cross-sectional view of a fourth configuration of the first exemplary structure after formation of a planarization dielectric layer, a silicon nitride diffusion barrier layer, lower metal via structures, and an intermediate dielectric material layer according to an embodiment of the present disclosure.

Referring to FIG. 23, a fourth configuration of the first exemplary structure according to an embodiment of the present disclosure can be derived from the third configuration of the first exemplary structure illustrated in FIG. 17. In this configuration, the thickness of the intermediate dielectric material layer 665 can be in a range from 10 nm to 200 nm, although lesser and greater thicknesses can also be employed.

Figure 24:
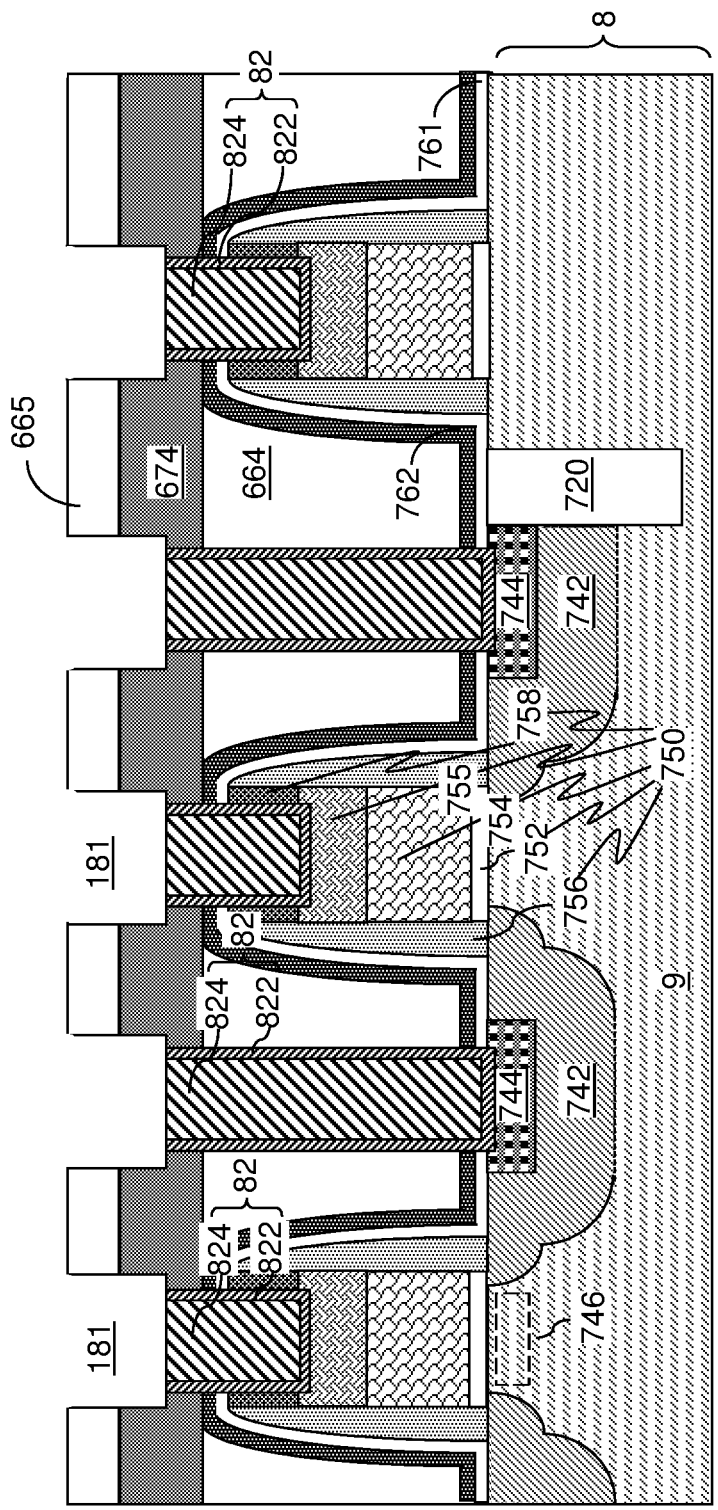
FIG. 24 is a vertical cross-sectional view of the fourth configuration of the first exemplary structure after formation of recess cavities according to an embodiment of the present disclosure.

Referring to FIG. 24, a photoresist layer (not shown) can be applied over the intermediate dielectric material layer 665, and can be lithographically patterned to form openings over areas of the lower metallic via structures 82. An anisotropic etch process can be performed to transfer the pattern of the openings in the photoresist layer through the intermediate dielectric material layer 665. Recess cavities 181 are formed through the intermediate dielectric material layer 665. Upper portions of the lower metallic via structures 82 can be vertically recessed below a horizontal plane including the top surface of the silicon nitride diffusion barrier layer 674.

In one embodiment, the recess cavities 181 can have a greater width (and a greater horizontal cross-sectional area) than a respective underlying lower metal via structure 82. In one embodiment, the entire top surface of an underlying lower metal via structure 82 can be physically exposed at the bottom of each recess cavity 181. In one embodiment, a top surface of a lower metallic via structure 82 and an annular horizontal surface of the silicon nitride diffusion barrier layer 674 can be physically exposed at a bottom of each recess cavity 181. The depth of the recess cavities 181 can be greater than the thickness of the intermediate dielectric material layer 665 and less than the sum of the thickness of the intermediate dielectric material layer 665 and the thickness of the silicon nitride diffusion barrier layer 674.

Figure 25:
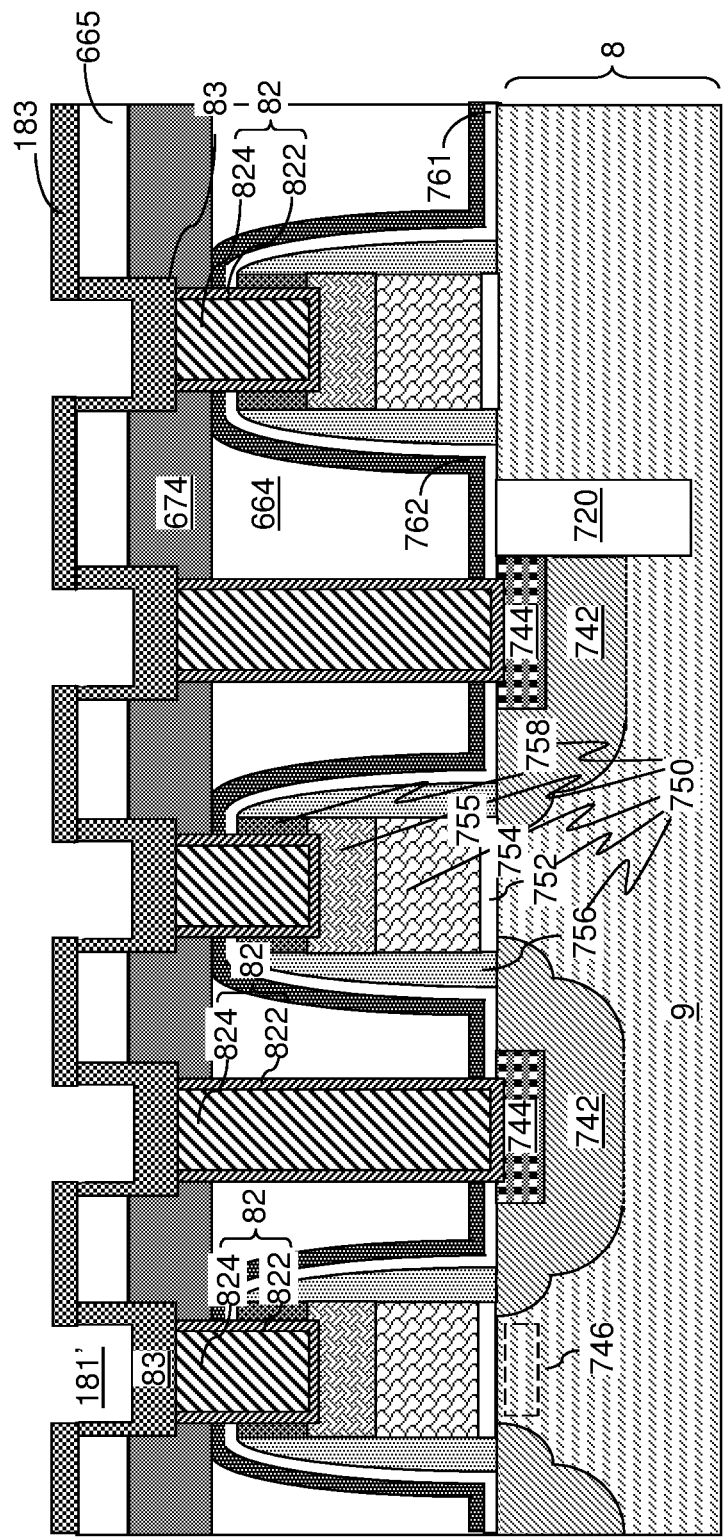
FIG. 25 is a vertical cross-sectional view of the fourth configuration of the first exemplary structure after formation of titanium diffusion barrier structures according to an embodiment of the present disclosure.

Referring to FIG. 25, titanium can be deposited on horizontal top surfaces of the first exemplary structure by a conformal or non-conformal deposition process. For example, a physical vapor deposition (PVD) process or a chemical vapor deposition (CVD) process can be employed to deposit titanium on the horizontal top surfaces of the first exemplary structure, which include top surfaces of the intermediate dielectric material layer 665 and top surfaces of the lower metallic via structures 82. The thickness of the deposited titanium material is less than the depth of the recess cavities 181 to partially fill the recess cavities 181.

Portions of the deposited titanium material partially filling the recess cavities 181 constitute titanium diffusion barrier structures 83. Remaining portions 181' of the recess cavities 181 are located above the titanium diffusion barrier structures 83. Portions 183 of the deposited titanium material are located on the top surface of the intermediate dielectric material layer 665. The titanium diffusion barrier structures 83 can consist essentially of titanium.

Figure 26:
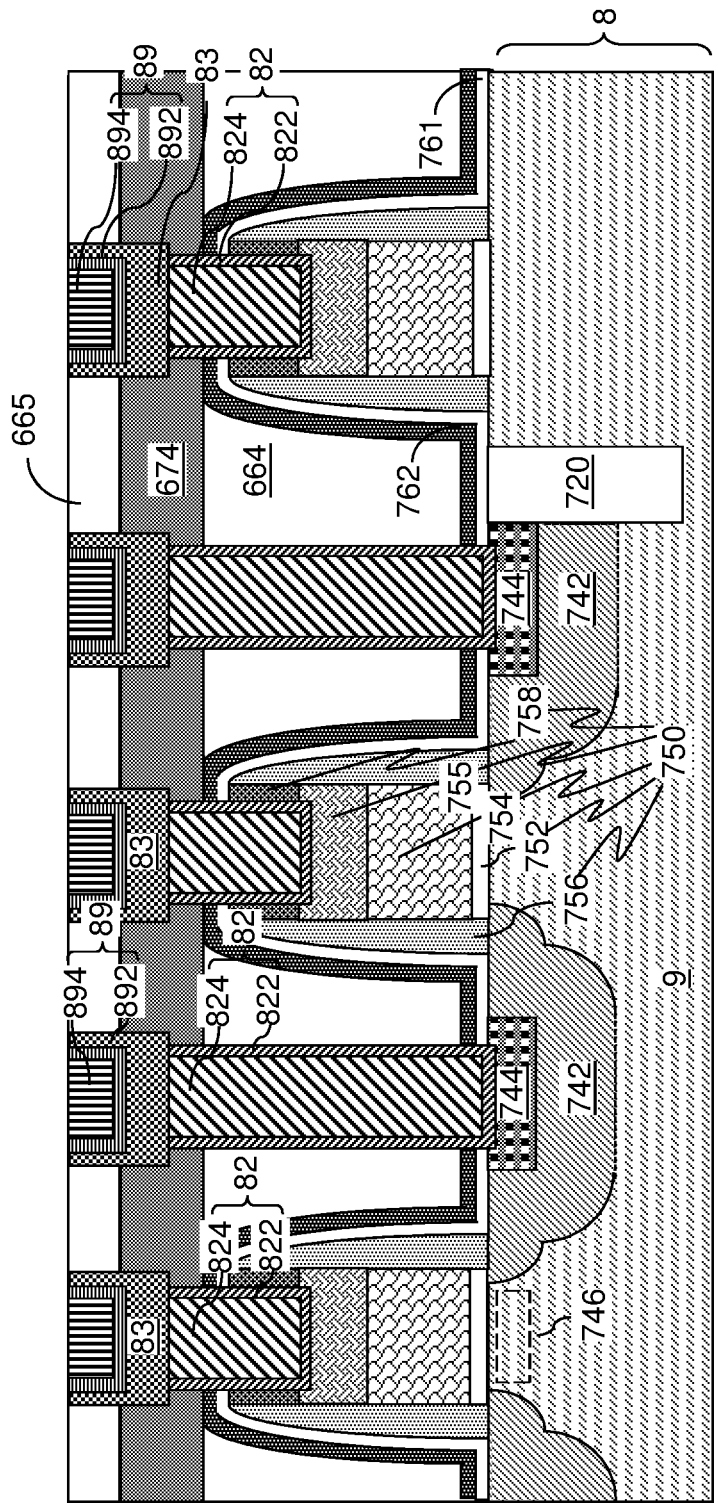
FIG. 26 is a vertical cross-sectional view of the fourth configuration of the first exemplary structure after formation of meal pad portions according to an embodiment of the present disclosure.

Referring to FIG. 26, metal pad portions 89 are formed in the remaining portions 181' of the recess cavities 181. The metal pad portions 89 can be formed by depositing at least one pad metallic material in each of the remaining portions 181' of the recess cavities 181. For example, a pad metal nitride liner 892 can be deposited in each of the remaining portions 181' of the recess cavities 181. The pad metal nitride liner 892 can include a conductive metallic nitride material such as TiN, TaN, and/or WN, and can function as a diffusion barrier layer for elemental metal to be subsequently deposited.

Subsequently, a metal such as tungsten, copper, or aluminum can be deposited in remaining volumes 181' of the recess cavities 181 by physical vapor deposition, chemical vapor deposition, or electroplating. In one embodiment, the metal can consist essentially of at least one metallic element, which can be a single elemental metallic element or a plurality of metallic elements provided as a layer stack or as an alloy.

Portions of the deposited metal, the pad metal nitride liner 842 and the titanium layer portions 183 deposited over the top surface of the intermediate dielectric material layer 665 can be removed by a planarization process such as a recess etch or chemical mechanical planarization. Each remaining portion of the deposited metal in a second via cavity constitutes a pad metal fill portion 894. The pad metal nitride liner 892 is divided into multiple portions. Each contiguous combination of adjacent a pad metal nitride liner 892 and a pad metal fill portion 894 constitutes a metal pad portion 89.

Figure 27:
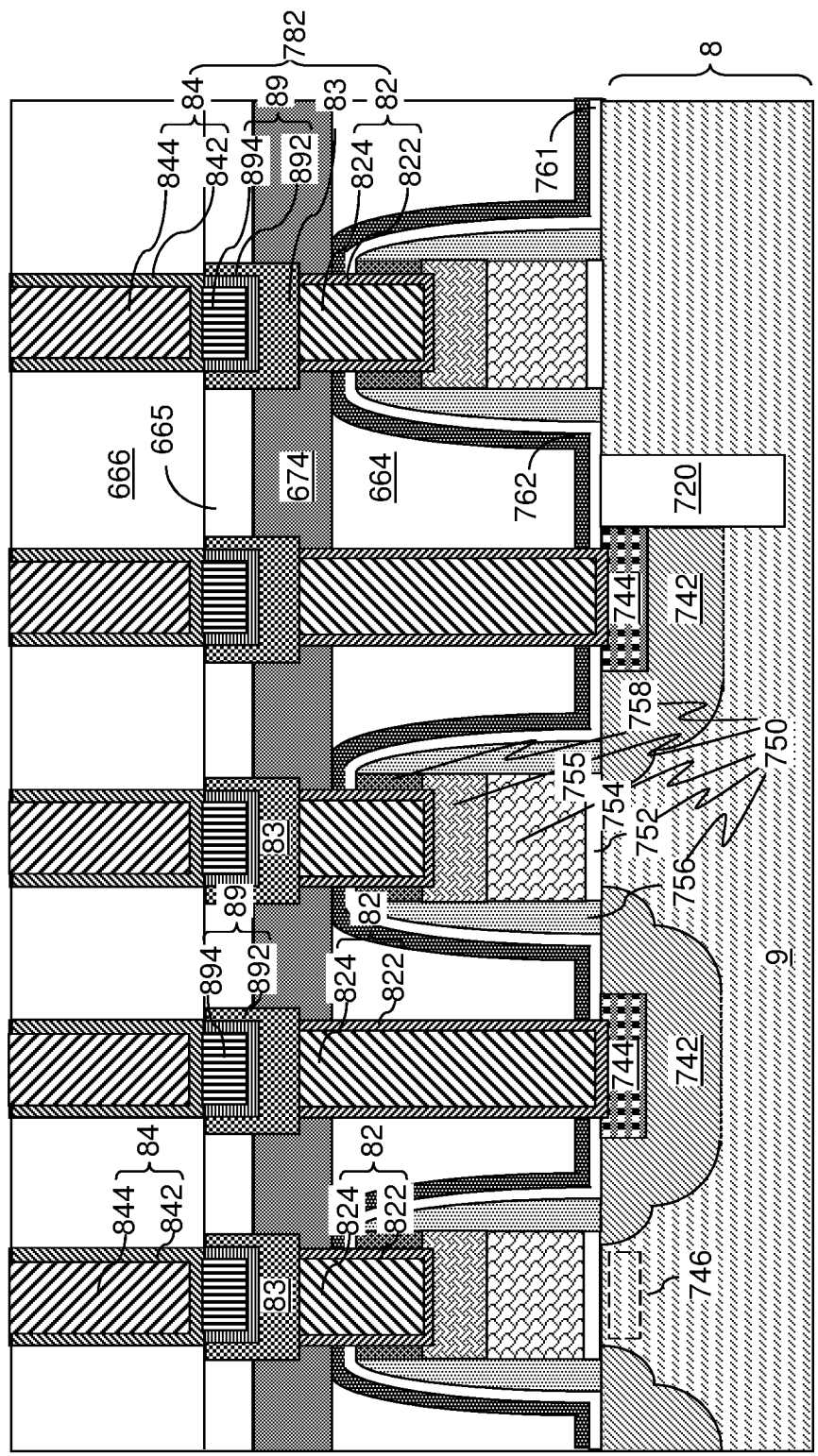
FIG. 27 is a vertical cross-sectional view of the fourth configuration of the first exemplary structure after formation of a via level dielectric layer and upper metallic via structures according to an embodiment of the present disclosure.

Referring to FIG. 27, a via level dielectric layer 666 is deposited over the intermediate dielectric material layer 665 and the metal pad portions 89. The via level dielectric layer 666 includes a dielectric material such as an undoped silicate glass, a doped silicate glass, a non-porous organosilicate glass, or a porous organosilicate glass. The thickness of the via level dielectric layer 666 can be in a range from 60 nm to 600 nm, such as from 120 nm to 300 nm, although lesser and greater thicknesses can also be employed. The via level dielectric layer 666 can be deposited by chemical vapor deposition or atomic layer deposition. The via level dielectric layer 666 can have a planar top surface, i.e., a top surface located within a two-dimensional horizontal plane.

A photoresist layer (not shown) can be applied over the via level dielectric layer 666, and can be lithographically patterned to form openings over areas of the metal pad portions 89. An anisotropic etch process can be performed to transfer the pattern of the openings in the photoresist layer through the via level dielectric layer 666. Second via cavities (185A, 185G) are formed through the via level dielectric layer 666. The via cavities (81A, 81G) are herein referred to as first via cavities (81A, 81G) in contrast to the second via cavities (185A, 185G). A top surface of a metal pad portion 89 can be physically exposed below each second via cavity.

In one embodiment, the second via cavities can have a lesser width (and a lesser horizontal cross-sectional area) than a respective underlying metal pad portion 89. In one embodiment, a center region of the top surface of an underlying metal pad portion 89 can be physically exposed at the bottom of each second via cavity, while peripheral portions of the top surface of the underlying metal pad portion 89 are not physically exposed, i.e., contact a bottom surface of the via level dielectric layer 666. In one embodiment, an annular surface of a metal pad portion 89 can contact a bottom surface of the via level dielectric layer 666.

The second via cavities include second active region via cavities that overlie a respective lower metal via structure 82 that fills a first active region contact via cavity 81A, and second gate via cavities that overlie a respective lower metal via structure 82 that fills a first gate contact via cavity 81G. The second active region via cavities and the second gate via cavities can have the same depth, which may be the same as the thickness of the via level dielectric layer 666.

At least one second metallic material is deposited in each of the second via cavities. For example, an upper metal nitride liner 842 can be deposited in each of the second via cavities. The upper metal nitride liner 842 can include a conductive metallic nitride material such as TiN, TaN, and/or WN, and can function as a diffusion barrier layer for elemental metal to be subsequently deposited. The upper metal nitride liner 842 can contact the physically exposed surfaces of the metal pad portion 89. The upper metal nitride liner 842 can be formed as a continuous material layer by physical vapor deposition or chemical vapor deposition.

Subsequently, a metal such as tungsten, copper, or aluminum can be deposited in remaining volumes of the second via cavities by physical vapor deposition, chemical vapor deposition, or electroplating. In one embodiment, the metal can consist essentially of at least one metallic element, which can be a single elemental metallic element or a plurality of metallic elements provided as a layer stack or as an alloy.

Portions of the deposited metal and the upper metal nitride liner 842 deposited over the top surface of the via level dielectric layer 666 can be removed by a planarization process such as a recess etch or chemical mechanical planarization. Each remaining portion of the deposited metal in a second via cavity constitutes an upper metal fill portion 844. The upper metal nitride liner 842 is divided into multiple portions, each of which is located entirely within a respective one of the second via cavities. Each contiguous combination of adjacent an upper metal nitride liner 842 and an upper metal fill portion 844 constitutes an upper metallic via structure 84. Each upper metallic via structures 84 can have a top surface that is within the horizontal plane including the top surface of the via level dielectric layer 666.

A composite contact via structure 782 is formed within the combined volumes of a first via cavity (81A or 81G) and a second via cavity (185A or 185G). Each composite contact via structure 782 can include a lower metallic via structure 82, a titanium diffusion barrier structure 83, a metal pad portion 89 and an upper metallic via structure 84. Each lower metallic via structure 82 comprises a lower metal nitride liner 822 and a lower metal fill portion 824, each metal pad portion 89 comprises a pad metal nitride liner 892 and a pad metal fill portion 894, and each upper metallic via structure 84 comprises an upper metal nitride liner 842 and an upper metal fill portion 844. In one embodiment, the composite contact via structures 782 can have lateral protrusions at the level of the titanium diffusion barrier structures 83. Specifically, a titanium diffusion barrier structure 83 can have a greater horizontal cross-sectional area than the horizontal cross-sectional area of an underlying lower metallic via structure 82. Further, the titanium diffusion barrier structure 83 can have a greater horizontal cross-sectional area than the horizontal cross-sectional area of an overlying upper metallic via structure 84. The combination of the silicon nitride diffusion barrier layer 674 and the titanium diffusion barrier structures 83 can provide a continuous hydrogen diffusion barrier structure without any opening therethrough, thereby functioning as an effective hydrogen diffusion barrier structure between structures overlying the silicon nitride diffusion barrier layer 674 and structures underlying the silicon nitride diffusion barrier layer 674.

Figure 28:
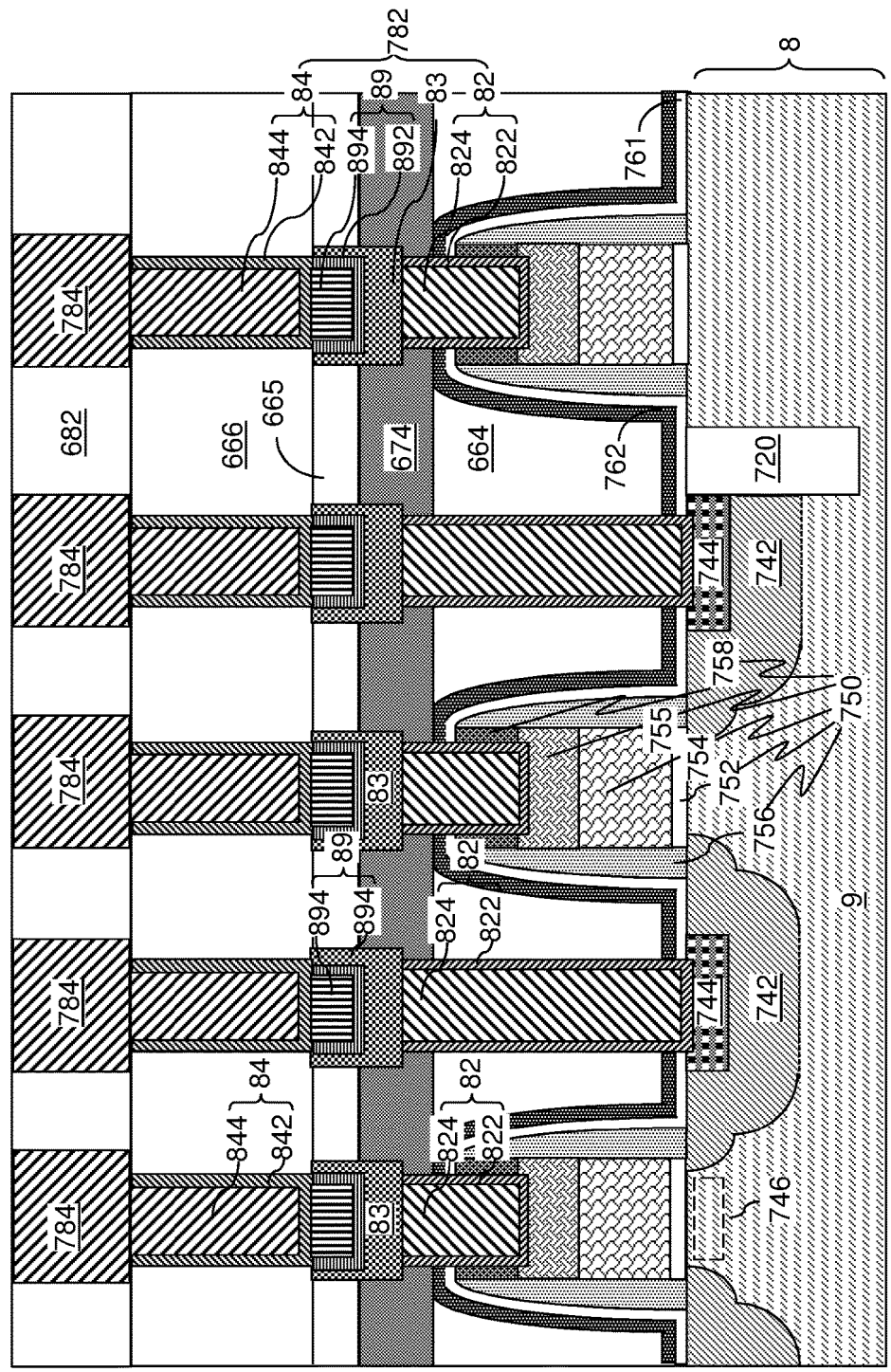
FIG. 28 is a vertical cross-sectional view of the fourth configuration of the first exemplary structure after formation of a line level dielectric layer and a metal interconnect lines according to an embodiment of the present disclosure.

Referring to FIG. 28, a line level dielectric layer 682 can be formed over the via level dielectric layer 666. The line level dielectric layer 682 includes a dielectric material such as silicon oxide. Metal interconnect lines, which are referred to as first level lower line structures 784, can be formed through the line level dielectric liner 682 on a respective one of the composite contact via structures 782.

Figure 29:
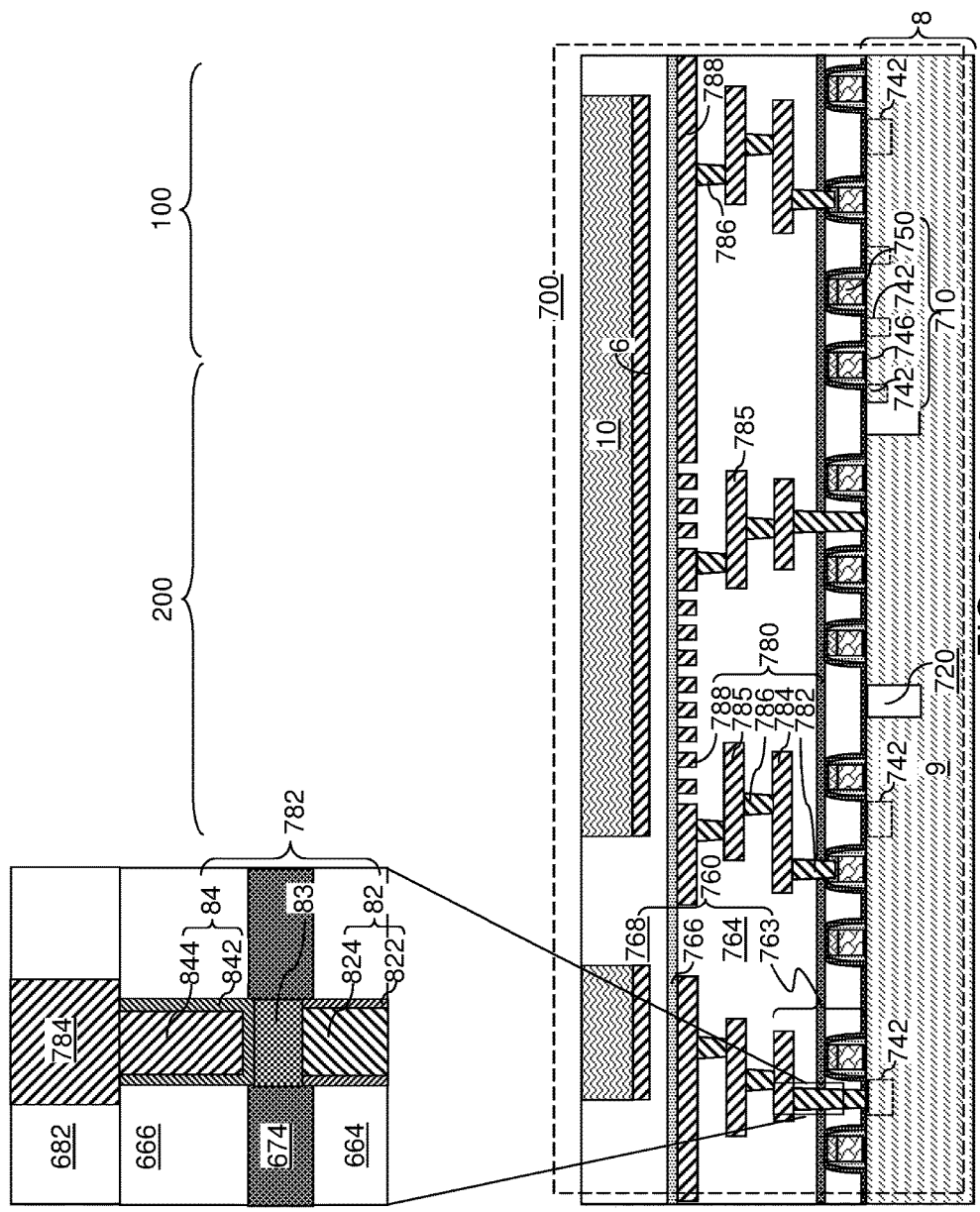
FIG. 29 is a vertical cross-sectional view of the first exemplary structure after formation of additional lower level dielectric material layers, additional lower level metal interconnect structures, an optional planar conductive material layer, and a planar semiconductor material layer according to an embodiment of the present disclosure.

In the structures of the first, second, third and fourth embodiments illustrated in respective FIG. 6, 16, 22, or 28, the set of all dielectric material layers including the silicon oxide liner 761, the silicon nitride liner 762, the planarization dielectric layer 664, the silicon nitride diffusion barrier layer 674, the optional intermediate dielectric material layer 655, the via level dielectric layer 666, the line level dielectric layer 682 is herein referred to as proximal dielectric layers 763. Referring to FIG. 29, additional lower level dielectric material layers (764, 766, 768) and additional lower metal interconnect structures (784, 786, 785, 788) can be subsequently formed on any embodiment of the first exemplary structure illustrated in FIG. 6, 16, 22, or 28. The additional lower dielectric material layers (764, 766, 768) include first dielectric material layers 764, an etch stop silicon nitride layer 766, and at least one second dielectric layer 768 that overlies the etch stop silicon nitride layer 766. The set of the proximal dielectric layers 763, the first dielectric material layers 764, the etch stop silicon nitride layer 766, and the at least one second dielectric layer 768 is herein referred to as lower level dielectric layers 760.

The dielectric layer stack including the lower level dielectric layers 760 functions as a matrix for lower metal interconnect structures 780 that provide electrical wiring among the various nodes of the semiconductor devices and landing pads for through-memory-level contact via structures to be subsequently formed. The lower metal interconnect structures 780 are embedded within the dielectric layer stack of the lower level dielectric layers 760.

Various elements of the lower metal interconnect structures 780 are embedded within the first dielectric material layers 764. The lower metal interconnect structures 780 include the composite contact via structures 782, the first level lower line structures 784, lower metal via structures 786, optional intermediate level lower line structures 785, and topmost lower metal line structures 788 that are configured to function as landing pads for through-memory-level contact via structures to be subsequently formed. In this case, the first dielectric material layers 764 may be formed level by level while incorporating components of the lower metal interconnect structures 780 within each respective level. For example, single damascene processes may be employed to form the lower metal interconnect structures 780, and each level of the lower metal via structures 786 may be embedded within a respective via level dielectric material layer and each level of the lower level metal line structures (784, 785, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the first dielectric material layers 764 (which can be a plurality of dielectric material layers). Each of the lower metal interconnect structures 780 may, or may not, include a metallic nitride liner and a metal fill portion. Each metallic nitride liner can include a conductive metallic nitride material such as TiN, TaN, and/or WN. Each metal fill portion can include an elemental metal (such as Cu, W, Al, Co, Ru) or an intermetallic alloy of at least two metals. Top surfaces of the topmost lower metal line structures 788 and the topmost surface of the first dielectric material layers 764 may be planarized by a planarization process, such as chemical mechanical planarization. In this case, the top surfaces of the topmost lower metal line structures 788 and the topmost surface of the first dielectric material layers 764 may be within a horizontal plane that is parallel to the top surface of the substrate 8.

The etch stop silicon nitride layer 766 can be formed directly on the top surfaces of the topmost lower metal line structures 788 and the topmost surface of the first dielectric material layers 764. Alternatively, a portion of the first dielectric material layers 764 can be located on the top surfaces of the topmost lower metal line structures 788 below the etch stop silicon nitride layer 766. In one embodiment, the etch stop silicon nitride layer 766 is a substantially stoichiometric silicon nitride layer which has a composition of $Si_3N_4$.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal (e.g., tungsten), a metal compound (e.g., TiN or metal silicide, such as tungsten silicide), or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. In one embodiment, the planar conductive material layer 6 may function as a source line in the completed memory device. Alternatively or additionally, the planar conductive material layer 6 may comprise an etch stop layer and may comprise any suitable conductive, semiconducting, or insulating layer.

The planar semiconductor material layer 10 can include horizontal semiconductor channels and/or source regions for a three-dimensional array of memory devices to be subsequently formed. The thickness of the optional planar conductive material layer 6 may be in a range from 5 nm to 100 nm, although lesser and greater thicknesses can also be employed. The thickness of the planar semiconductor material layer 10 may be in a range from 30 nm to 300 nm, although lesser and greater thicknesses can also be employed.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon or polycrystalline silicon germanium alloy), or an amorphous semiconductor material (such as amorphous silicon or silicon germanium alloy) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate semiconductor layer 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-memory-level contact via structures and through-dielectric contact via structures are to be subsequently formed. In one embodiment, the openings in the optional planar conductive material layer 6 and the planar semiconductor material layer 10 can be formed within the area of a memory array region 100, in which a three-dimensional memory array including memory stack structures is to be subsequently formed. Further, additional openings in the optional planar conductive material layer 6 and the planar semiconductor material layer 10 can be formed within the area of a contact region 200 in which contact via structures contacting word line electrically conductive layers are to be subsequently formed.

The region of the semiconductor devices and the combination of the lower level dielectric layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are embedded in the lower level dielectric layers 760.

In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-memory-level contact via structures to be subsequently formed.

Figure 30:
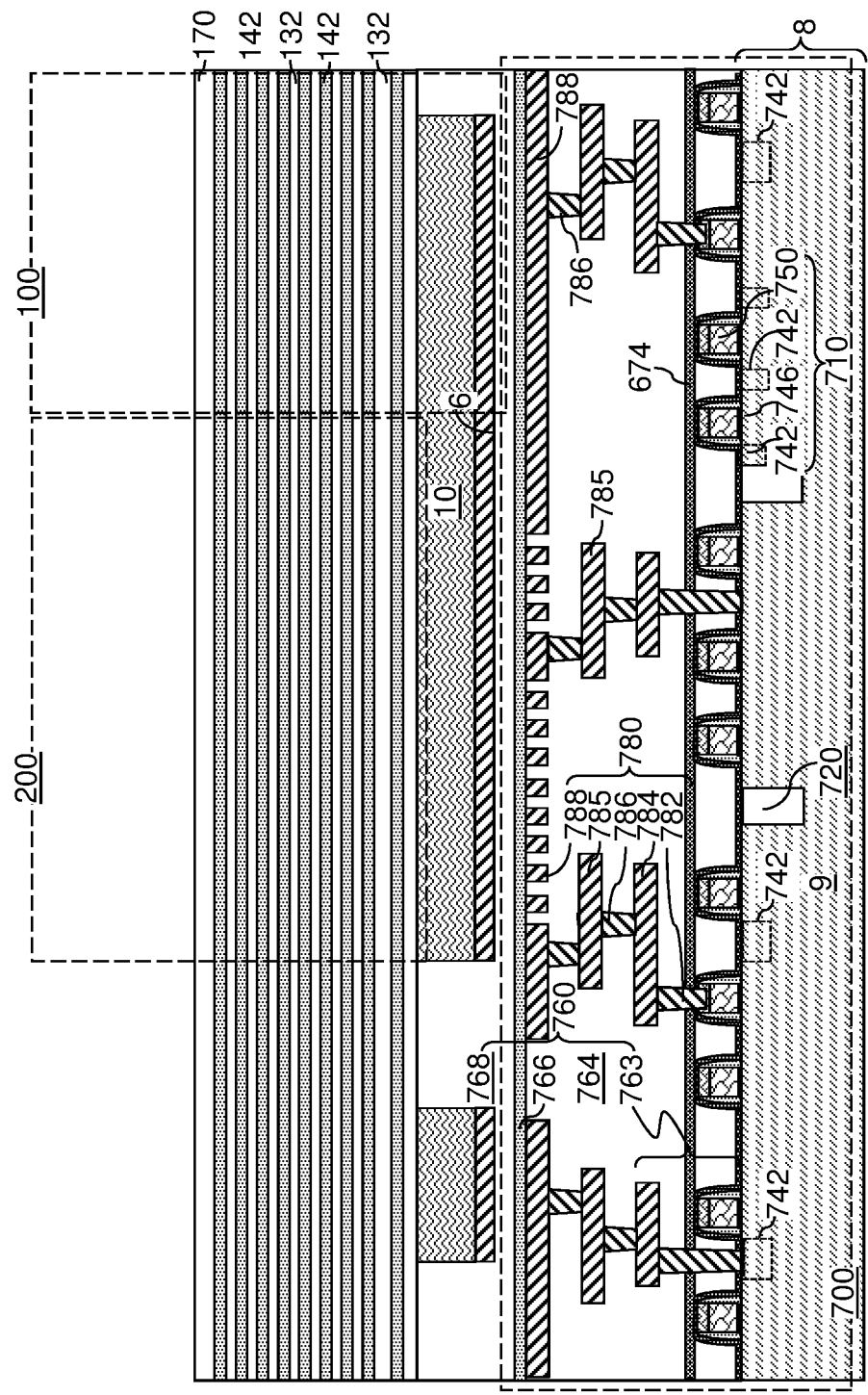
FIG. 30 is a vertical cross-sectional view of the first exemplary structure after formation of a first-tier alternating stack of first insulting layers and first spacer material layers according to an embodiment of the present disclosure.

Referring to FIG. 30, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 31:
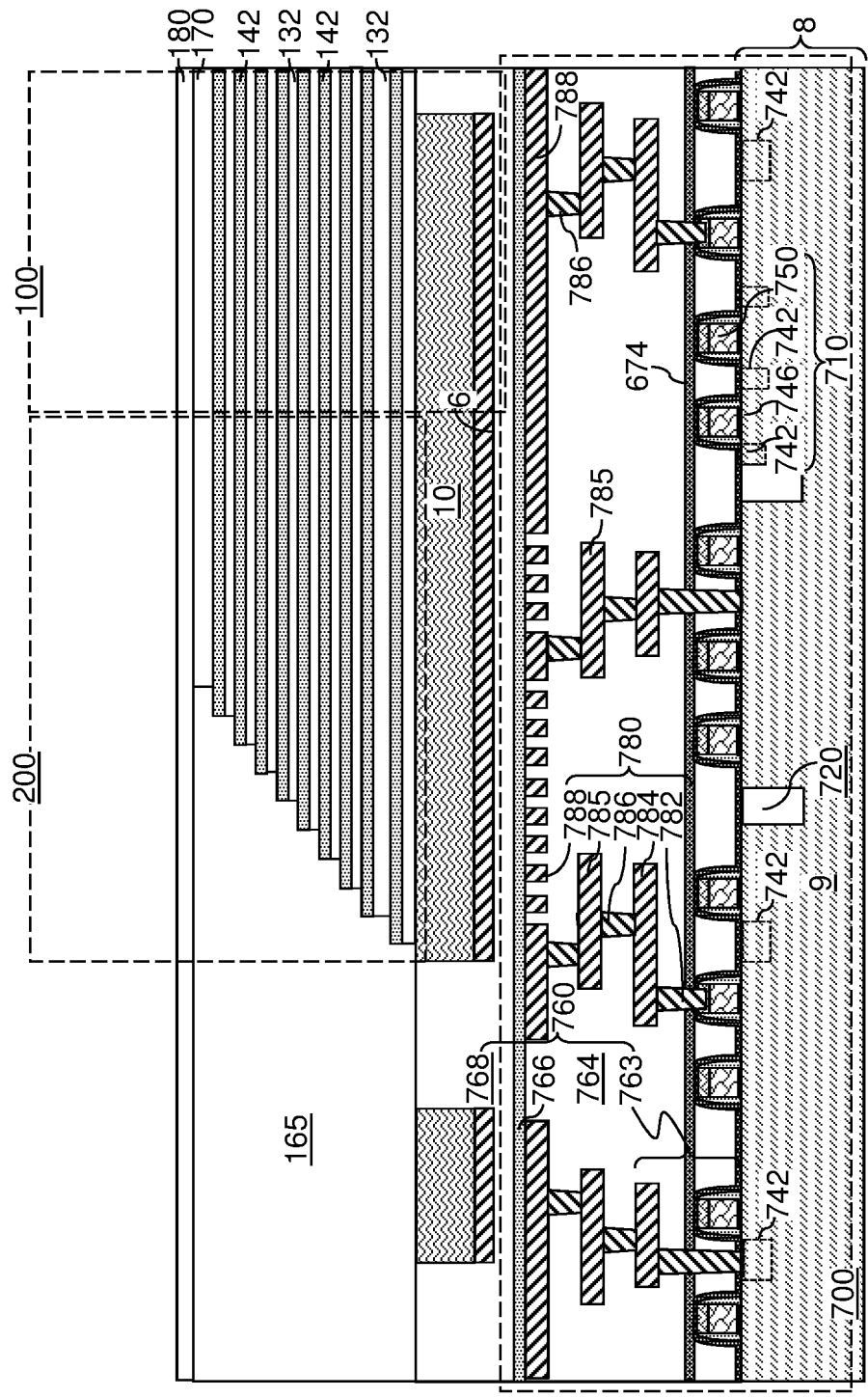
FIG. 31 is a vertical cross-sectional view of the first exemplary structure after patterning first-tier staircase regions on the first-tier alternating stack and forming a first-tier retro-stepped dielectric material portion according to an embodiment of the present disclosure.

Referring to FIG. 31, the first insulating cap layer 170 and the first-tier alternating stack (132, 142) can be patterned to form first stepped surfaces in the word line contact via region 200. The word line contact via region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first-tier structure, which is an in-process structure that is subsequently modified. The first-tier retro-stepped dielectric material portion 165 is a memory level dielectric material portion, i.e., a dielectric material portion formed at memory levels at which memory cells are to be subsequently formed, and is formed over the planar semiconductor material layer 10 at levels of the first-tier alternating stack (132, 142).

Figure 32A:
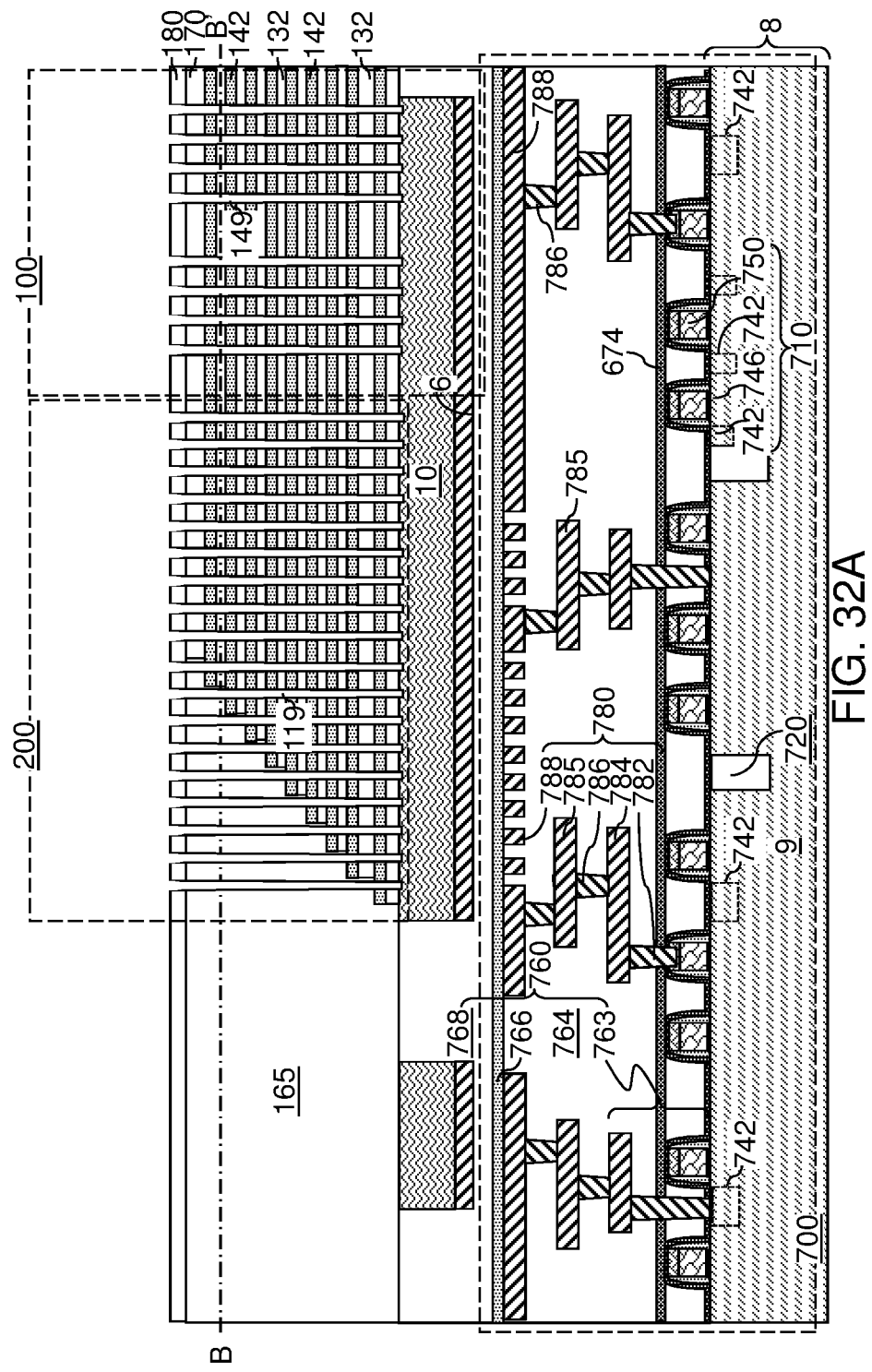
FIG. 32A is a vertical cross-sectional view of the first exemplary structure after formation of first-tier memory openings and first tier support openings according to an embodiment of the present disclosure.
Figure 32B:
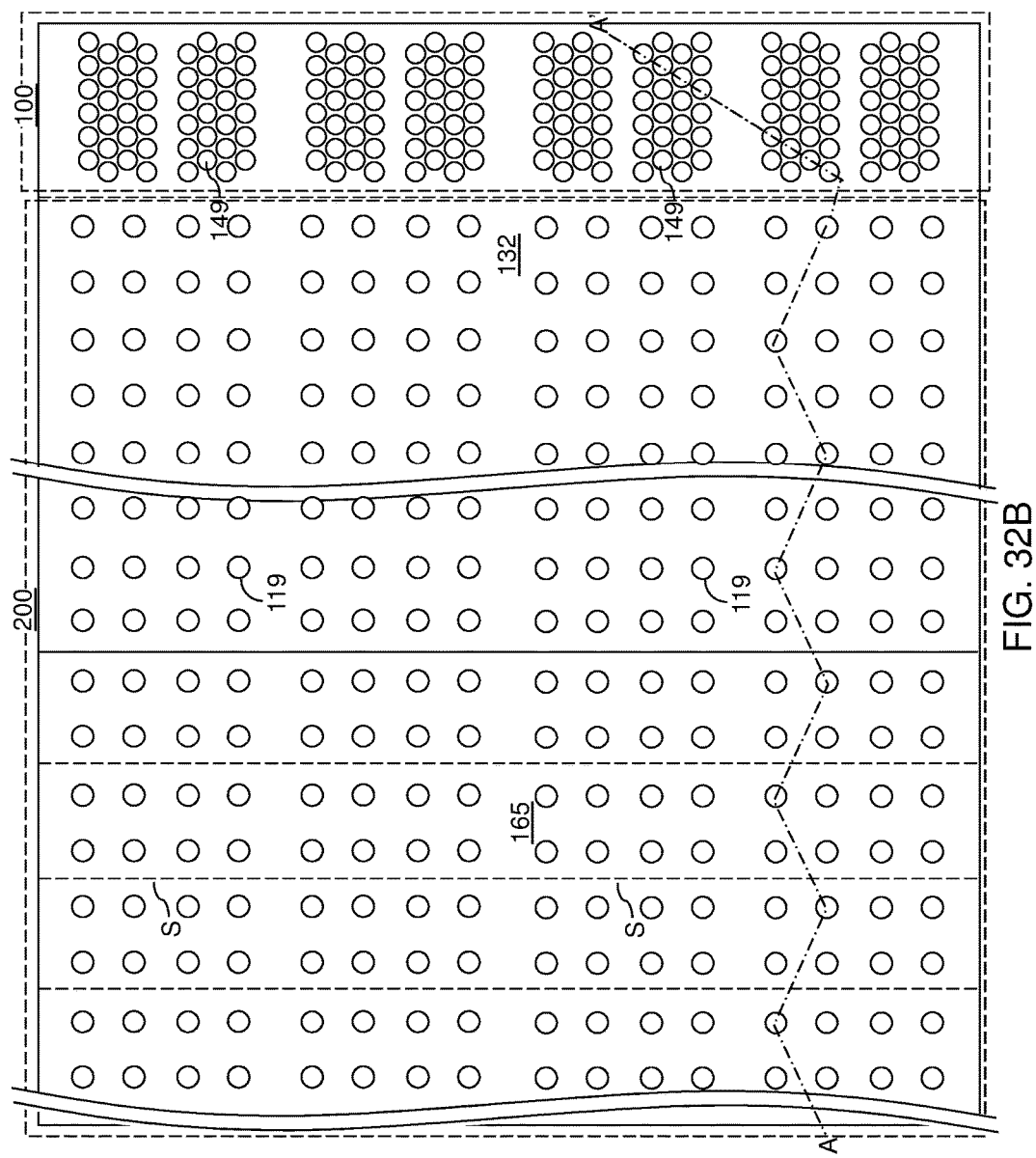
FIG. 32B is a horizontal cross-sectional view of the first exemplary structure along the horizontal plane B-B' in FIG. 12A. The zig-zag vertical plane A-A' corresponds to the plane of the vertical cross-sectional view of FIG. 32A.

Referring to FIGS. 32A and 32B, an inter-tier dielectric layer 180 may be optionally deposited over the first-tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed. Locations of steps S in the first-tier alternating stack (132, 142) are illustrated as dotted lines.

First-tier memory openings 149 and first tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line contact via region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first-tier alternating stack (132, 142) forms the first-tier memory openings 149 and the first-tier support openings 119.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the support openings 119 can be substantially vertical, or can be tapered. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier support openings 119) located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 33:
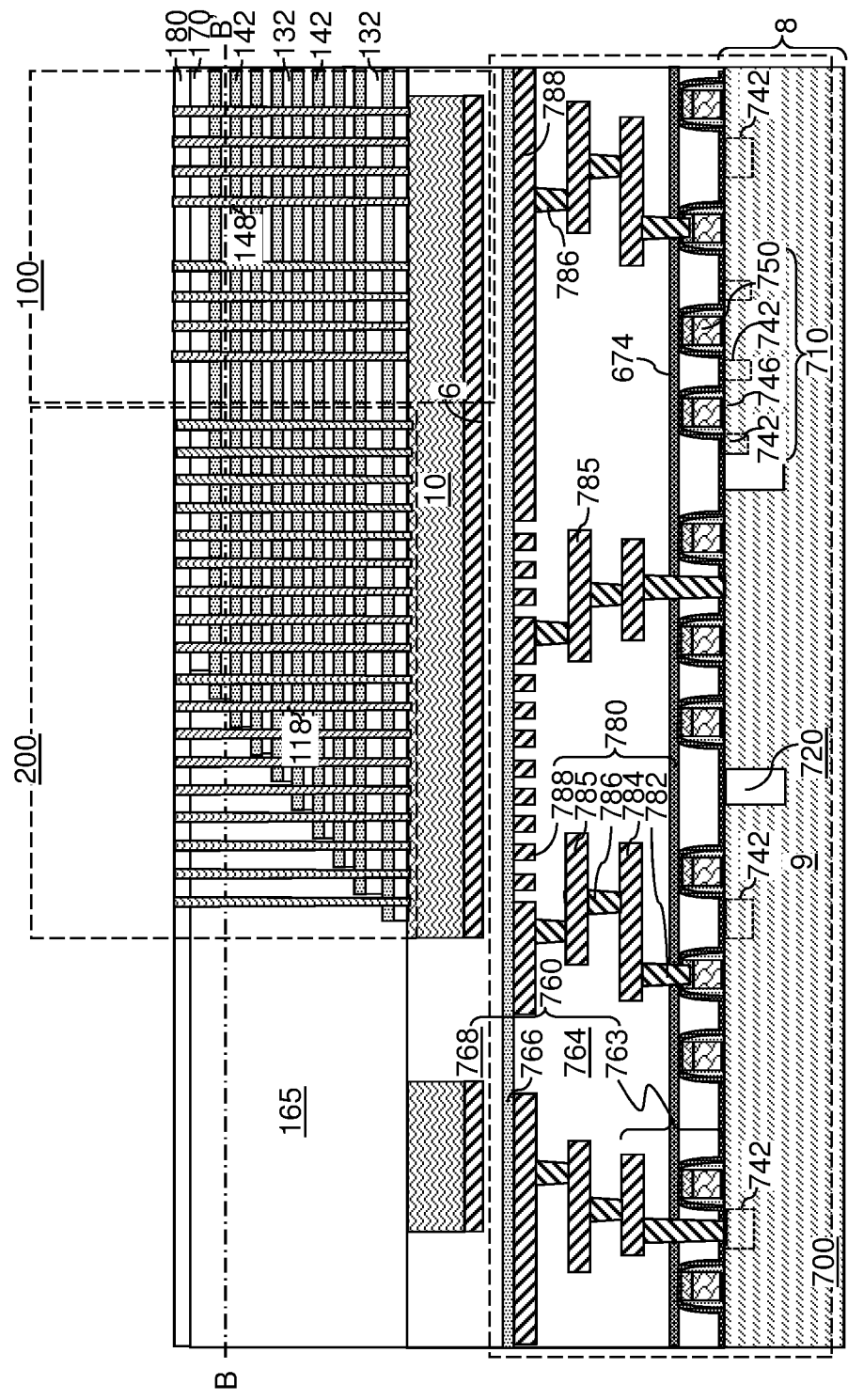
FIG. 33 is a vertical cross-sectional view of the first exemplary structure after formation of sacrificial memory opening fill portions and sacrificial support opening fill portions according to an embodiment of the present disclosure.

Referring to FIG. 33, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulator layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 118 may, or may not, include cavities therein.

Figure 34:
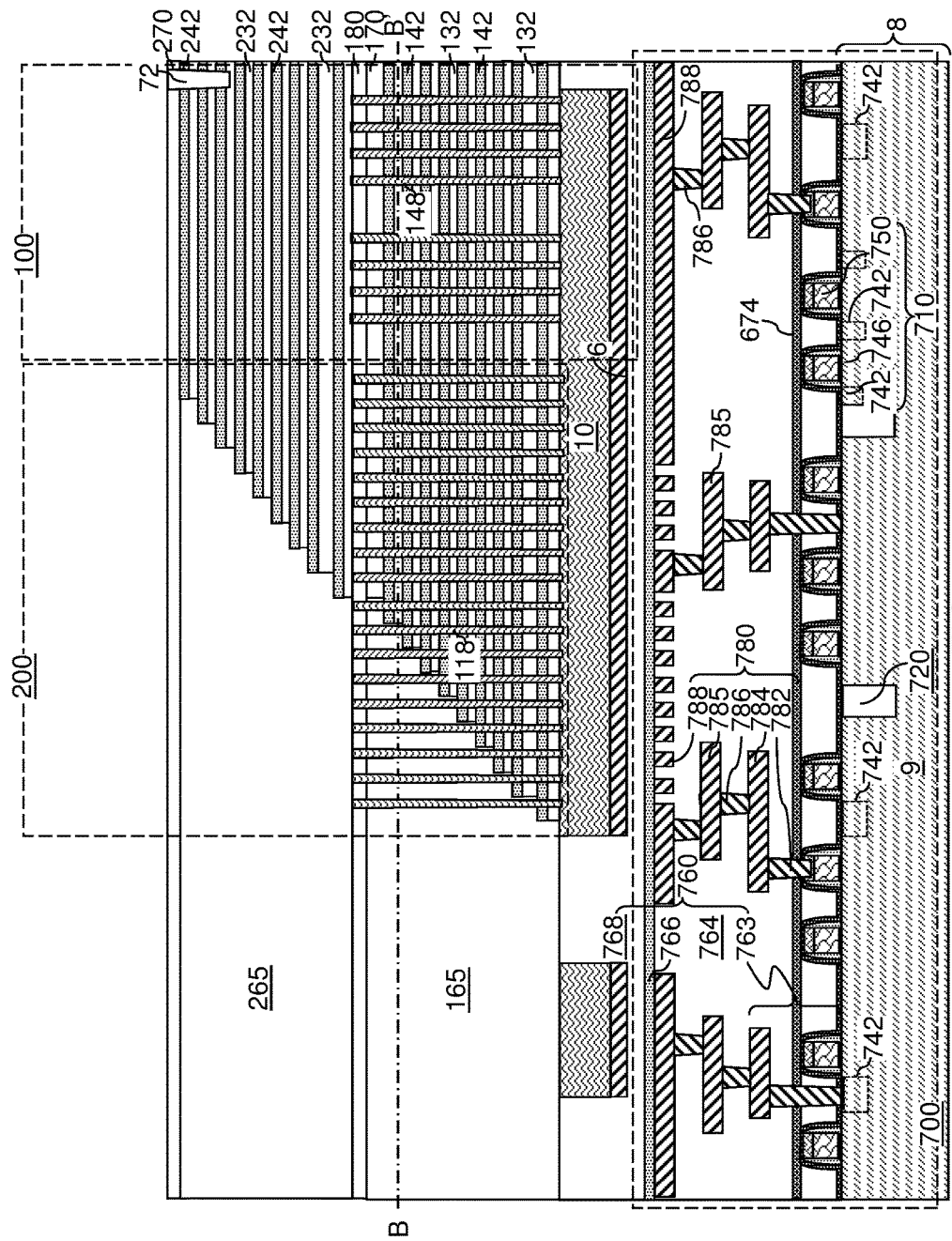
FIG. 34 is a vertical cross-sectional view of the first exemplary structure after formation of a second-tier alternating stack of second insulating layers and second spacer material layers, a second-tier retro-stepped dielectric material portion, and a second insulating cap layer according to an embodiment of the present disclosure.

Referring to FIG. 34, a second-tier structure can be formed over the first-tier structure (132, 142, 170, 148, 118). The second-tier structure can include an additional alternating stack of insulating layers and spacer material layers, which can be sacrificial material layers. For example, a second-tier alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the word line contact via region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line contact via region 200. The second-tier retro-stepped dielectric material portion 265 is a memory level dielectric material portion, i.e., a dielectric material portion formed at memory levels at which memory cells are to be subsequently formed, and is formed over the planar semiconductor material layer 10 at levels of the second-tier alternating stack (232, 242).

A second insulating cap layer 270 can be subsequently formed over the second-tier alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the drain-select-level shallow trench isolation structures 72 correspond to the levels in which drain-select-level electrically conductive layers are subsequently formed. The drain-select-level shallow trench isolation structures 72 include a dielectric material such as silicon oxide.

Figure 35A:
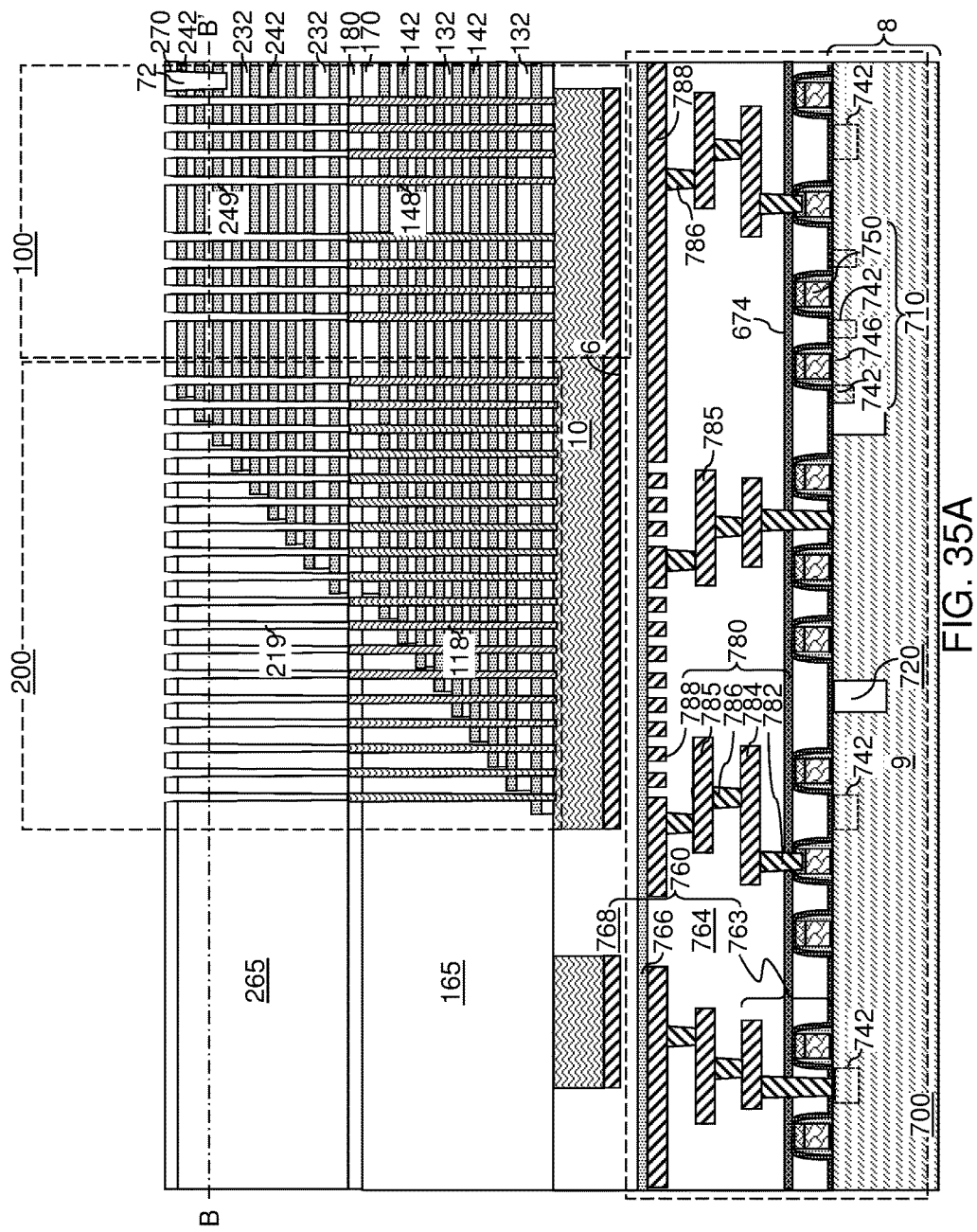
FIG. 35A is a vertical cross-sectional view of the first exemplary structure after formation of inter-tier memory openings and inter-tier support openings according to an embodiment of the present disclosure.
Figure 35B:
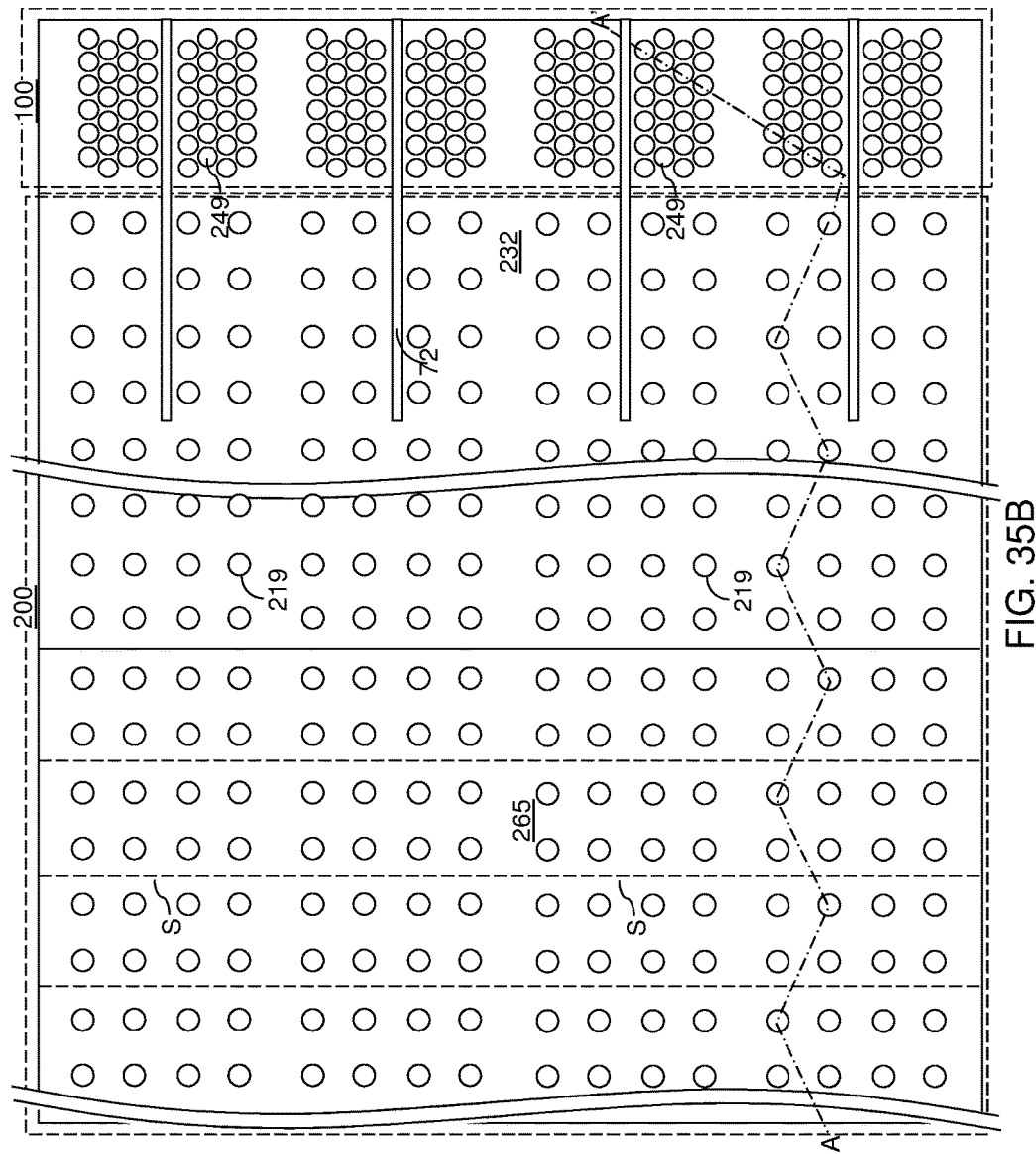
FIG. 35B is a horizontal cross-sectional view of the first exemplary structure along the horizontal plane B-B' in FIG. 35A. The zig-zag vertical plane A-A' corresponds to the plane of the vertical cross-sectional view of FIG. 35A.

Referring to FIGS. 35A and 35B, second-tier memory openings 249 and second-tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142) (e.g., $C_4F_8/O_2$/Ar etch and/or a wet etch).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines.

Figure 36:
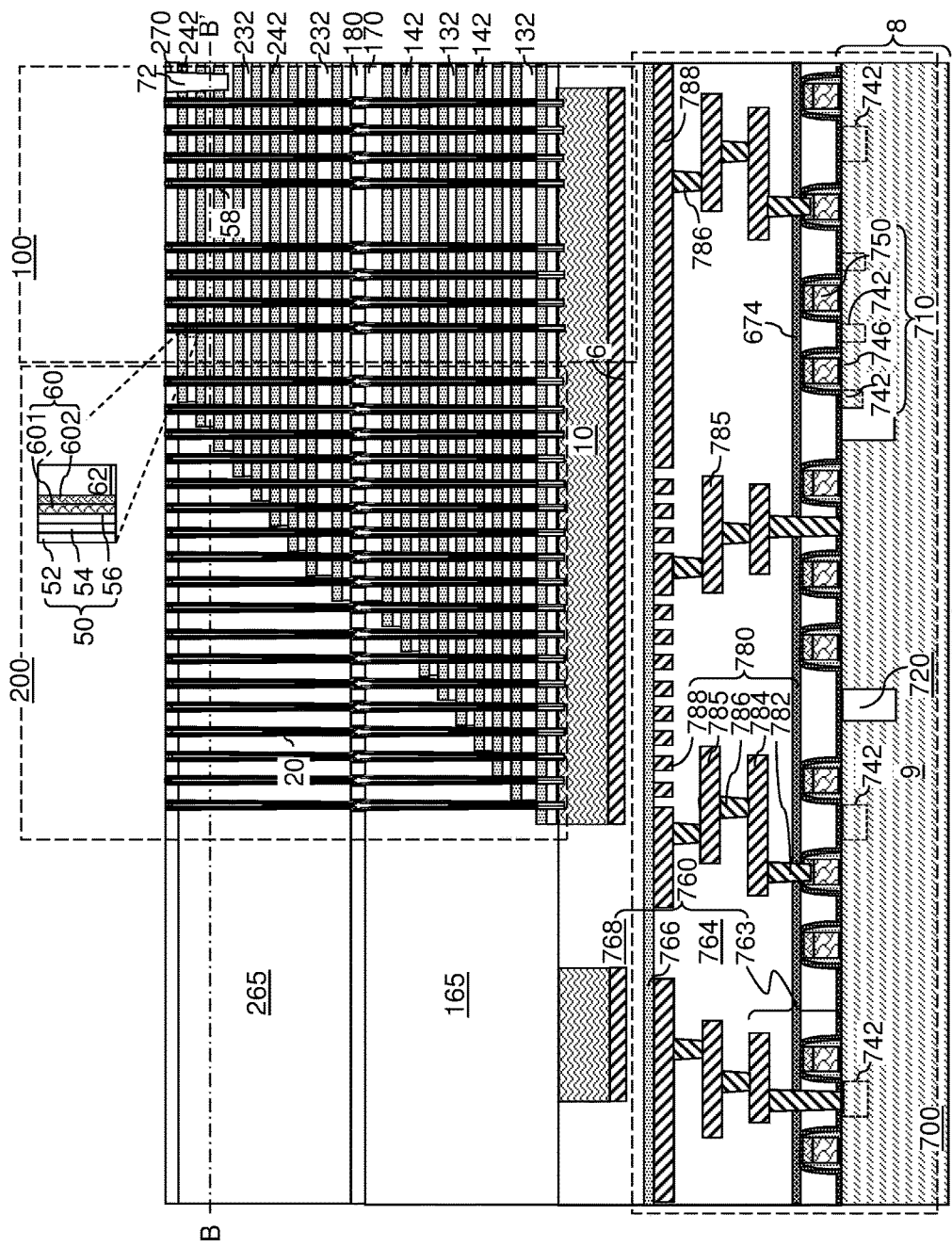
FIG. 36 is a vertical cross-sectional view of the first exemplary structure after formation of memory stack structures according to an embodiment of the present disclosure.

Referring to FIG. 36, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 37A-37H provide sequential cross-sectional views of a memory opening 49 or a support opening (119, 219) during formation of a memory opening fill structure 58 or a support pillar structure 20. While a structural change in a memory opening 49 is illustrated in FIGS. 37A-37H, it is understood that the same structural change occurs in each memory openings 49 and in each of the support openings (119, 219) during the same set of processing steps.

Referring to FIG. 37A, a memory opening 49 in the exemplary device structure of FIG. 14 is illustrated. The memory opening 49 extends through the first-tier structure and the second-tier structure. Likewise, each support opening (119, 219) extends through the first-tier structure and the second-tier structure.

Referring to FIG. 37B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 142 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Figure 37D:
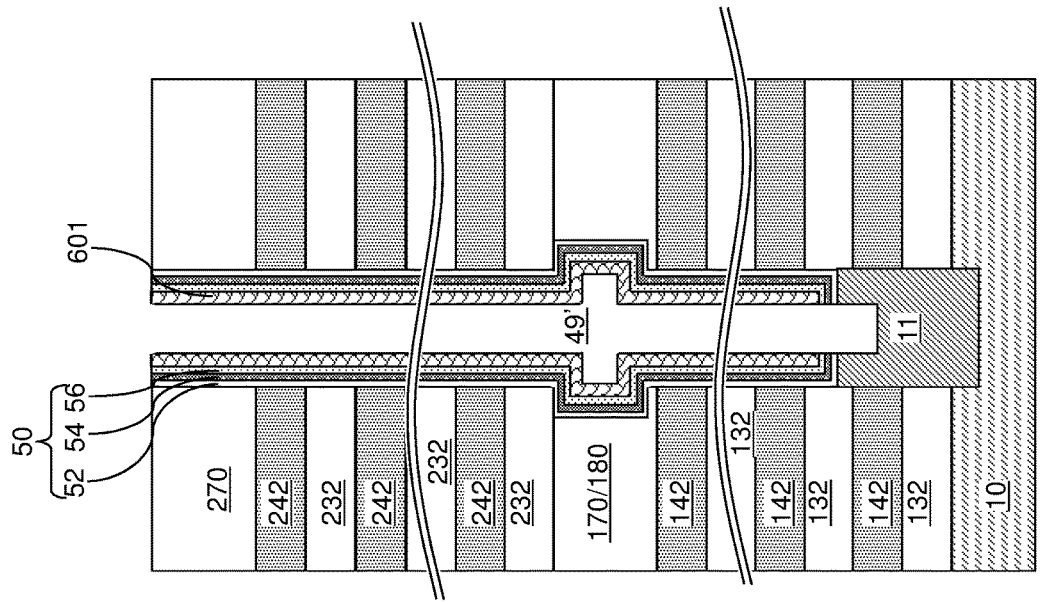
Figure 37C:
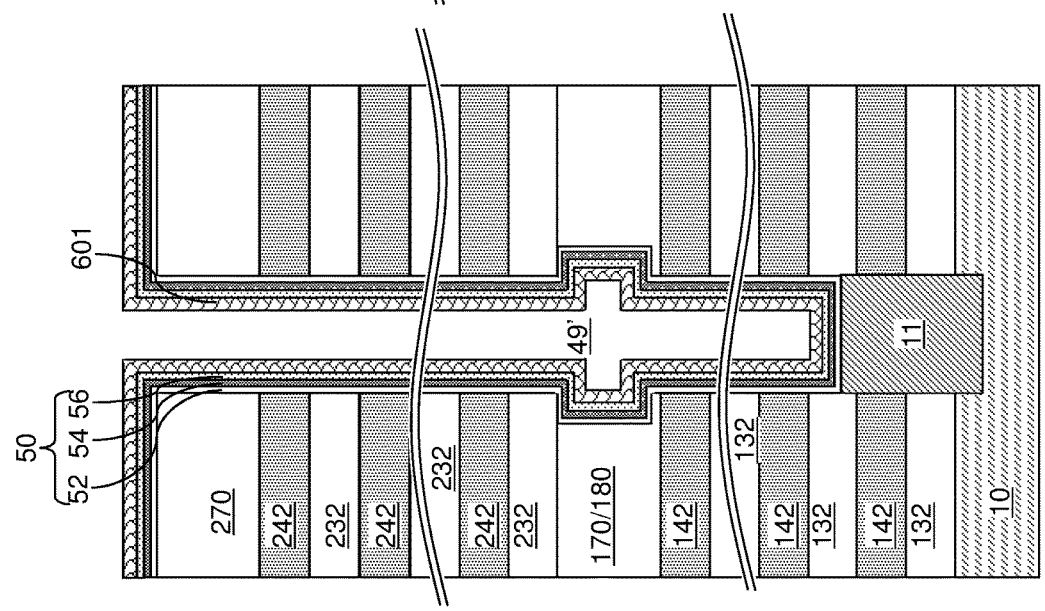

Referring to FIG. 37C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of a homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 37D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 37E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602. In another embodiment, the first semiconductor channel layer 601 can be removed entirely prior to deposition of the second semiconductor channel layer 602. In this case, the semiconductor channel material includes only the second semiconductor channel layer 602.

Referring to FIG. 37F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 37H:
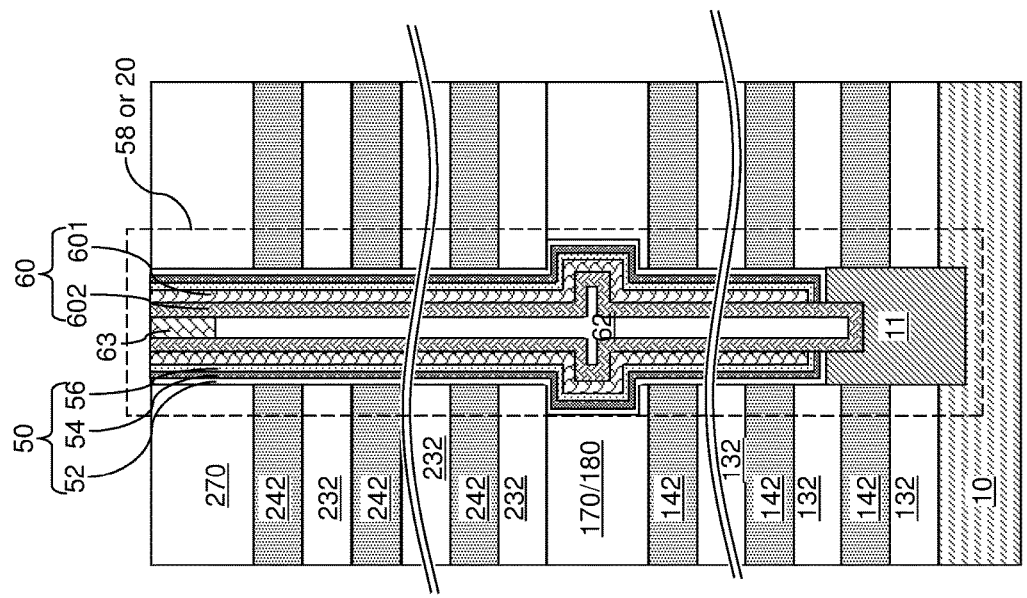
Figure 37G:
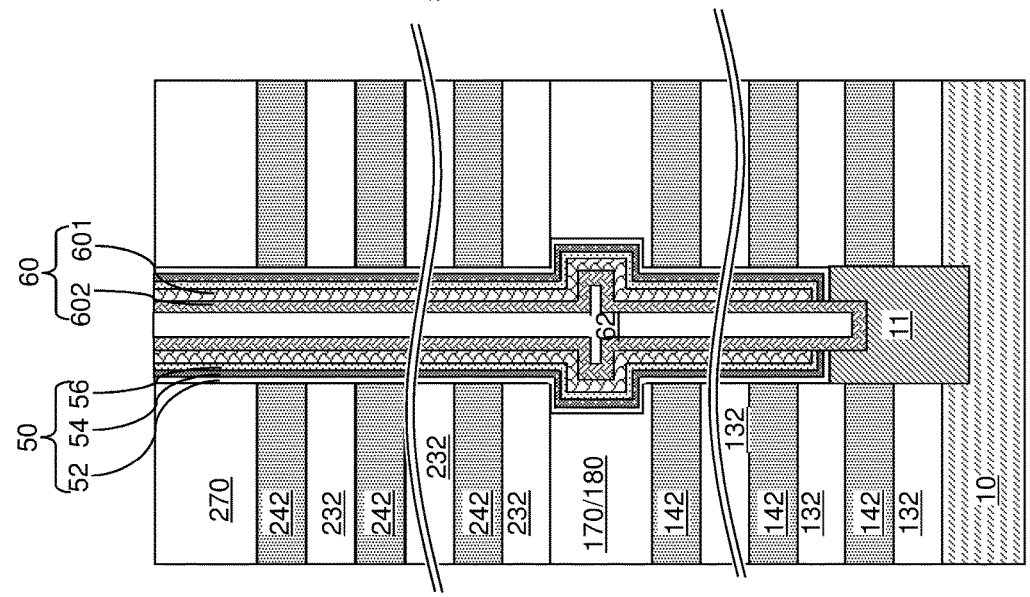

Referring to FIG. 37G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 37H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first-tier structure (132, 142, 170, 165), the second-tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 38A:
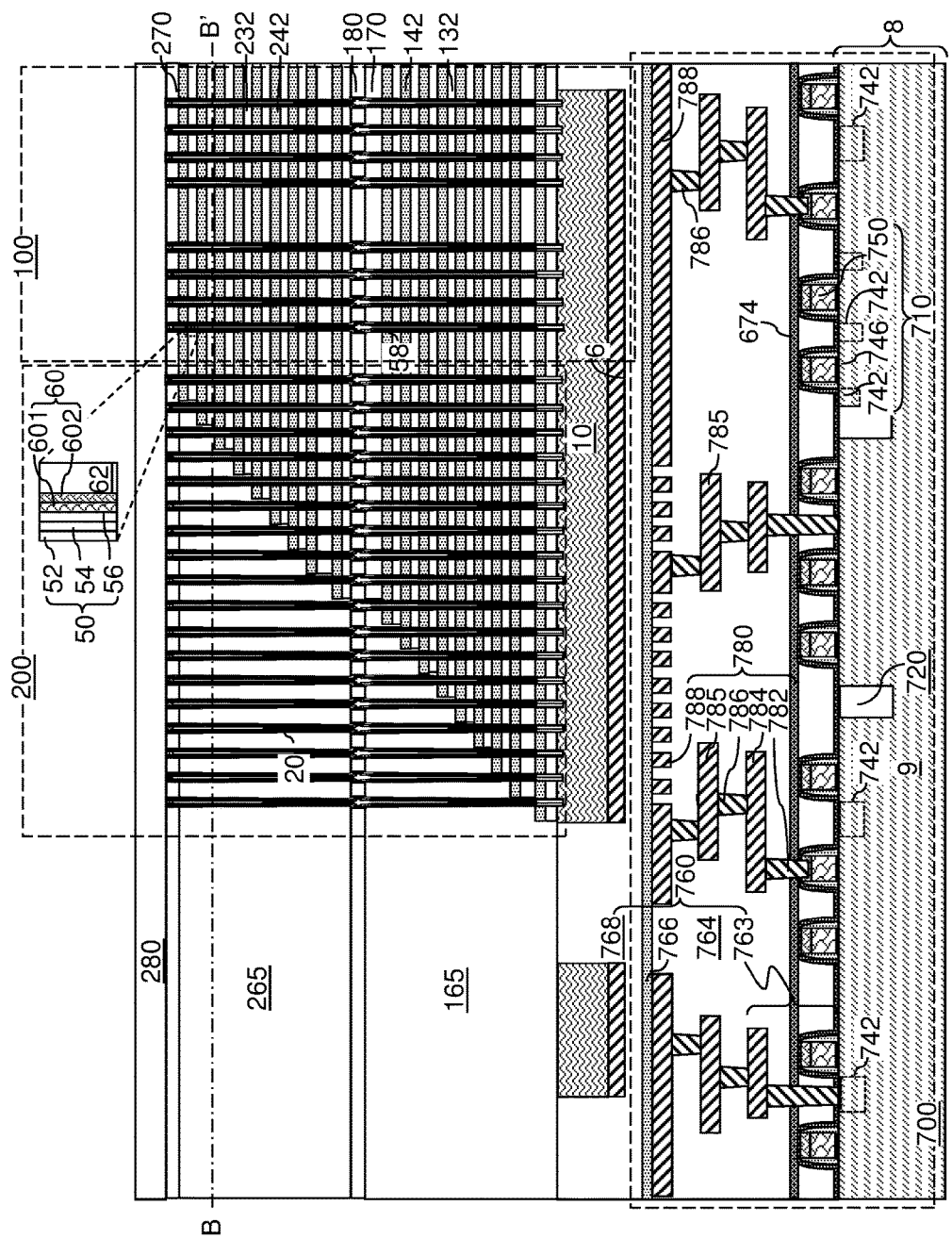
FIG. 38A is a vertical cross-sectional view of the first exemplary structure after formation of first through-memory-level via cavities according to an embodiment of the present disclosure.

Referring to FIGS. 38A and 38B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Figure 39A:
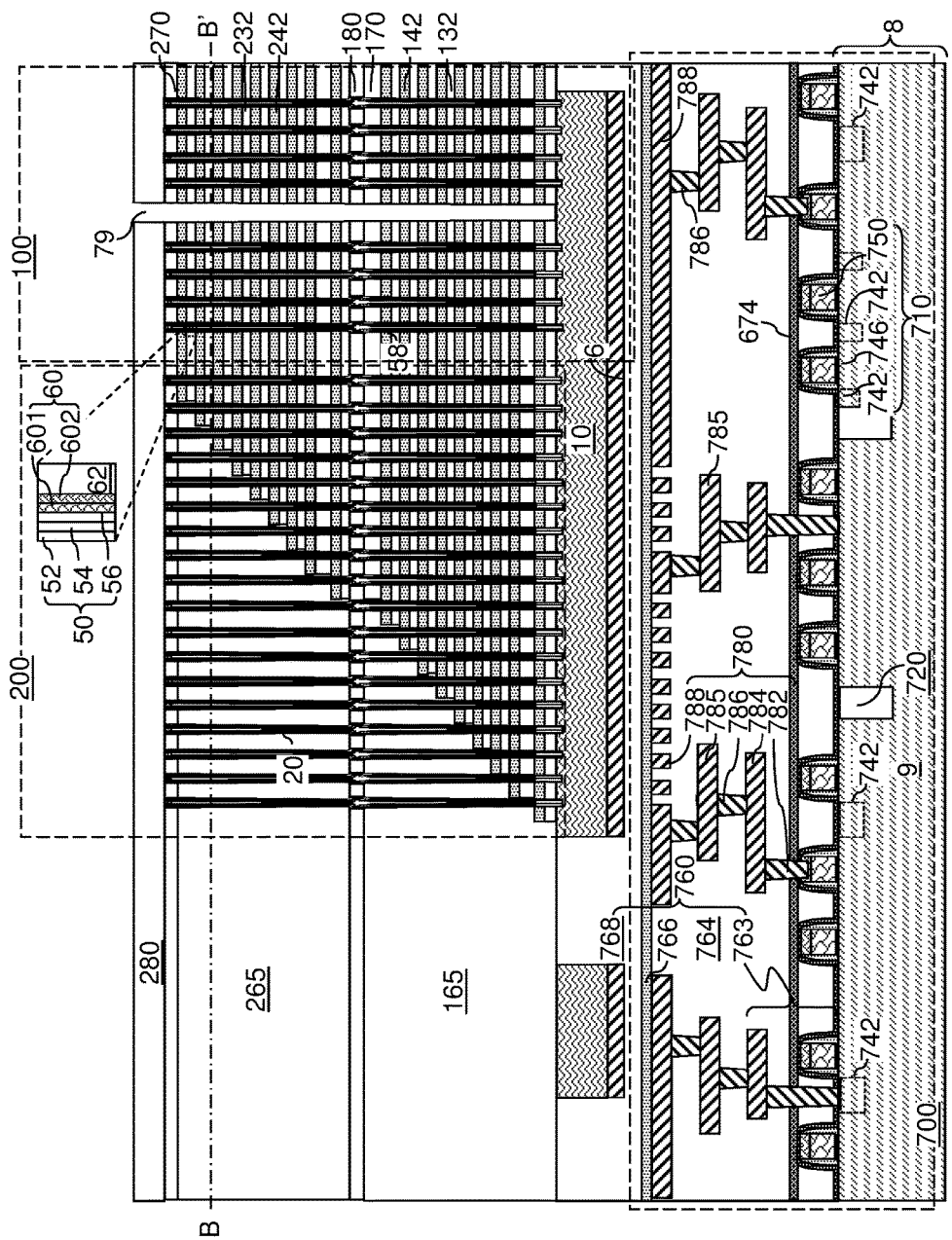
FIG. 39A is a vertical cross-sectional view of the first exemplary structure after formation of backside contact trenches according to an embodiment of the present disclosure.
Figure 39B:
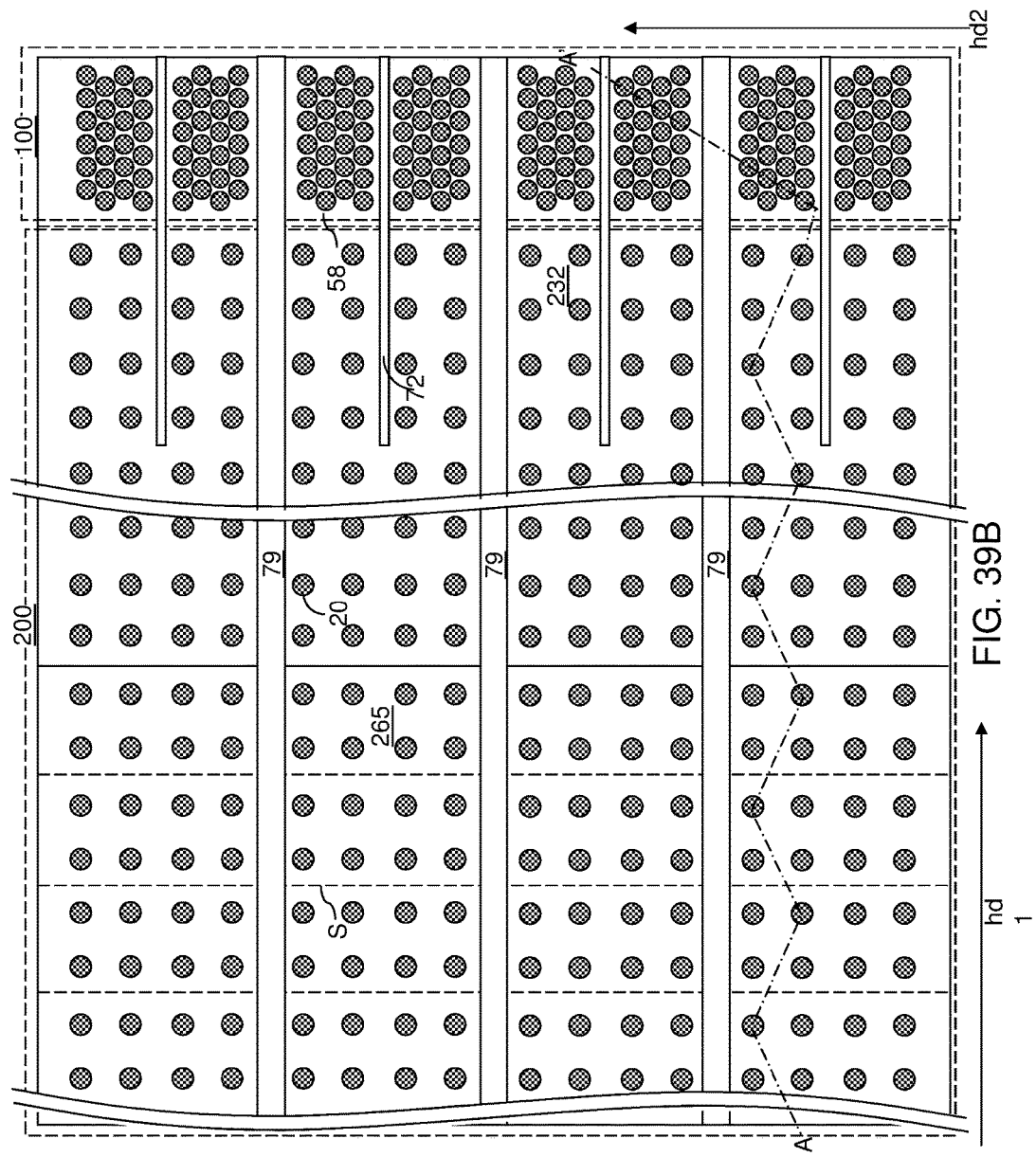
FIG. 39B is a horizontal cross-sectional view of the first exemplary structure along the horizontal plane B-B' in FIG. 39A. The zig-zag vertical plane A-A' corresponds to the plane of the vertical cross-sectional view of FIG. 39A.
Figure 40A:
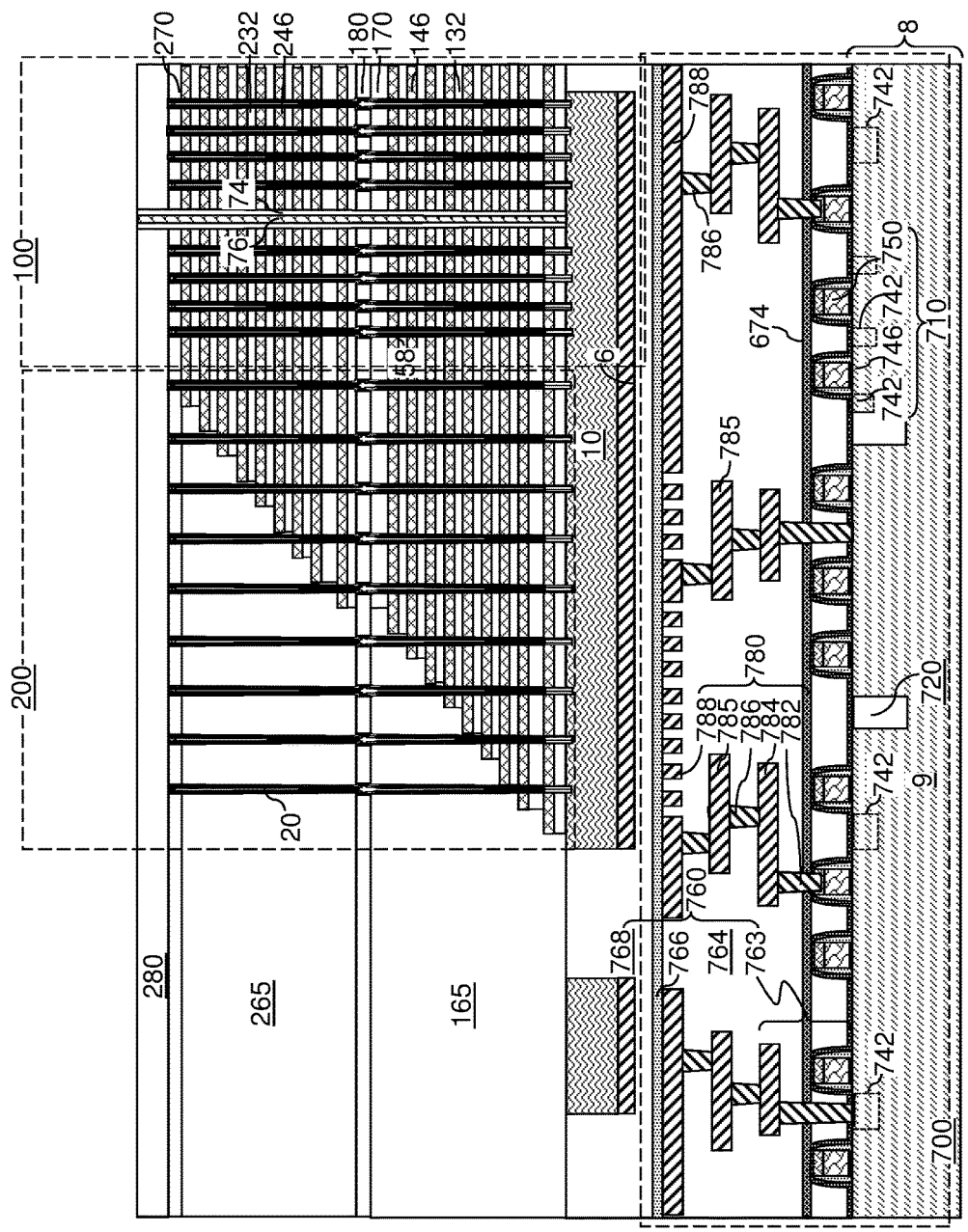
FIG. 40A is a vertical cross-sectional view of the first exemplary structure after replacement of sacrificial material layers with electrically conductive layers and formation of insulating spacers and backside contact via structures according to an embodiment of the present disclosure.
Figure 40B:
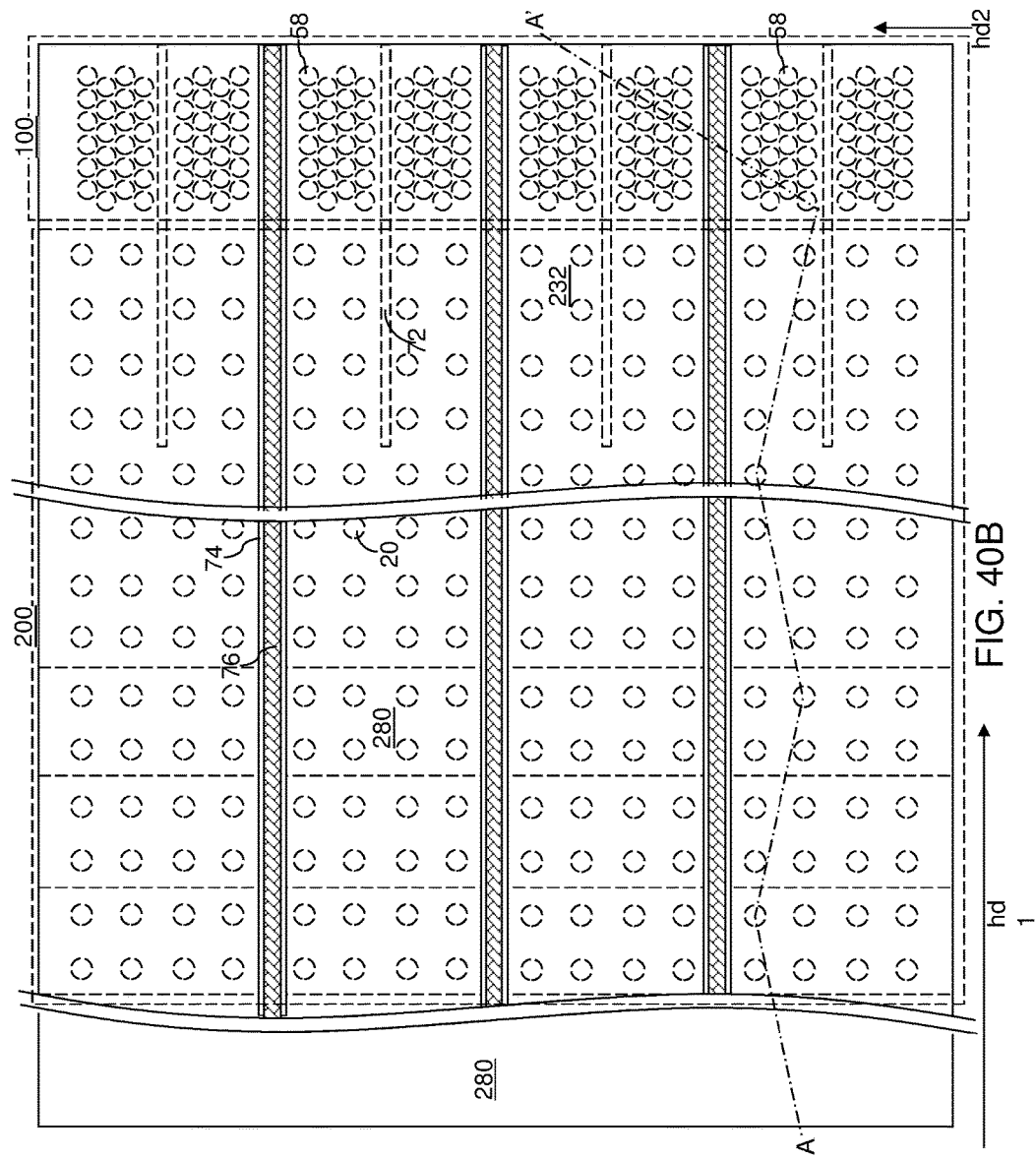
FIG. 40B is a horizontal cross-sectional view of the first exemplary structure along the horizontal plane B-B' in FIG. 40A. The zig-zag vertical plane A-A' corresponds to the plane of the vertical cross-sectional view of FIG. 40A.

Referring to FIGS. 39A and 39B, backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region (e.g., a memory plane) 100 and the word line contact via region 200. The first subset of the backside contact trenches 79 laterally divides the memory-level assembly (e.g., into memory blocks).

Referring to FIGS. 30A and 30B, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate semiconductor layer 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide portion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and are laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

Figure 41A:
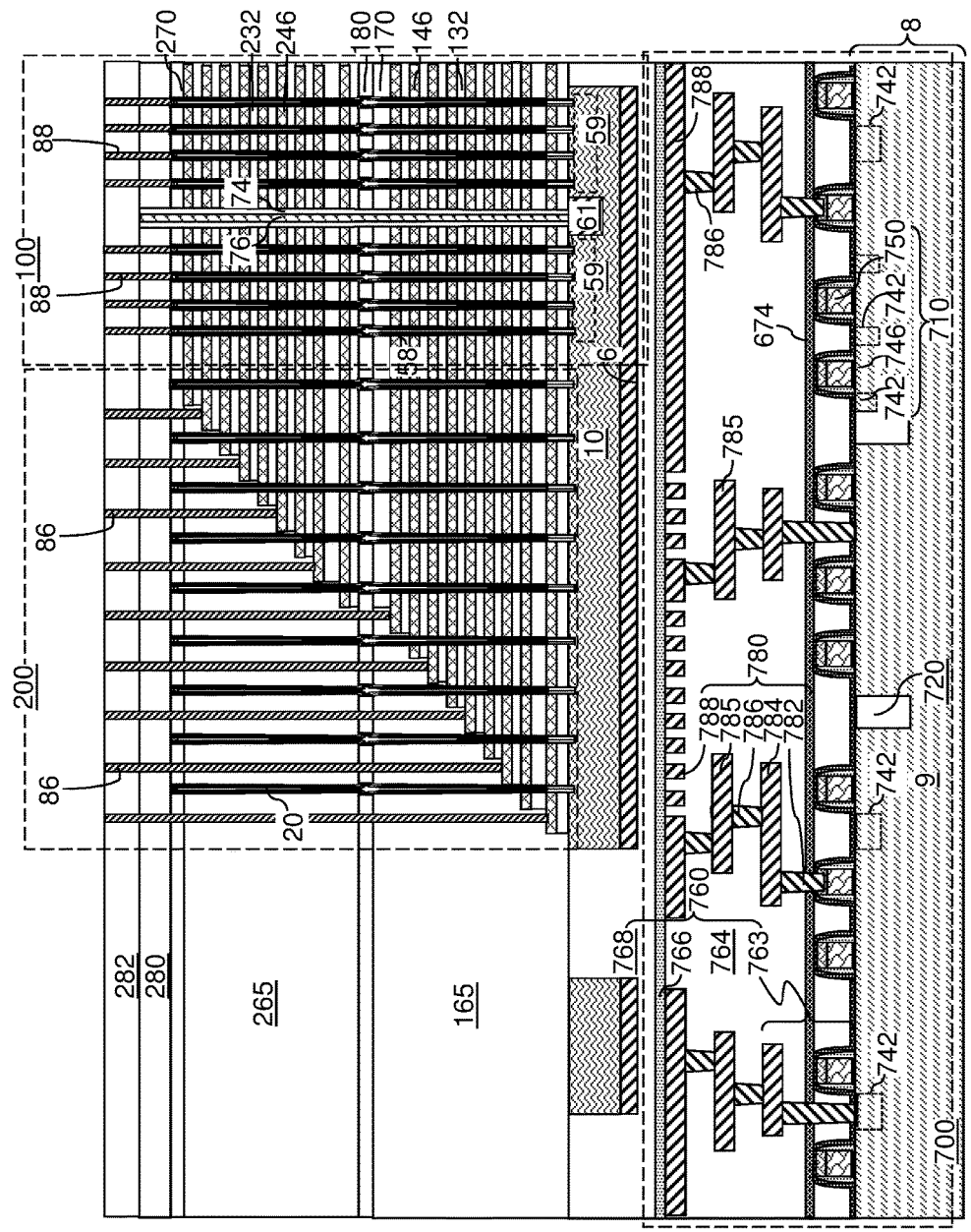
FIG. 41A is a vertical cross-sectional view of the first exemplary structure after formation of drain contact via structures and word line contact via structures according to an embodiment of the present disclosure.

Referring to FIGS. 41A and 41B, a second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

Drain contact via structures 88 contacting the drain regions 63 can extend through the contact level dielectric layers (280, 282) and the second insulating cap layer 270 in the memory array region 100. A source connection via structure 91 can extend through the contact level dielectric layers (280, 282) to provide electrical connection to the laterally-elongated contact via structures 76.

Various contact via structures can be formed through the contact level dielectric layers (280, 282) and the retro-stepped dielectric material portions (165, 265). For example, word line contact via structures 86 can be formed in the word line contact region 200. A subset of the word line contact via structures 86 contacting the second electrically conductive layers 246 extends through the second-tier retro-stepped dielectric material portion 265 in the word line contact region 200, but does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line contact region 200.

Figure 42:
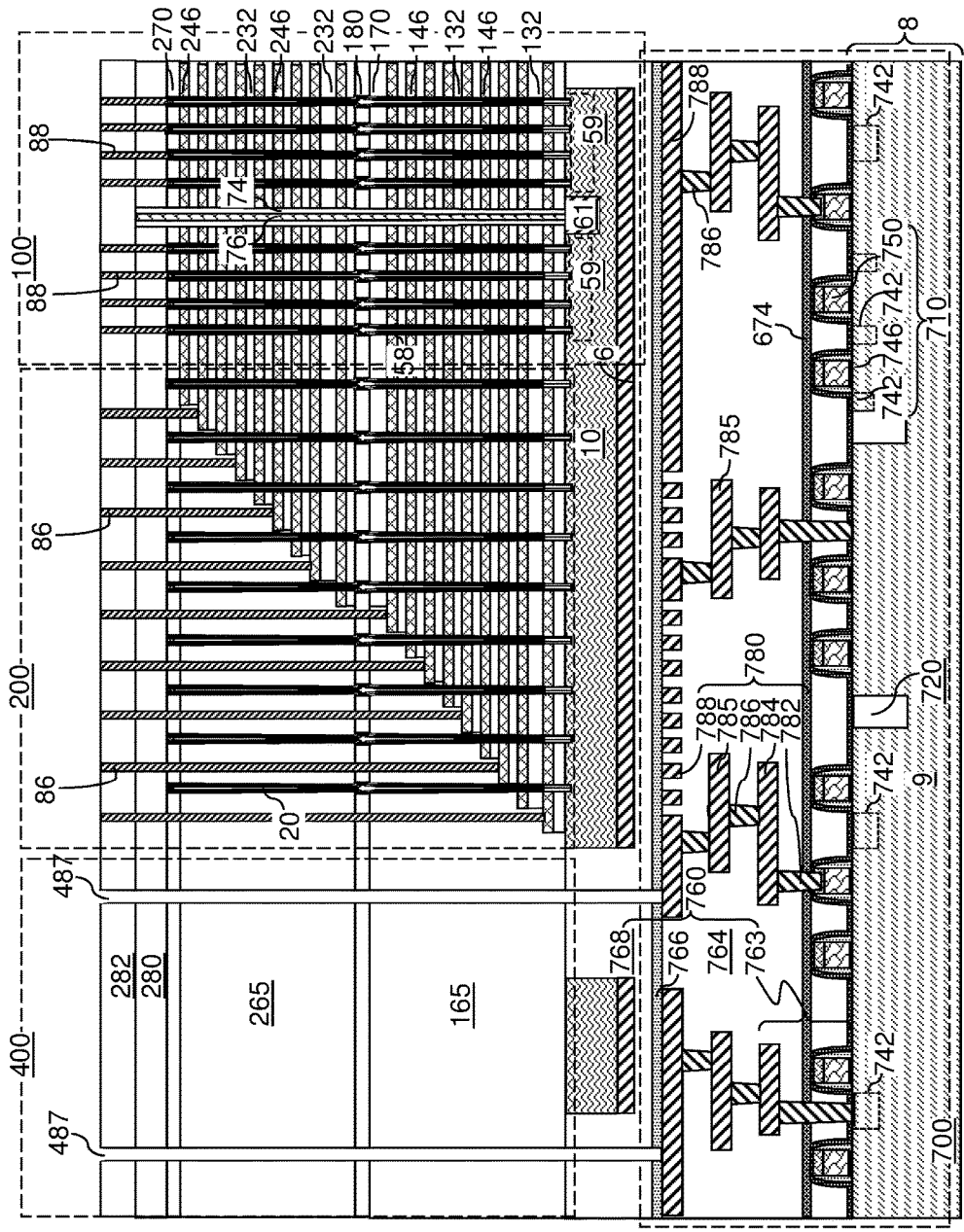
FIG. 42 is a vertical cross-sectional view of the first exemplary structure after formation of through-memory level via cavities and through-dielectric via cavities according to an embodiment of the present disclosure.

Referring to FIG. 42, a photoresist layer is applied over the second contact level dielectric layer 282, and is lithographically patterned to form openings in a peripheral region 400 located outside the memory array region 100 and the contact region 200. The pattern in the photoresist layer is transferred through the contact level dielectric layers (280, 282), the retro-stepped dielectric material portions (165, 265), the at least one second dielectric material layer 768, and the etch stop silicon nitride layer 766 to a top surface of a respective one of the topmost lower metal liner structures 788 to form through-dielectric via cavities 487 in the peripheral region 400. In one embodiment, the through-dielectric via cavities 487 can pass through openings in the planar semiconductor material layer 10 and the optional planar conductive material layer 6. The photoresist layer can be removed, for example, by ashing.

Figure 43A:
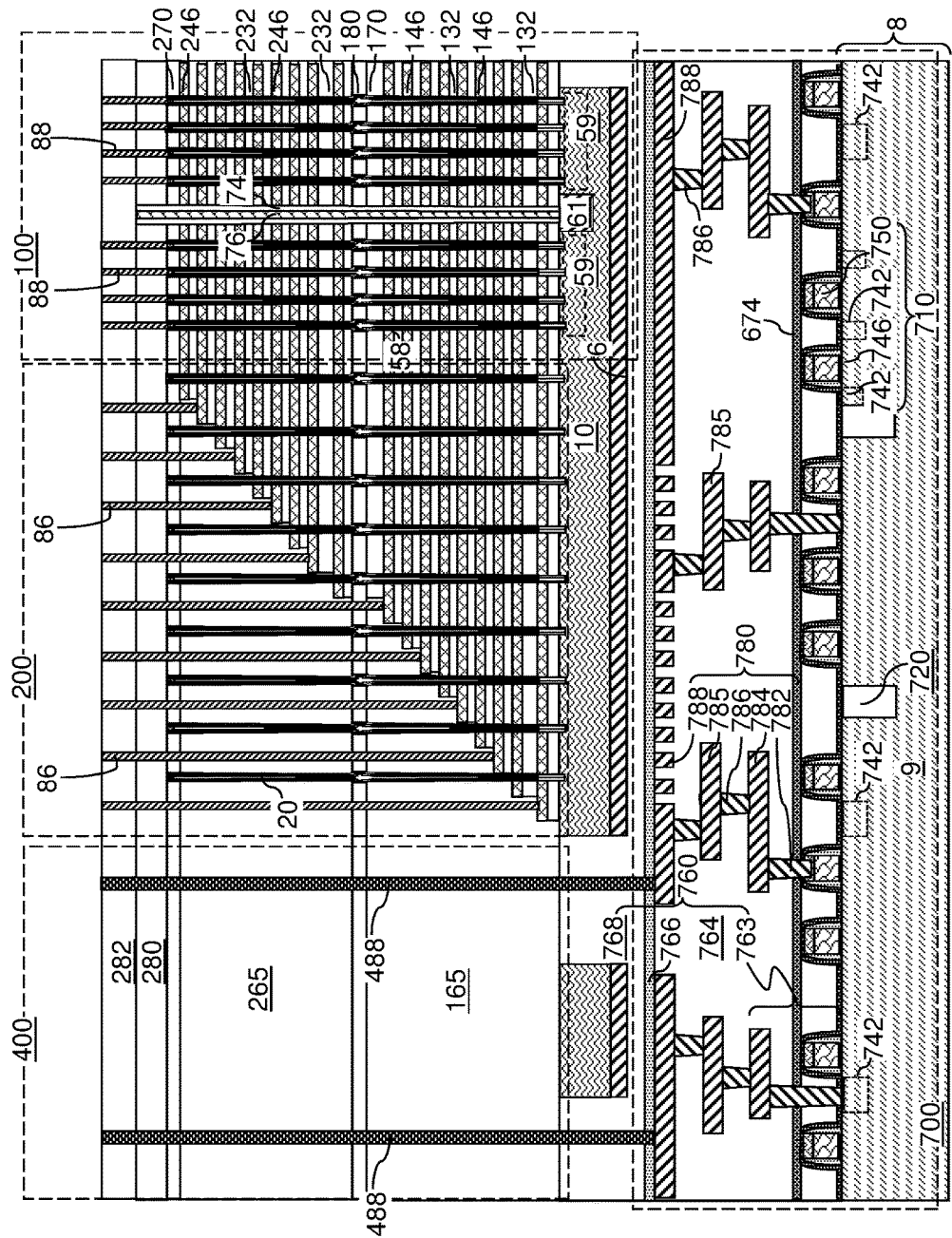
FIG. 43A is a vertical cross-sectional view of the first exemplary structure after formation of through-memory-level contact via structures and through-dielectric contact via structures according to an embodiment of the present disclosure.
Figure 43B:
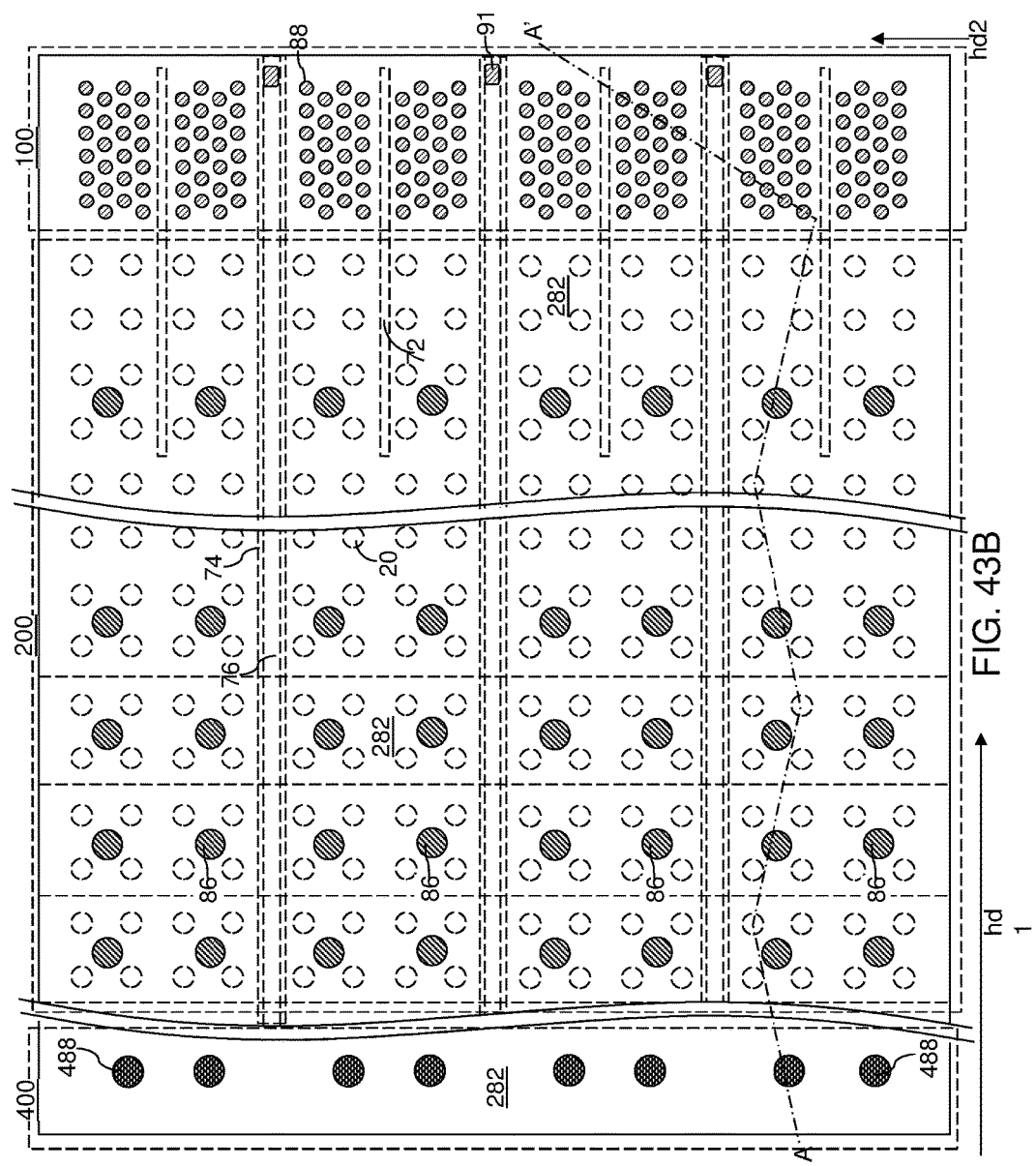
FIG. 43B is a horizontal cross-sectional view of the first exemplary structure along the horizontal plane B-B' in FIG. 43A. The zig-zag vertical plane A-A' corresponds to the plane of the vertical cross-sectional view of FIG. 43A.

Referring to FIGS. 43A and 43B, at least one conductive material can be simultaneously deposited in the through-dielectric via cavities 487. The at least one conductive material can include, for example, a metallic nitride liner (such as a TiN liner) and a metal fill material (such as W, Cu, Al, Ru, or Co). Excess portions of the at least one conductive material can be removed from outside the through-dielectric via cavities 487. For example, excess portions of the at least one conductive material can be removed from above the top surface of the second contact level dielectric layer 282 by a planarization process such as chemical mechanical planarization and/or a recess etch. Each remaining portion of the at least one conductive material in the through-dielectric via cavities 487 that contacts a top surface of a respective one of the topmost lower metal line structure 788 constitutes a through-dielectric contact via structure 488.

Figure 44:
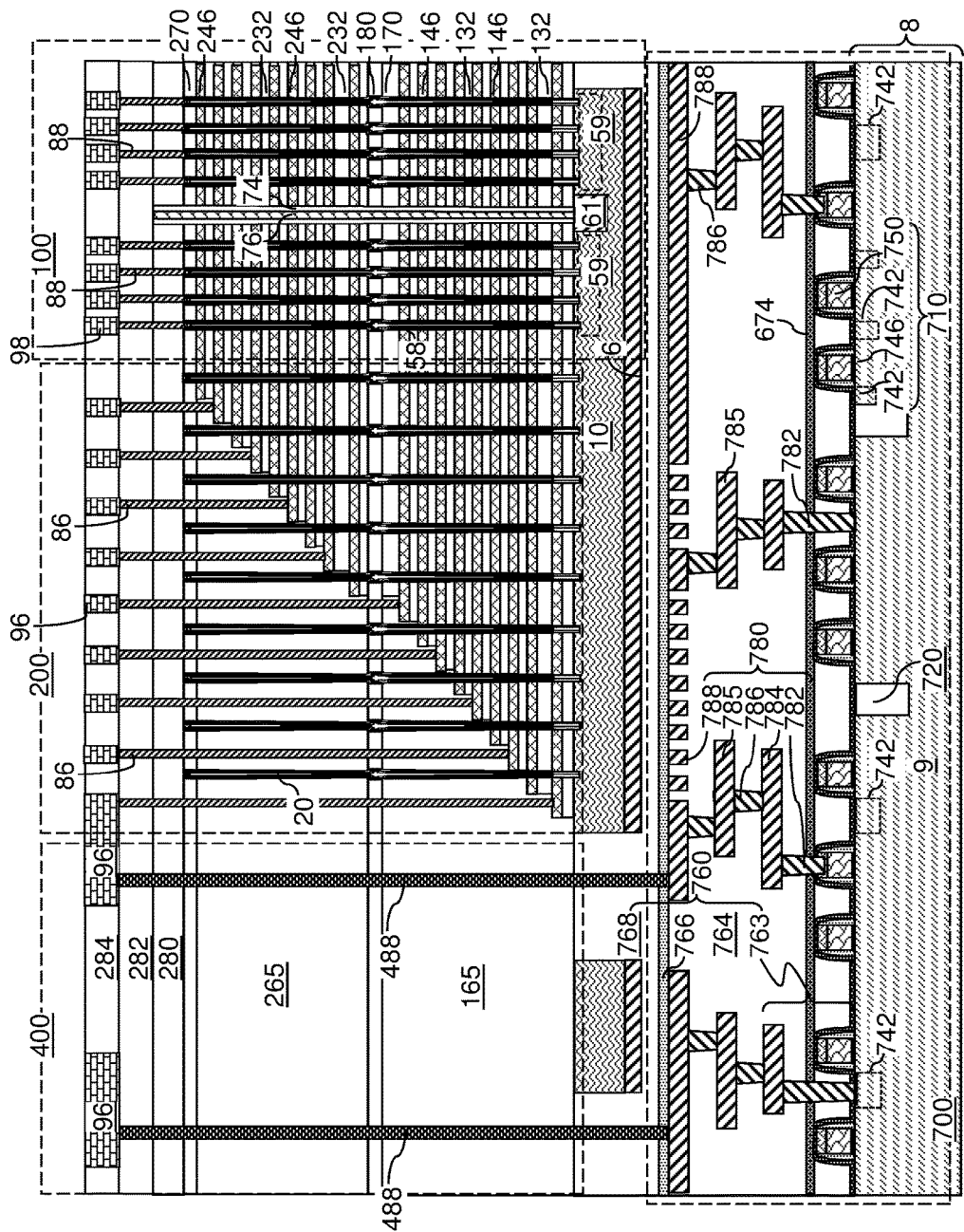
FIG. 44 is a vertical cross-sectional view of the first exemplary structure after formation of upper metal line structures according to an embodiment of the present disclosure.

Referring to FIG. 44, at least one upper interconnect level dielectric layer 284 can be formed over the contact level dielectric layers (280, 282). Various upper interconnect level metal structures can be formed in the at least one upper interconnect level dielectric layer 284. For example, the various upper interconnect level metal structures can include line level metal interconnect structures (96, 98). The line level metal interconnect structures (96, 98) can include upper metal line structures 96 that contact a top surface of a respective one of the through-dielectric contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1. In one embodiment, a subset of the upper metal line structures 96 may contact, or are electrically coupled to, a respective pair of a word line contact via structure 86 and a through-dielectric contact via structure 488.

At least a subset of the upper metal interconnect structures (which include the line level metal interconnect structures (96, 98) is formed over the three-dimensional memory array. A through-dielectric contact via structure 488 can be provided through the retro-stepped dielectric material portions (165, 265), the at least one second dielectric material layer 768, and the etch stop silicon nitride layer 766 and directly on a top surface of another lower metal line structure (e.g., another topmost lower metal line structure 788) of the lower metal interconnect structures 780. The etch stop silicon nitride layer 766 can function an additional hydrogen diffusion blocking structure that limits diffusion of hydrogen within the areas of the through-dielectric contact via structures 488.

In one embodiment, the memory stack structures 55 can comprise memory elements of a vertical NAND device. The electrically conductive layers (146, 246) can comprise, or can be electrically connected to, a respective word line of the vertical NAND device. The substrate 8 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels, wherein at least one end portion (such as a vertical semiconductor channel 60) of each of the plurality of semiconductor channels (59, 11, 60) extends substantially perpendicular to a top surface of the semiconductor substrate 8, a plurality of charge storage elements (as embodied as portions of the memory material layer 54 located at each word line level), each charge storage element located adjacent to a respective one of the plurality of semiconductor channels (59, 11, 60), and a plurality of control gate electrodes (as embodied as a subset of the electrically conductive layers (146, 246) having a strip shape extending substantially parallel to the top surface of the substrate 8 (e.g., along the first horizontal direction hd1), the plurality of control gate electrodes comprise at least a first control gate electrode located in the first device level and a second control gate electrode located in the second device level. Each of the memory stack structures 55 comprises a vertical semiconductor channel 60 and a memory film 50.

Referring to all drawings and according to various embodiments of the present disclosure, a semiconductor structure is provided, which comprises: a semiconductor device 710 located on a semiconductor substrate 8; a planarization dielectric layer 664 located on the semiconductor device 710 and over the semiconductor substrate 8; a silicon nitride diffusion barrier layer 674 located on the planarization dielectric layer 664; a via level dielectric layer 666 overlying the silicon nitride diffusion barrier layer 674; and a composite contact via structure (82, 83, optionally 89, 84) in contact with a component (744, 755) of the semiconductor device 710 and extending through the planarization dielectric layer 664, the silicon nitride diffusion barrier layer 674, and the via level dielectric layer 666, wherein the composite contact via structure (82, 83, optionally 89, 84) comprises, from bottom to top: a lower metallic via structure 82 in contact with the component (744, 755) of the semiconductor device 710 and extending through the planarization dielectric layer 664; a titanium diffusion barrier structure 83 in contact with a top surface of the lower metallic via structure 82 and contacting the silicon nitride diffusion barrier layer 674; and an upper metallic via structure 84 overlying, and electrically connected to the titanium diffusion barrier structure 83 and extending through the via level dielectric layer 666.

In one embodiment, the lower metallic via structure 82 comprises a lower metal nitride liner 822 in contact with the component (744, 755) of the semiconductor device 710 and a lower metal fill portion 824 consisting essentially of at least one first metal element and embedded in the lower metal nitride liner 822 and contacting a bottom surface of the titanium diffusion barrier structure 83. The upper metallic via structure 84 comprises an upper metal nitride liner 842 and an upper metal fill portion 844 consisting essentially of at least one second metal element and embedded in the upper metal nitride liner 842. In one embodiment, the sidewalls of the titanium nitride diffusion barrier structure 83 contacts a sidewall of the silicon nitride diffusion barrier layer 674.

All sidewalls of the titanium diffusion barrier structure 83 and the upper metallic via structure 84 contact only dielectric surfaces and do not contact any conductive surface. An upper portion of a sidewall of the lower metallic via structure 82 contacts a lower portion of a sidewall of the silicon nitride diffusion barrier layer 674. A top surface of the composite contact via structure (82, 83, optionally 89, 84) is within a same horizontal plane as a top surface of the via level dielectric layer 666.

In some embodiments, such as the first, second, and some cases of the fourth configurations, a top surface of the titanium diffusion barrier structure 83 is located below a horizontal plane including a top surface of the silicon nitride barrier layer 674.

In some embodiments, such as the first configuration, a sidewall of the titanium diffusion barrier structure 83 is vertically coincident with an outer sidewall of the upper metallic via structure 84, and with an outer sidewall of the lower metallic via structure 82.

In some embodiments, such as the second configuration, a sidewall of the titanium diffusion barrier structure 83 is vertically coincident with an outer sidewall of the upper metallic via structure 84, and the titanium diffusion barrier structure 83 has a greater maximum lateral dimension than a maximum lateral dimension of the lower metallic via structure 82.

In some embodiment, such as the third and fourth configurations, the upper metallic via structure 84 can have a lesser maximum lateral dimension than a maximum lateral dimension of the titanium diffusion barrier structure 83. In some embodiments, such as the third configuration, the semiconductor structure comprises an intermediate dielectric material layer 665 located between the silicon nitride barrier layer 674 and the via level dielectric layer 666, wherein the titanium diffusion barrier structure 83 has a top surface that is coplanar with a top surface of the intermediate dielectric material layer 665.

In some embodiments, such as the fourth configuration, the semiconductor structure comprises a metal pad portion 89 comprising at least one metal and contacting a top surface of the titanium diffusion barrier structure 83 and a bottom surface of the upper metallic via structure 84.

In some embodiments, the semiconductor device 710 is a field effect transistor, and the component of the semiconductor device is selected a gate electrode (754, 755), a source region (742) or a drain region (744) of the field effect transistor. In one embodiment, a three-dimensional NAND memory array located over the composite contact via structure and over the field effect transistor 710, where the field effect transistor 710 is part of a driver circuit of the three-dimensional NAND memory array.

The silicon nitride diffusion barrier layer 674 and the titanium diffusion barrier structures 83 collectively form a continuous diffusion barrier structure without an opening therethrough. The combination of the silicon nitride diffusion barrier layer 674 and the titanium diffusion barrier structures 83 thus function as a continuous diffusion barrier structure that prevents or reduces diffusion of hydrogen therethrough. By blocking downward diffusion of hydrogen atoms from the various dielectric materials in the three-dimensional memory devices above the silicon nitride diffusion barrier layer 674, performance degradation due to hydrogen in the semiconductor devices 710 underneath the silicon nitride diffusion barrier layer 674 can be prevented or reduced.

Referring to FIGS. 45-49, various configurations of a second exemplary structure according to a second embodiment are illustrated. The various configurations of the second exemplary structure can be derived from the first exemplary structure by forming at least one combination of a silicon nitride barrier layer {766, (7661, 7662, 7663), 674} including openings and a set of titanium plates (789, 789A, 789B, 789C, 789D) filling each of the openings.

The at least one combination of a silicon nitride barrier layer {766, (7661, 7662, 7663), 674} a set of titanium plates (789, 789A, 789B, 789C, 789D) may be formed within a single level within the lower level dielectric layers 760, or may be formed across multiple levels within the lower level dielectric layers 760. The composite contact via structures including a respective set of a lower metallic via structure, a titanium diffusion barrier structure, and an upper metallic via structure of the first exemplary structure may, or may not, be incorporated into the second exemplary structure.

Figure 45:
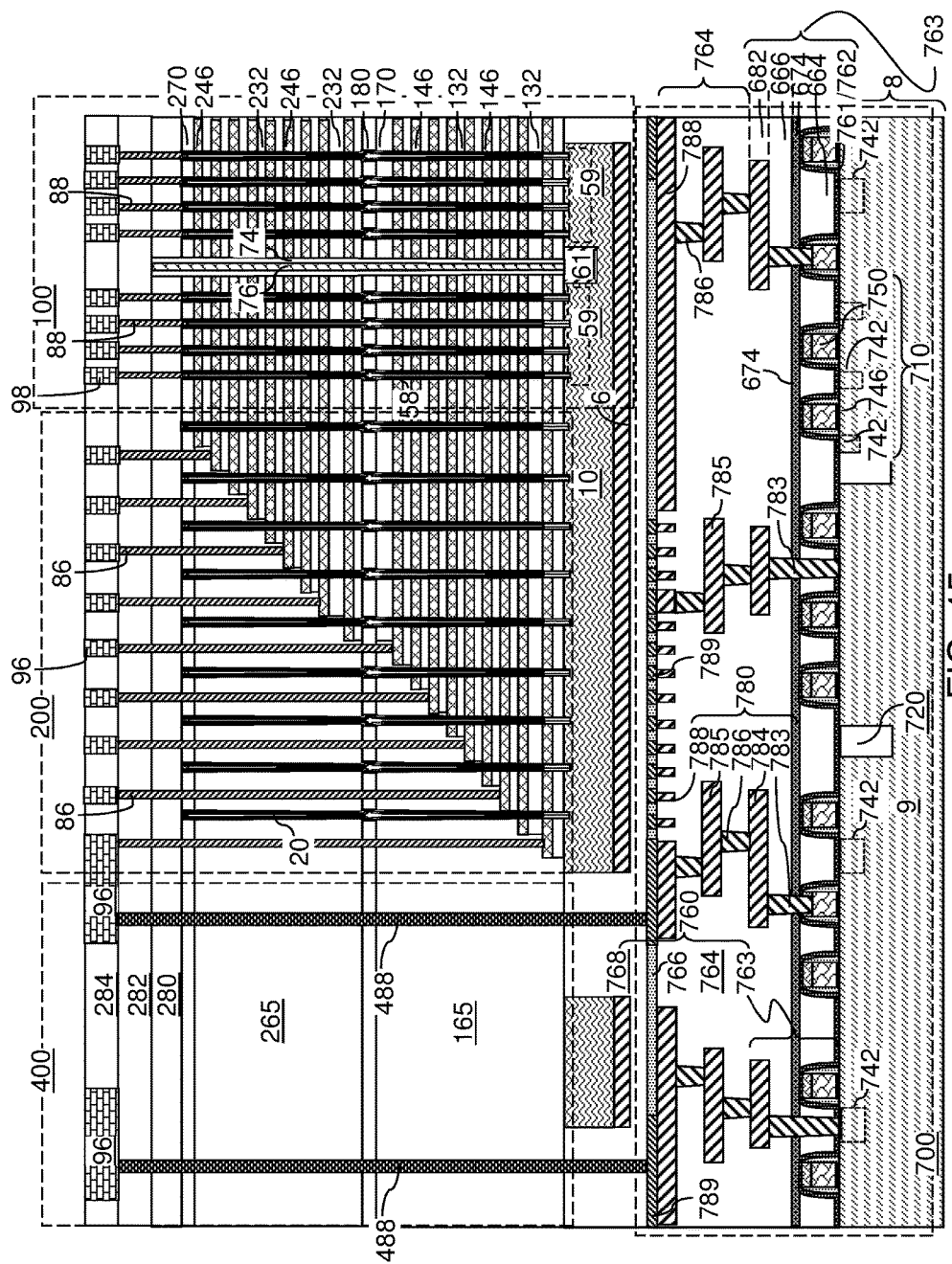
FIG. 45 is a vertical cross-sectional view of a first configuration of a second exemplary structure according to a second embodiment of the present disclosure.

Referring to FIG. 45, the first exemplary configuration of the second exemplary structure includes semiconductor devices 710 located on a semiconductor substrate 8, proximal dielectric layers 763 located over the semiconductor devices 710, first dielectric layers 764 overlying the proximal dielectric layers 763, a silicon nitride diffusion barrier layer 766 overlying the first dielectric layers 764, and at least one second dielectric layer 768 overlying the etch stop silicon nitride layer 766. The set of the proximal dielectric layers 763, the first dielectric material layers 764, the etch stop silicon nitride layer 766, and the at least one second dielectric layer 768 is herein referred to as lower level dielectric layers 760. Lower metal interconnect structures 780 are formed in the lower level dielectric layers 760. The lower metal interconnect structures 780 include device contact via structures 783 contacting various nodes of the semiconductor devices 710, first level lower line structures 784, lower metal via structures 786, optional intermediate level lower line structures 785, and topmost lower metal line structures 788.

The proximal dielectric layers 763 can include an optional silicon oxide liner 761, an optional silicon nitride liner 762, a planarization dielectric layer 664 including a dielectric material such as doped silicate glass, undoped silicate glass, or organosilicate glass, an optional silicon nitride diffusion barrier layer 674 contacting top surfaces of the gate structures 750, a via level dielectric layer 666 overlying the gate structures 750 and/or the silicon nitride diffusion barrier layer 674, and a line level dielectric layer 682 overlying the via level dielectric layer 666. In case the optional silicon nitride diffusion barrier layer 674 is omitted, the planarization dielectric layer 664 and the via level dielectric layer 666 may be formed as a single homogenous material layer without an interface therein. The device contact via structures 783 vertically extends through the via level dielectric layer 666 and through the optional silicon nitride diffusion barrier layer 674 (if present). At least one of the device contact via structures 783 can extend through the planarization dielectric layer 664, the optional silicon nitride layer 762, and the optional silicon oxide liner 761. The device contact via structures 783 include substrate contact via structures that contacts a portion of the semiconductor substrate 8 such as active regions 742 (source regions or drain regions) of field effect transistors 710 or metal silicide portions 744 located directly on the active regions 742 of the field effect transistors 710. The device contact via structure 783 further include gate contact via structures. In some embodiment, the device contact via structures 783 can be the same as the composite contact via structures 782 of the first embodiment. The first level lower line structures 784 can be formed in the line level dielectric layer 682. Top surfaces of the device contact via structures 783 can be contacted by bottom surfaces of the first level lower line structures 784. The level of the first level lower line structures 784 is referred to as a first metal level (i.e., a M1 level).

The first dielectric layers 764 can include at least as many dielectric material layers as the total number of metal line levels embedded therein. While the illustrated examples of the second exemplary structure show two metal levels for the first dielectric layers 764, embodiments are expressly contemplated herein in which one metal level, three metal levels, four metal levels, or more metal levels are provided in the first dielectric layers 764. Components of the lower metal interconnect structures 780 that are formed in the first dielectric layers 764 can include lower metal via structures 786 at each via level of the first dielectric layers 764, intermediate level lower line structures 785 that are formed in each line level of the first dielectric layers 764 other than the topmost line level of the first dielectric layers 764, and topmost lower metal line structures 788 that are formed at the topmost line level of the first dielectric layers 764. The lower metal interconnect structures 780 may be formed by single damascene processes in which lower metal via structures 786 and immediately overlying intermediate level lower line structures 785 are formed by two separate planarization processes, or by dual damascene processed in which metal interconnect structures 780 may be formed by single damascene processes in which lower metal via structures 786 and immediately overlying intermediate level lower line structures 785 are formed as integrated line and via structures employing a single planarization process.

The silicon nitride diffusion barrier layer 766 can be formed directly on the topmost surfaces of the first dielectric layers 764 and the topmost lower metal line structures 788. A photoresist layer (not shown) can be applied over the silicon nitride diffusion barrier layer 766. Openings can be formed in the photoresist layer by lithographic exposure and development. The pattern of the openings in the photoresist layer can be selected such that the openings generally overlie the areas of the topmost lower metal line structures 788. Each of the openings may be entirely within the areas of the topmost lower metal line structures 788, may have a periphery that crosses a periphery of an underlying topmost lower metal line structure 788 at least twice, or may have a periphery that is laterally offset outward from the periphery of an underlying topmost lower metal line structure 788. An etch process can be performed to etch physically exposed portions of the silicon nitride diffusion barrier layer 766 and to form openings through the silicon nitride diffusion barrier layer 766 that underlie the openings in the photoresist layer. Surfaces of the topmost lower metal line structures 788 are physically exposed. The photoresist layer can be subsequently removed, for example, by ashing.

A titanium layer can be deposited in the openings and over the silicon nitride diffusion barrier layer 766. Portions of the titanium layer overlying the top surface of the silicon nitride diffusion barrier layer 766 can be removed by a planarization process. Remaining portions of the titanium layer fill the openings in the silicon nitride diffusion barrier layer 766, and constitute a titanium diffusion barrier structure, which in this second embodiment comprises a set of titanium plates 789. The titanium plates 789 physically contact the silicon nitride diffusion barrier layer 766 to form a continuous hydrogen diffusion barrier structure (789, 766).

The at least one second dielectric layer 768 can be subsequently formed over the combination of the silicon nitride diffusion barrier layer 766 and the set of titanium plates 789. Subsequent processing steps of the first embodiment can be performed to provide the first configuration of the second exemplary structure. In this case, the set of titanium plates 789 can be employed as etch stop structures during formation of through-dielectric via cavities 487. The through-dielectric contact via structure 488 can be formed in the through-dielectric via cavities 487 directly on the top surfaces of the titanium plates 789. In this embodiment, an interconnect structure extends through the silicon nitride diffusion barrier layer 766. The interconnect structure includes the titanium diffusion barrier structure (e.g., the titanium plane 789) in contact with the silicon nitride diffusion barrier layer 766 to form a continuous hydrogen diffusion barrier structure (766, 789). In this embodiment, the interconnect structure includes the through-dielectric contact via structure 488 in addition to the underlying titanium plate 489.

In the first configuration of the second exemplary structure, the first dielectric material layer 764 overlies a portion of the semiconductor devices 710 and embeds at least portions of topmost lower metal line structures 788. The silicon nitride diffusion barrier layer 766 overlies the first dielectric material layers 764 and includes a set of openings therein. A set of titanium plates 789 fills the set of openings. The silicon nitride diffusion barrier layer 766 and the set of titanium plates 789 complimentarily provide a continuous structure extending over the semiconductor substrate 8. A conductive structure, such as one of the topmost lower metal line structures 788 embedded in the first dielectric material layers 764, contacts a titanium plate 789 among the set of titanium plates 789. The conductive structure comprises one of the first metal interconnect structures (784, 785, 788). The semiconductor structure includes second metal interconnect structures, such as the through-dielectric contact via structure 488, embedded within at least one second dielectric material layer 768 overlying the silicon nitride diffusion barrier layer 766. One of the second metal interconnect structures, such as the through-dielectric contact via structure 488, contacts a top surface of the titanium plate 789 among the set of titanium plates 789.

Figure 46:
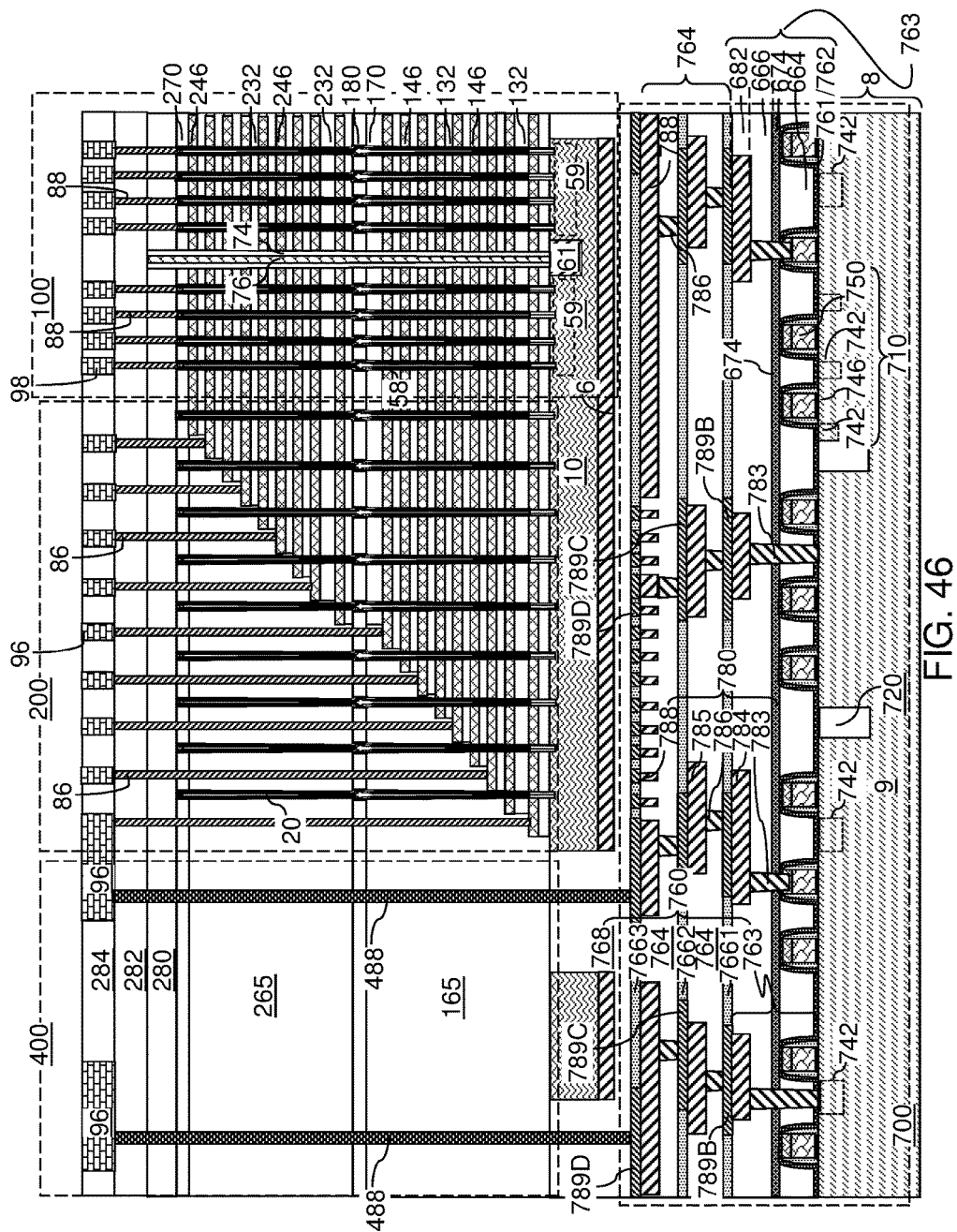
FIG. 46 is a vertical cross-sectional view of a second configuration of the second exemplary structure according to a second embodiment of the present disclosure.

Referring to FIG. 46, the second configuration of the second exemplary structure can be derived from the first configuration of the second exemplary structure by forming additional silicon nitride diffusion barrier layers and additional set of titanium plates. Specifically, a silicon nitride diffusion barrier layer, herein referred to as a first-metal-level cap silicon nitride diffusion barrier layer 7661, can be formed on the top surface of the line level dielectric layer 682 and the first level lower line structures 784. The first-metal-level cap silicon nitride diffusion barrier layer 7661 can be formed by the same deposition method as the silicon nitride diffusion barrier layer 766 of the first configuration of the second exemplary structure. The thickness of the first-metal-level cap silicon nitride diffusion barrier layer 7661 can be in a range from 10 nm to 100 nm, such as from 20 nm to 60 nm, although lesser and greater thicknesses can also be employed. In one embodiment, the first-metal-level cap silicon nitride diffusion barrier layer 7661 has a planar top surface.

A photoresist layer (not shown) can be applied over the first-metal-level cap silicon nitride diffusion barrier layer 7661. Openings can be formed in the photoresist layer by lithographic exposure and development. The pattern of the openings in the photoresist layer can be selected such that the openings generally overlie the areas of the first level lower line structures 784. An etch process can be performed to etch physically exposed portions of the first-metal-level cap silicon nitride diffusion barrier layer 7661 and to form openings through the first-metal-level cap silicon nitride diffusion barrier layer 7661 that underlie the openings in the photoresist layer. Surfaces of the first level lower line structures 784 are physically exposed. The photoresist layer can be subsequently removed, for example, by ashing.

A titanium layer can be deposited in the openings and over the first-metal-level cap silicon nitride diffusion barrier layer 7661. Portions of the titanium layer overlying the top surface of the first-metal-level cap silicon nitride diffusion barrier layer 7661 can be removed by a planarization process. Remaining portions of the titanium layer fill the openings in the first-metal-level cap silicon nitride diffusion barrier layer 7661, and constitute a first set of titanium plates 789B.

Subsequently, a subset of layers among the first dielectric material layers 764 can be formed over the first-metal-level cap silicon nitride diffusion barrier layer 7661. Lower level metal via structures 786 and intermediate level lower line structures 785 can be formed through the subset of layers among the first dielectric material layers 764 overlying the first-metal-level cap silicon nitride diffusion barrier layer 7661. The lower level metal via structures 786 are formed directly on top surfaces of the first set of titanium plates 789B. The intermediate level lower line structures 785 can be formed on top surface of the lower level metal via structures 786. Alternatively, the intermediate level lower line structures 785 and the lower level metal via structures 786 can be formed as integrated line and via structures through the subset of layers among the first dielectric material layers 764 employing a dual damascene process.

A silicon nitride diffusion barrier layer, herein referred to as a second-metal-level cap silicon nitride diffusion barrier layer 7662, can be formed on the topmost surfaces of the subset of layers among the first dielectric material layers 764 and the intermediate level lower line structures 785. The second-metal-level cap silicon nitride diffusion barrier layer 7662 can be formed by the same deposition method as the first-metal-level cap silicon nitride diffusion barrier layer 7661. The thickness of the second-metal-level cap silicon nitride diffusion barrier layer 7662 can be in a range from 10 nm to 100 nm, such as from 20 nm to 60 nm, although lesser and greater thicknesses can also be employed. In one embodiment, the second-metal-level cap silicon nitride diffusion barrier layer 7662 has a planar top surface.

The second-metal-level cap silicon nitride diffusion barrier layer 7662 can be patterned in the same manner as the first-metal-level cap silicon nitride diffusion barrier layer 7661 with appropriate modification in the pattern of the opening therein. Surfaces of the intermediate level lower line structures 785 are physically exposed through openings in the second-metal-level cap silicon nitride diffusion barrier layer 7662. A titanium layer can be deposited in the openings and over the second-metal-level cap silicon nitride diffusion barrier layer 7662. Portions of the titanium layer overlying the top surface of the second-metal-level cap silicon nitride diffusion barrier layer 7662 can be removed by a planarization process. Remaining portions of the titanium layer fill the openings in the second-metal-level cap silicon nitride diffusion barrier layer 7662, and constitute a second set of titanium plates 789C.

Another subset of layers among the first dielectric material layers 764 can be formed over the second-metal-level cap silicon nitride diffusion barrier layer 7662. Lower level metal via structures 786 and topmost lower metal line structures 788 can be formed through the subset of layers among the first dielectric material layers 764 overlying the second-metal-level cap silicon nitride diffusion barrier layer 7662. The lower level metal via structures 786 are formed directly on top surfaces of the second set of titanium plates 789C. The topmost lower metal line structures 788 can be formed on top surface of the lower level metal via structures 786. Alternatively, the topmost lower metal line structures 788 and the lower level metal via structures 786 can be formed as integrated line and via structures through the subset of layers among the first dielectric material layers 764 employing a dual damascene process.

A silicon nitride diffusion barrier layer, herein referred to as a third-metal-level cap silicon nitride diffusion barrier layer 7663, can be formed on the topmost surfaces of the subset of layers among the first dielectric material layers 764 and the topmost lower metal line structures 788. The third-metal-level cap silicon nitride diffusion barrier layer 7663 can be the same as the silicon nitride diffusion barrier layer 766 of the first configuration of the second exemplary structure.

The third-metal-level cap silicon nitride diffusion barrier layer 7663 can be patterned in the same manner as the silicon nitride diffusion barrier layer 766. Surfaces of the topmost lower metal line structures 788 are physically exposed through openings in the third-metal-level cap silicon nitride diffusion barrier layer 7663. A titanium layer can be deposited in the openings and over the third-metal-level cap silicon nitride diffusion barrier layer 7663. Portions of the titanium layer overlying the top surface of the third-metal-level cap silicon nitride diffusion barrier layer 7663 can be removed by a planarization process. Remaining portions of the titanium layer fill the openings in the third-metal-level cap silicon nitride diffusion barrier layer 7663, and constitute a third set of titanium plates 789D.

The at least one second dielectric layer 768 can be subsequently formed over the combination of the third-metal-level cap silicon nitride diffusion barrier layer 7663 and the third set of titanium plates 789D. Subsequent processing steps of the first embodiment can be performed to provide the second configuration of the second exemplary structure. In this case, the third set of titanium plates 789D can be employed as etch stop structures during formation of through-dielectric via cavities 487. The through-dielectric contact via structure 488 can be formed in the through-dielectric via cavities 487 directly on the top surfaces of the titanium plates 789D.

Additional configurations of the second exemplary structure can be derived from the second configuration of the second exemplary structure by omitting the processing steps for formation of at least one, but not all, of the combinations of a silicon nitride diffusion barrier layer (7661, 7662, 7663) including respective openings and a set of titanium plates (789B, 789B, 789C) filling the respective openings. Each combination of a silicon nitride diffusion barrier layer (7661, 7662, 7663) including respective openings and a set of titanium plates (789B, 789B, 789C) filling the respective openings constitutes a continuous diffusion barrier structure that blocks diffusion of hydrogen therethrough. Thus, the number of continuous diffusion barrier structures can be equal to, or greater than, 1, and can be less than the total number of metal line interconnect levels within the lower level dielectric layers 760.

Figure 47:
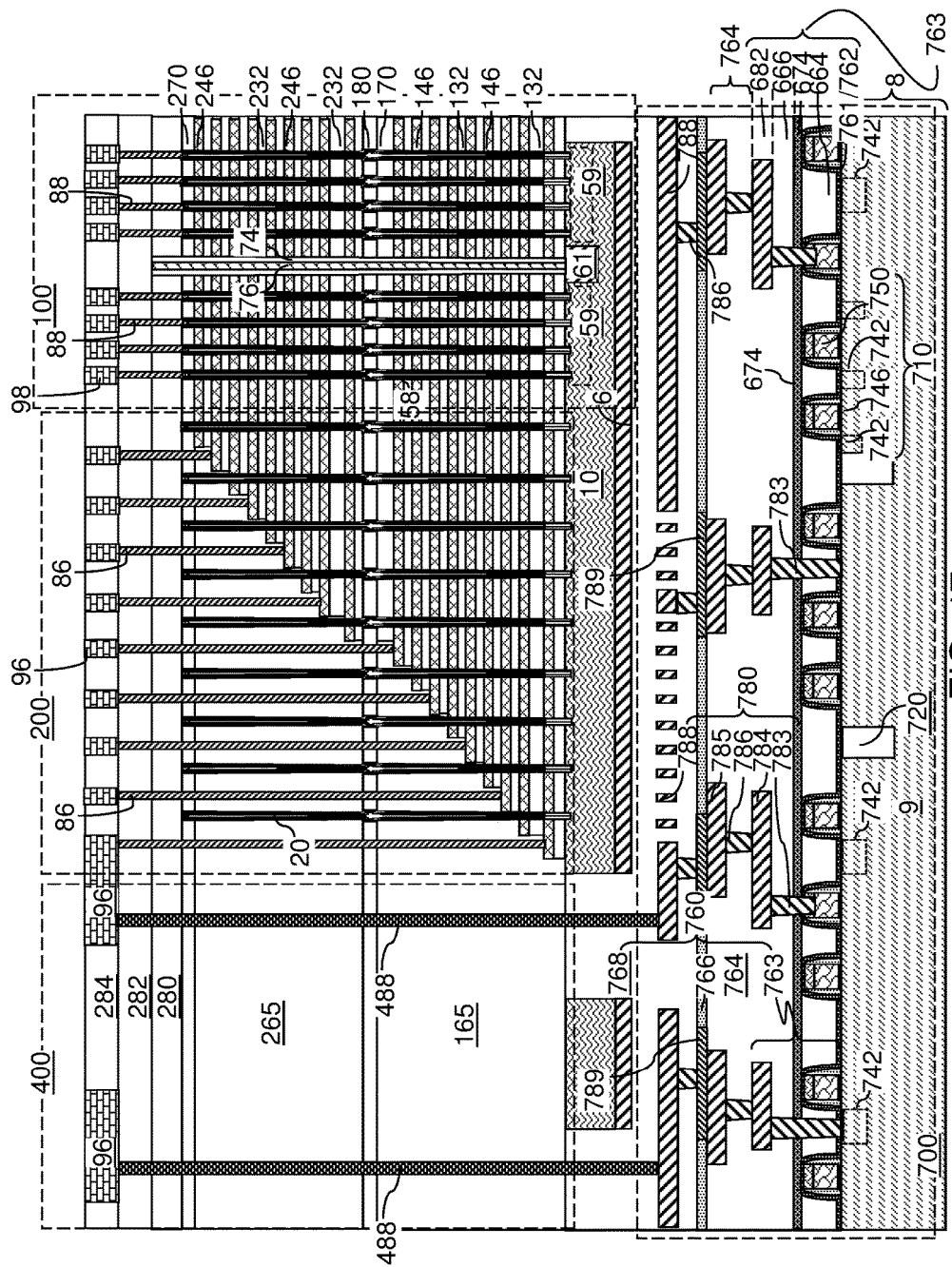
FIG. 47 is a vertical cross-sectional view of a third configuration of the second exemplary structure according to a second embodiment of the present disclosure.

Referring to FIG. 47, a third configuration of the second exemplary structure is illustrated, which is a configuration in which the combination of the first-metal-level cap silicon nitride diffusion barrier layer 7661 and the first set of titanium plates 789B and the combination of the third-metal-level cap silicon nitride diffusion barrier layer 7663 and the third set of titanium plates 789D are omitted. The second-metal-level cap silicon nitride diffusion barrier layer 7662 is herein referred to as a silicon nitride diffusion barrier layer 766, and the second set of titanium plates 789C is herein referred to as a set of titanium plates 789.

Figure 48:
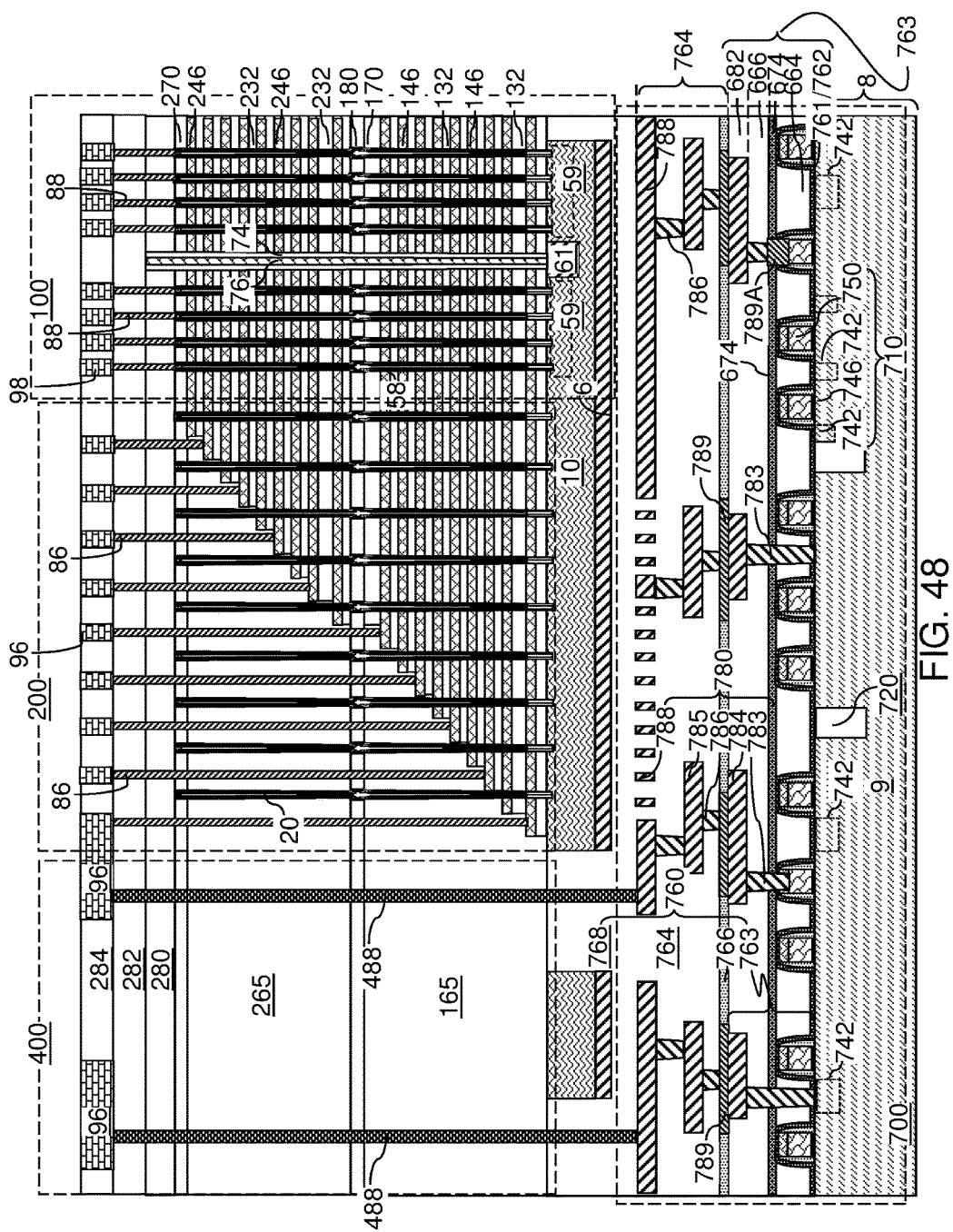
FIG. 48 is a vertical cross-sectional view of a fourth configuration of the second exemplary structure according to a second embodiment of the present disclosure.

Referring to FIG. 48, a fourth configuration of the second exemplary structure is illustrated, which is a configuration in which the combination of the second-metal-level cap silicon nitride diffusion barrier layer 7662 and the second set of titanium plates 789C and the combination of the third-metal-level cap silicon nitride diffusion barrier layer 7663 and the third set of titanium plates 789D are omitted. The first-metal-level cap silicon nitride diffusion barrier layer 7661 is herein referred to as a silicon nitride diffusion barrier layer 766, and the first set of titanium plates 789B is herein referred to as a set of titanium plates 789.

Figure 49:
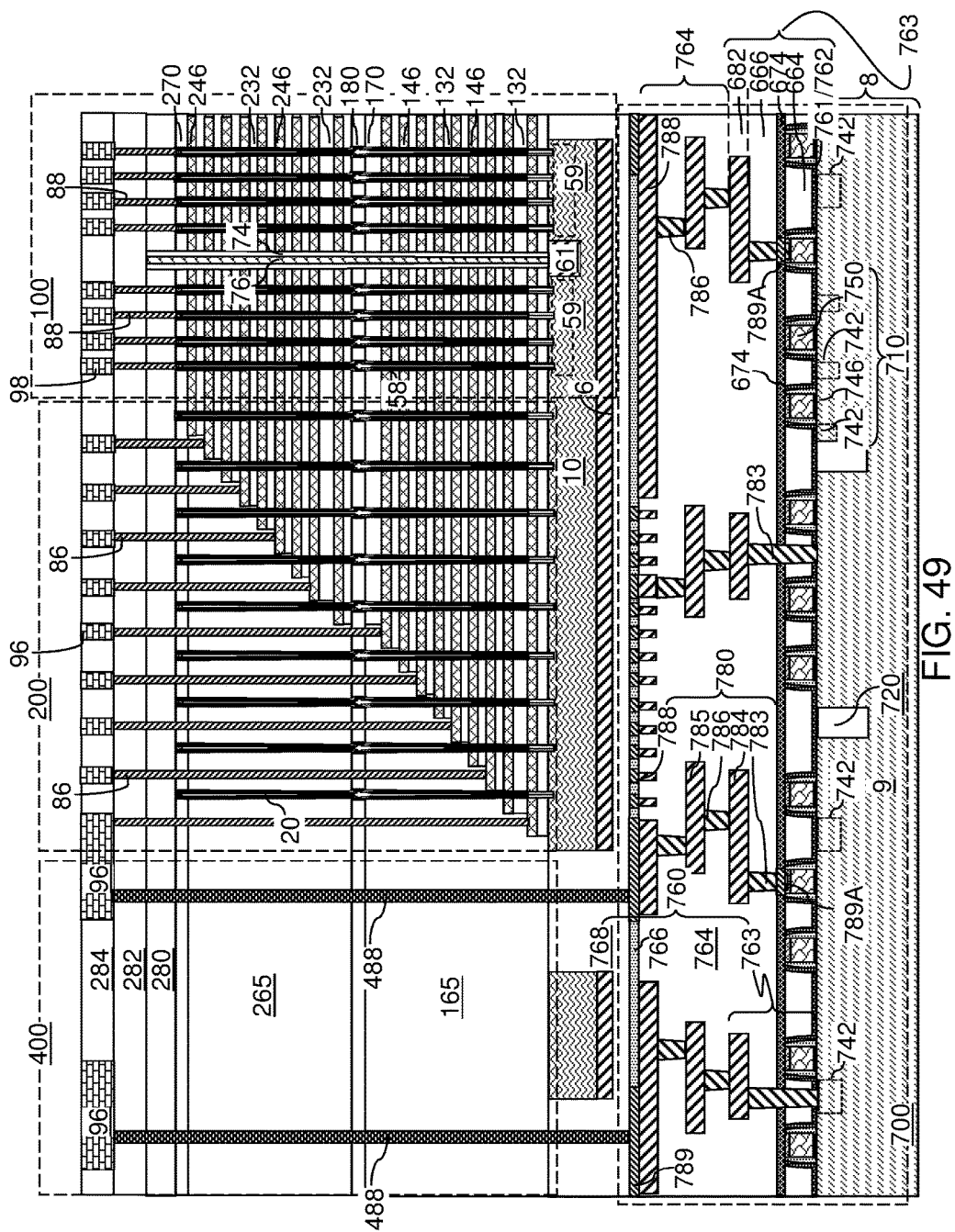
FIG. 49 is a vertical cross-sectional view of a fifth configuration of the second exemplary structure according to a second embodiment of the present disclosure.

Referring to FIG. 49, a fifth configuration of the second exemplary structure can be derived from any of the above-described configurations of the second exemplary structure, as shown in FIGS. 59 to 63 and described in more detail below. In summary, the fifth configuration of the second exemplary structure can be formed by removing gate cap dielectrics 758 from gate structures 750, by forming the silicon nitride diffusion barrier layer 674 directly on top surfaces of the gate electrodes (754, 755) and on a top surface of the planarization dielectric layer 664 (which is a layer within the proximal dielectric layers 763), by forming openings through the silicon nitride diffusion barrier layer 674, and by forming a set of titanium plates 789A in the openings of the silicon nitride diffusion barrier layer 674. Each opening through the silicon nitride diffusion barrier layer 674 and each titanium plate 789A can be formed over a respective one of the gate electrodes (754, 755). In one embodiment, each titanium plate 789A embedded within the silicon nitride diffusion barrier layer 674 can contact a top surface of a respective one of the gate electrodes (754, 755). The combination of the silicon nitride diffusion barrier layer 674 and the set of titanium plates 789A constitutes a continuous hydrogen diffusion barrier structure that extends over the semiconductor devices 710.

The via level dielectric layer 666 can be subsequently formed over the combination of the silicon nitride diffusion barrier layer 674 and the set of titanium plates 789A. The device contact via structures 783 can be formed through the via level dielectric layer 666, the silicon nitride diffusion barrier layer 674, and optionally through the through the planarization dielectric layer 664, the optional silicon nitride layer 762, and the optional silicon oxide liner 761. Gate contact via structures, which are a subset of the device contact via structures 783, can be formed on top of a respective one of the titanium plates 789A, and provides electrical contact to an underlying gate electrode (754, 755) through the respective one of the titanium plates 789A. Substrate contact via structures, which are another subset of the device contact via structures 783, can be formed through the via level dielectric layer 666, the silicon nitride diffusion barrier layer 674, the planarization dielectric layer 664, the silicon nitride liner 762, and the silicon oxide liner 761 and directly on active regions 742 (such as source regions and drain regions) and/or metal silicide regions 744 contacting active regions 742. Subsequently, overlying metal interconnect structures and additional structures of the first through fourth configurations of the second exemplary structure can be formed.

The fifth configuration of the second exemplary structure includes semiconductor devices 710 located on a semiconductor substrate 8, a first dielectric material layer, such as the planarization dielectric layer 664 among the proximal dielectric layers 763, overlying a portion of the semiconductor devices 710 and embedding at least portions of first metal interconnect structures such as substrate contact via structures that are a subset of the device contact via structures 783, a silicon nitride diffusion barrier layer 674 overlying the first dielectric material layer (such as the planarization dielectric layer 664) and including a set of openings therein, and a set of titanium plates 789A filling the set of openings. The silicon nitride diffusion barrier layer 674 and the set of titanium plates 789A complimentarily provide a continuous structure extending over the semiconductor substrate 8. A conductive structure such as a gate electrode (754, 755) embedded in the first dielectric material layer (such as the planarization dielectric layer 664) contacts a titanium plate 789A among the set of titanium plates 789A, and the conductive structure comprises a component (754, 755) of the semiconductor devices 710. The semiconductor structure includes second metal interconnect structures, such as gate contact via structures that are a subset of the device contact via structures 783, that are embedded within a second dielectric material layer (such as a dielectric layer among the first dielectric material layers 764 that contacts the top surface of the silicon nitride diffusion barrier layer 674) overlying the silicon nitride diffusion barrier layer 674. One of the second metal interconnect structures, such as a gate contact via structure, contacts a top surface of the titanium plate 789A among the set of titanium plates 789A.

Generally, the various configurations of the second exemplary structure of the second embodiment can include semiconductor devices 710, a silicon nitride diffusion barrier layer {766, (7661, 7662, 7663), 674} overlying the semiconductor devices 710, and an interconnect structure extending through the silicon nitride diffusion barrier layer. In the second embodiment, the interconnect structure includes a titanium diffusion barrier structure (789, 789A, 789B, 789C, 789D) in contact with the silicon nitride diffusion barrier layer to form a continuous hydrogen diffusion barrier structure. The interconnect structure further includes one or more of the second metal interconnect structures (783, 786, 488) in the second embodiment. In the first embodiment described above, the titanium diffusion barrier structure 83 contacts the silicon nitride diffusion barrier layer 674 to form the continuous hydrogen diffusion barrier structure and the interconnect structure further comprises the upper metallic via structure 84. In one embodiment, the semiconductor devices 710 are located on a semiconductor substrate 8. A first dielectric material layer (763 or 764) overlies a portion of the semiconductor devices 710 and embeds at least portions of first metal interconnect structures (783, 784, 785, 788), the silicon nitride diffusion barrier layer {766, (7661, 7662, 7663), 674} overlies the first dielectric material layer (763 or 764) and includes a set of openings therein, and a set of titanium plates (789, 789A, 789B, 789C, 789D) fills the set of openings. The silicon nitride diffusion barrier layer {766, (7661, 7662, 7663), 674} and the set of titanium plates (789, 789A, 789B, 789C, 789D) complimentarily provide a continuous hydrogen diffusion barrier structure extending over the semiconductor substrate 8. A conductive structure (750, 784, 785, 788) embedded in the first dielectric material layer (763 or 764) contacts a titanium plate (789, 789A, 789B, 789C, 789D) among the set of titanium plates (789, 789A, 789B, 789C, 789D). The conductive structure (750, 784, 785, 788) comprises a component (e.g., gate electrode) (754, 755) of the semiconductor devices 710 or one of the first metal interconnect structures (784, 785, 788). The semiconductor structure includes second metal interconnect structures (783, 786, 488) embedded within a second dielectric material layer (763, 764, 768) overlying the silicon nitride diffusion barrier layer {766, (7661, 7662, 7663), 674}. One of the second metal interconnect structures (783, 786, 488) contacts a top surface of the titanium plate (789, 789A, 789B, 789C, 789D) among the set of titanium plates (789, 789A, 789B, 789C, 789D).

FIGS. 50-55 illustrate a sequence of processing steps that can be employed to form a combination of a silicon nitride diffusion barrier layer {766, (7661, 7662, 7663)} including a set of openings therein and a set of titanium plates (789, 789B, 789C, 789D) filling the set of openings. Each silicon nitride diffusion barrier layer (766, 7661, 7662, 7663) formed above the via level dielectric layer 666 can be formed employing the sequence of processing steps of FIGS. 50-55. The silicon nitride diffusion barrier layer (766, 7661, 7662, 7663) formed by the sequence of processing steps of FIGS. 50-55 is herein referred to as a first-type silicon nitride diffusion barrier layer.

Figure 50:
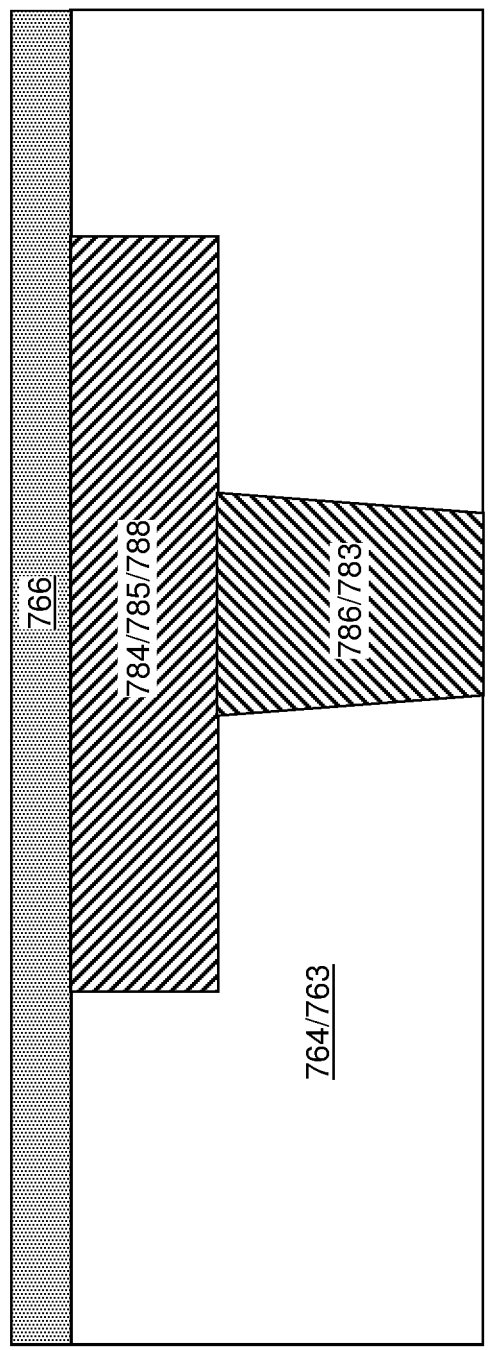
FIG. 50 is a vertical cross-sectional view of a region of the second exemplary structure that can be incorporated into various configurations after formation of a first-type silicon nitride diffusion barrier layer on a first metal interconnect structure according to an embodiment of the present disclosure.

Referring to FIG. 50, metal interconnect structures including a metal via structure (786, 783) and a metal line structure (784, 785, 788) is formed in at least one dielectric material layer (764, 763). The at least one dielectric material layer (764, 763) is provided over the planarization dielectric layer 664, which has a top surface located at, or above, a topmost surface of semiconductor devices 710 on the semiconductor substrate 8. The metal via structure (786, 783) and the metal line structure (784, 785, 788) can be any pair of a metal via structure and a metal line structure that is embedded in the proximal dielectric layers 763 or in the first dielectric material layers 764 and contacting each other. The metal via structure (786, 783) and the metal line structure (784, 785, 788) can be formed by two separate metal patterning steps, or may be formed by a dual damascene process as an integrated line and via structure.

The metal via structure (786, 783) can be a lower metal via structures 786 or a device contact via structure 783, which may be a substrate contact via structure or a gate contact via structure. The metal line structure (784, 785, 788) can be a first level lower line structures 784, an intermediate level lower line structures 785, or a topmost lower metal line structure 788. The metal line structure (784, 785, 788) is herein referred to as a first metal interconnect structure. The at least one dielectric material layer (764, 763) is herein referred to as a first dielectric material layer, which may be a layer within the proximal dielectric layers 763 or a layer within the first dielectric material layers 764. Generally, the first dielectric material layer (764, 763) can be formed over a portion of semiconductor devices 710 that are formed on a semiconductor substrate 8. The first metal interconnect structure (784, 785, 788) is a conductive structure that is laterally surrounded by the first dielectric material layer (764, 763). The top surface of the metal line structure (784, 785, 788) can be coplanar with the top surface of the at least one dielectric material layer (764, 763).

The silicon nitride diffusion barrier layer 766 can be formed directly on the topmost surfaces of the first dielectric material layer (764, 763) and the first metal interconnect structure (784, 785, 788). The silicon nitride diffusion barrier layer 766 can be formed by low pressure chemical vapor deposition (LPCVD) process employing dichlorosilane (DCS) and ammonia as reactant gases at a temperature in a range from 600 degrees Celsius and 900 degrees Celsius and at a pressure in a range from 100 mTorr to 500 mTorr. However, other materials, pressures and temperatures may be used. For example, the silicon nitride may be deposited from other reactant gases or by a method other than LPCVD, or another dielectric material may be used instead of or in addition to silicon nitride. The silicon nitride diffusion barrier layer 766 can be stoichiometric, i.e., have an atomic ratio of 3:4 between silicon atoms and nitrogen atoms. The thickness of the silicon nitride diffusion barrier layer 766 can be in a range from 10 nm to 100 nm, such as from 20 nm to 60 nm, although lesser and greater thicknesses can also be employed. In one embodiment, the silicon nitride diffusion barrier layer 766 has a planar top surface.

Figure 51:
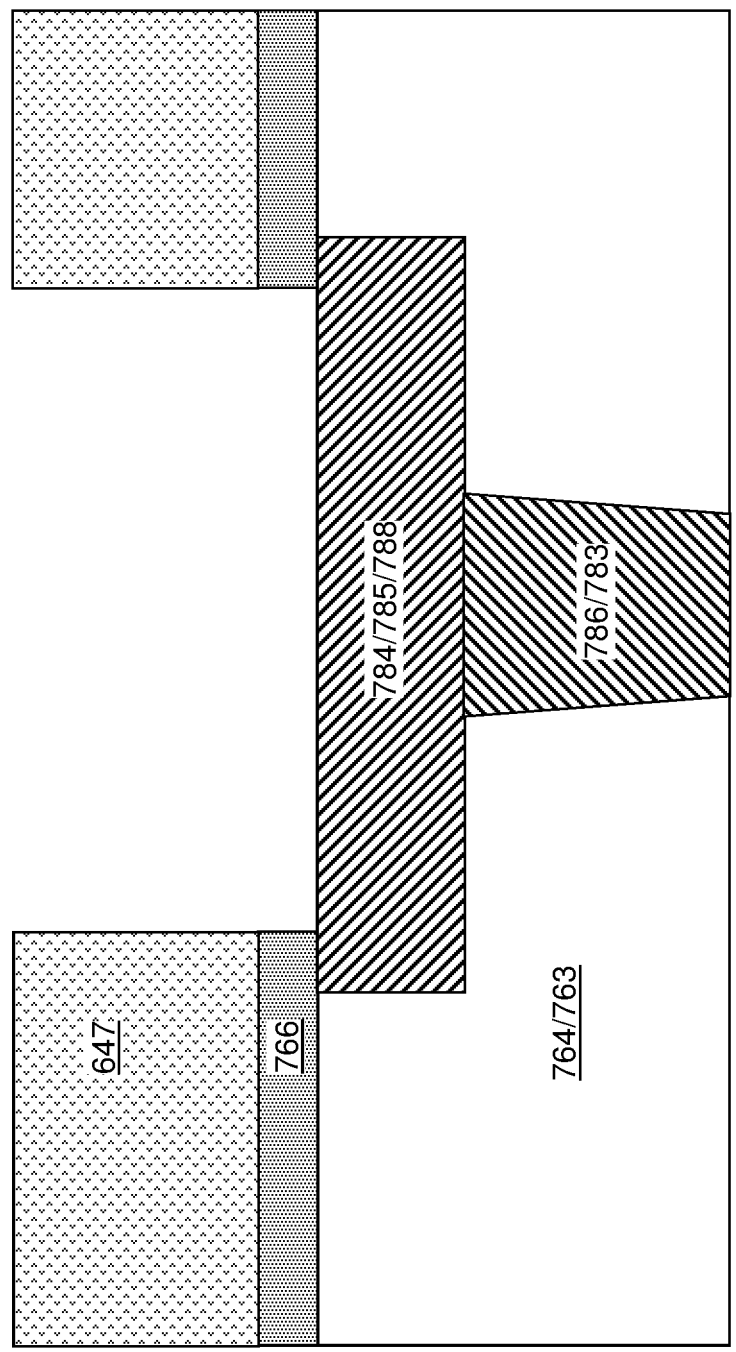
FIG. 51 is a vertical cross-sectional view of a region of the second exemplary structure after formation of an opening into the first-type silicon nitride diffusion barrier layer according to an embodiment of the present disclosure.

Referring to FIG. 51, an etch mask layer 647 including openings is formed over the silicon nitride diffusion barrier layer 766. For example, a photoresist layer (not shown) can be applied over the silicon nitride diffusion barrier layer 766. Openings can be formed in the photoresist layer by lithographic exposure and development. The pattern of the openings in the photoresist layer can be selected such that the openings generally overlie the areas of the topmost lower metal line structures 788. Each of the openings may be entirely within the areas of the topmost lower metal line structures 788, may have a periphery that crosses a periphery of an underlying topmost lower metal line structure 788 at least twice, or may have a periphery that is laterally offset outward from the periphery of an underlying topmost lower metal line structure 788.

An etch process can be performed to etch uncovered portions, i.e., physically exposed portions, of the silicon nitride diffusion barrier layer 766. A set of openings is formed through portions of the silicon nitride diffusion barrier layer 766 that underlie the openings in the photoresist layer. Surfaces of the topmost lower metal line structures 788 are physically exposed. In one embodiment, the etch process can be selective to the first dielectric material layer (764, 763) and the first metal interconnect structure (784, 785, 788) (which is a conductive structure). The photoresist layer can be subsequently removed, for example, by ashing.

Figure 52:
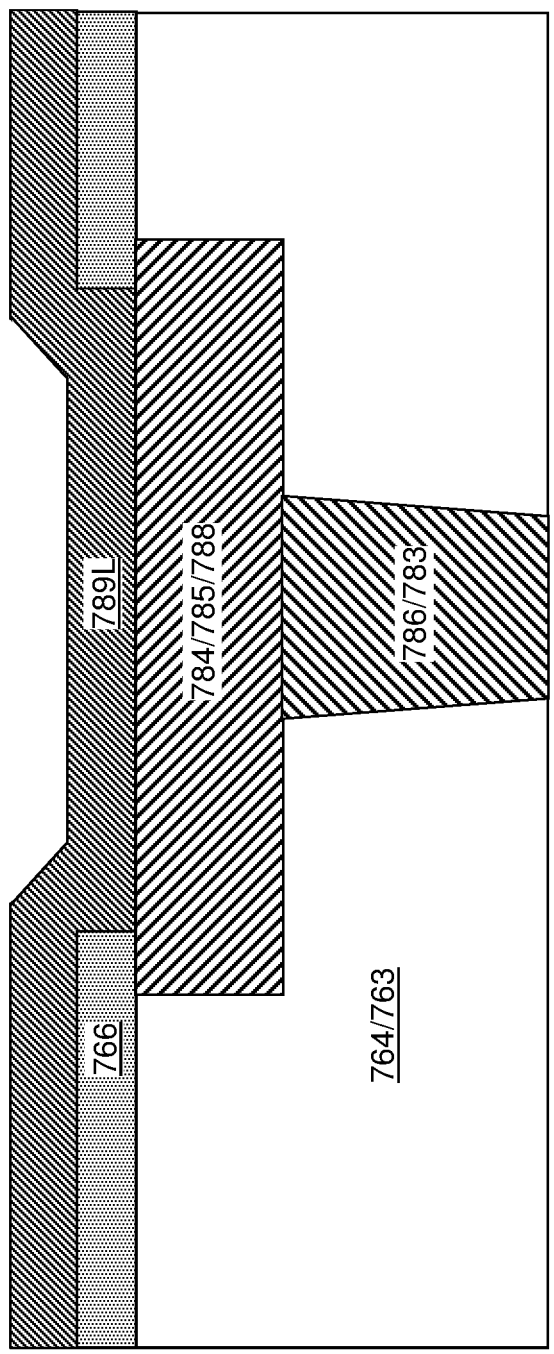
FIG. 52 is a vertical cross-sectional view of a region of the second exemplary structure after deposition of a titanium layer according to an embodiment of the present disclosure.

Referring to FIG. 52, a titanium layer 789L can be deposited in the openings and over the silicon nitride diffusion barrier layer 766. The titanium layer 789L can be deposited by a non-conformal deposition process such as physical vapor deposition (PVD) or by a conformal deposition process such as chemical vapor deposition (CVD). The titanium layer 789L continuously extends over the silicon nitride diffusion barrier layer 766 and fills the set of openings in the silicon nitride diffusion barrier layer 766. The thickness of the horizontal portion of the titanium layer 789L within the openings in the silicon nitride diffusion barrier layer 766 is greater than the thickness of the silicon nitride diffusion barrier layer 766, and may be in a range from 15 nm to 200 nm, such as from 30 nm to 120 nm, although lesser and greater thicknesses can also be employed. The titanium layer 789L can consist essentially of titanium.

Figure 53:
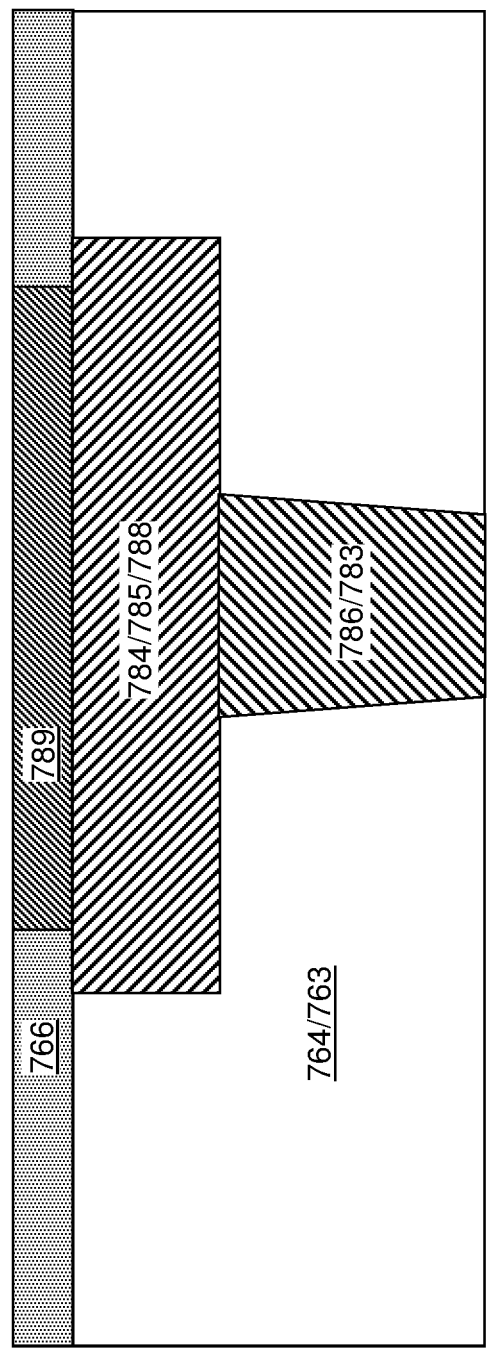
FIG. 53 is a vertical cross-sectional view of a region of the second exemplary structure after formation of a titanium plate according to an embodiment of the present disclosure.

Referring to FIG. 53, portions of the titanium layer 789L overlying a horizontal plane including the top surface of the silicon nitride diffusion barrier layer 766 can be removed by a planarization process. For example, a chemical mechanical planarization (CMP) process can be employed for the planarization process. Each remaining portions of the titanium layer constitutes a titanium plate 789. Generally, a set of openings can be formed in the silicon nitride diffusion barrier layer 766, and a set of titanium plates 789 can be formed in the set of openings in the silicon nitride diffusion barrier layer 766. The set of titanium plates 789 can fill the set of openings in the silicon nitride diffusion barrier layer 766. Each titanium plate 789 among the set of titanium plates 789 can consist essentially of titanium. The silicon nitride diffusion barrier layer 766 and the set of titanium plates 789 complimentarily provide a continuous structure (766, 789) extending over the semiconductor substrate 8 and functioning as a continuous hydrogen diffusion barrier layer. In some configurations, a titanium plate 789 among the set of titanium plates 789 may be formed directly on a top surface a first metal interconnect structure (784, 785, 788) (which is a conductive structure). The titanium plate 789 may, or may not, be formed directly on a top surface of the first dielectric material layer (764, 763) depending on the shape of the titanium plate 789 relative to the shape of the first metal interconnect structure (784, 785, 788).

Figure 54:
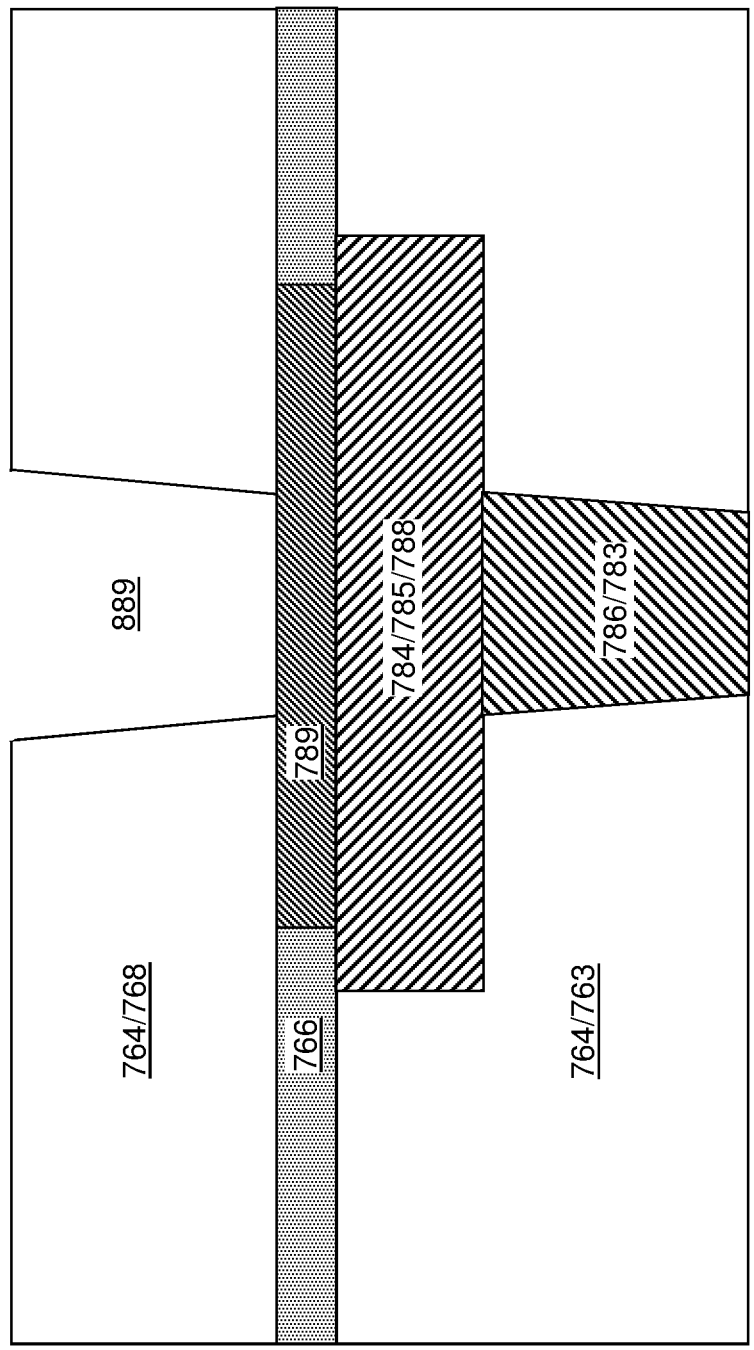
FIG. 54 is a vertical cross-sectional view of a region of the second exemplary structure after formation of a second dielectric material layer and a via cavity therethrough according to an embodiment of the present disclosure.

Referring to FIG. 54, a dielectric material layer, which is herein referred to as a second dielectric material layer (764, 768), can be formed on the combination of the silicon nitride diffusion barrier layer 766 and the set of titanium plates 789. The second dielectric material layer (764, 768) can be a layer within the first dielectric material layers 764 or a layer within the at least one second dielectric layer 768. Subsequent processing steps of the first embodiment can be performed. Via cavities 889 can be formed through the second dielectric material layer (764, 768) onto top surfaces of the set of titanium plates 789. The via cavities 889 can be cavities extending through one of the first dielectric material layers 764 for forming lower metal via structures 786 therein, or may be through-dielectric via cavities 487 extending through the at least one second dielectric layer 768 and dielectric layers located above. A top surface of a titanium plate 789 is physically exposed at the bottom of each via cavity 889. In one embodiment, the bottom periphery of each via cavity 889 can be located entirely within the area of the periphery of an underlying titanium plate 789. In this case, the set of titanium plates 789 can be employed as etch stop structures during formation of via cavities 889. The second dielectric material layer (764, 768) can contact a portion of a top surface of each titanium plate 789.

Figure 55:
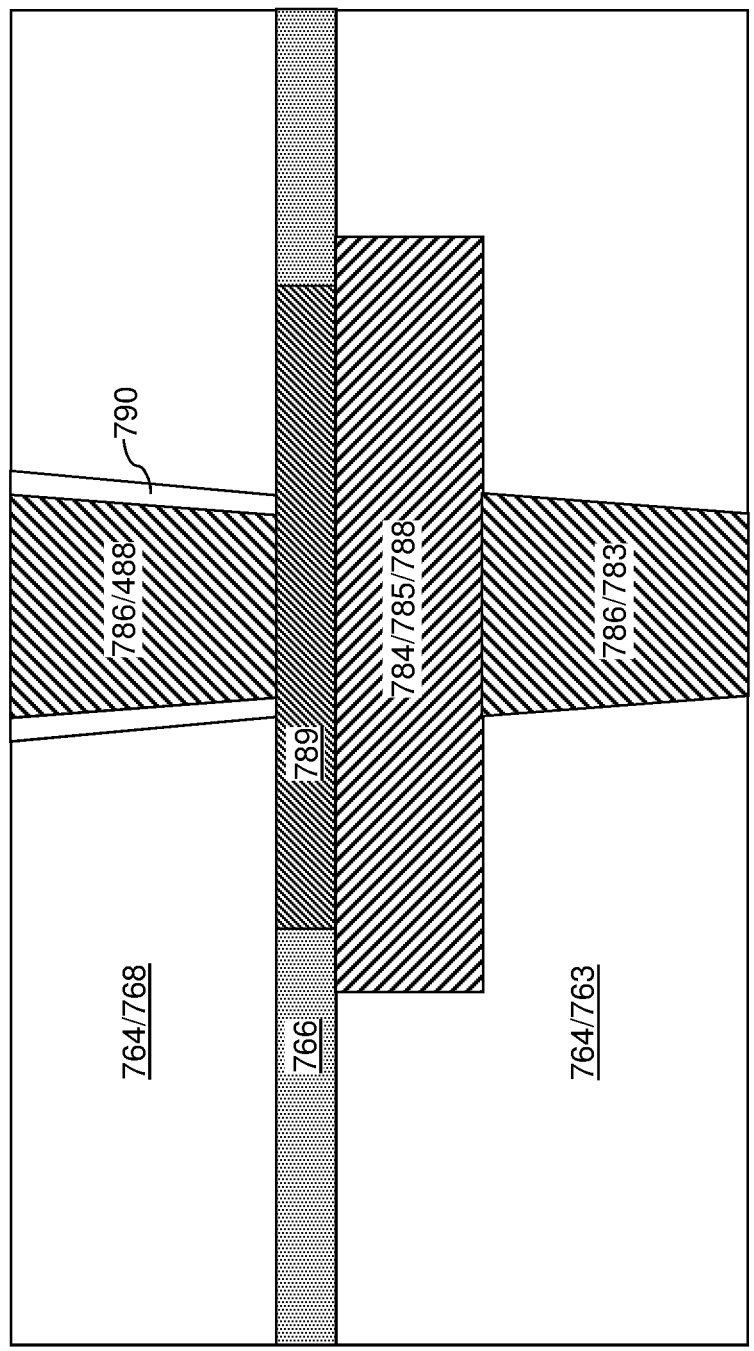
FIG. 55 is a vertical cross-sectional view of a region of the second exemplary structure after formation of a second metal interconnect structure according to an embodiment of the present disclosure.

Referring to FIG. 55, an electrically conductive barrier layer (e.g., TiN) and/or a dielectric spacer 790 may be optionally formed by deposition a dielectric material (such as silicon oxide) and anisotropically etching the dielectric material. The dielectric spacer 790 can have a generally tubular configuration. At least one conductive material is deposited in the via cavities 889 directly on top surfaces of the set of titanium plates 789 by a conformal or a non-conformal deposition process. Excess portions of the at least one conductive material can be removed from above the topmost surface of the second dielectric material layer (764, 768) and any overlying dielectric material portion. Each remaining portion of the at least one conductive material that fills a via cavity 889 constitutes a metal interconnect structure, which is herein referred to as a second metal interconnect structure (786, 488). At least one of the second metal interconnect structures (786, 488) can comprise a via structure. In some embodiments, the second metal interconnect structure (786, 488) can be a lower metal via structure 786. In some embodiments, the second metal interconnect structure (786, 488) can be a through-dielectric contact via structure 488. The second metal interconnect structures (786, 488) are embedded within a second dielectric material layer (764, 768) and over the silicon nitride diffusion barrier layer 766. Each of the second metal interconnect structures (786, 488) can be formed on a top surface of a respective titanium plate 789 among the set of titanium plates 789.

Figure 56:
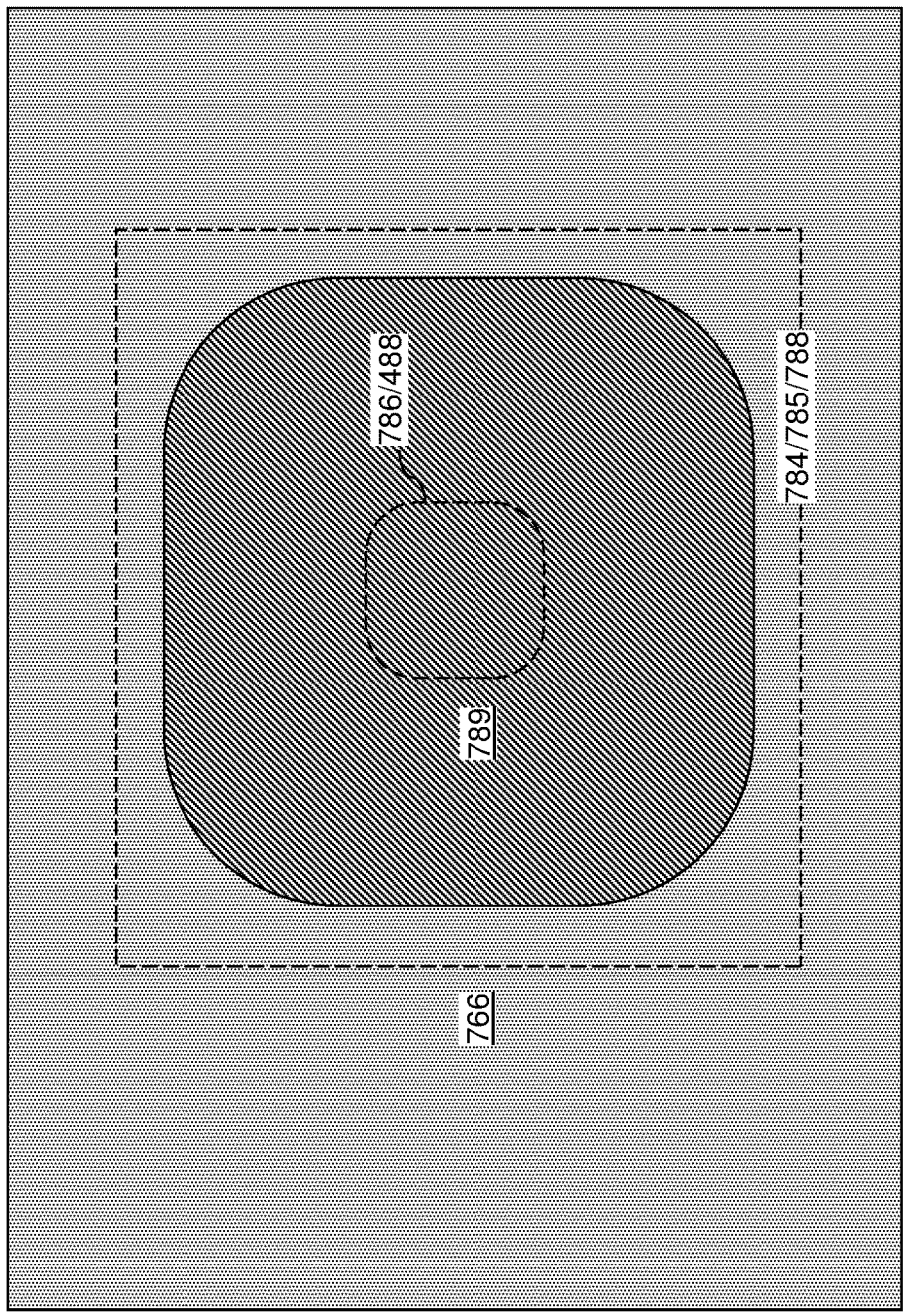
FIG. 56 is a first exemplary plan view of a region of the second exemplary structure that illustrate shapes of a titanium plate, an underlying first metal interconnect structure, and an overlying second metal interconnect structure according to an embodiment of the present disclosure.
Figure 57:
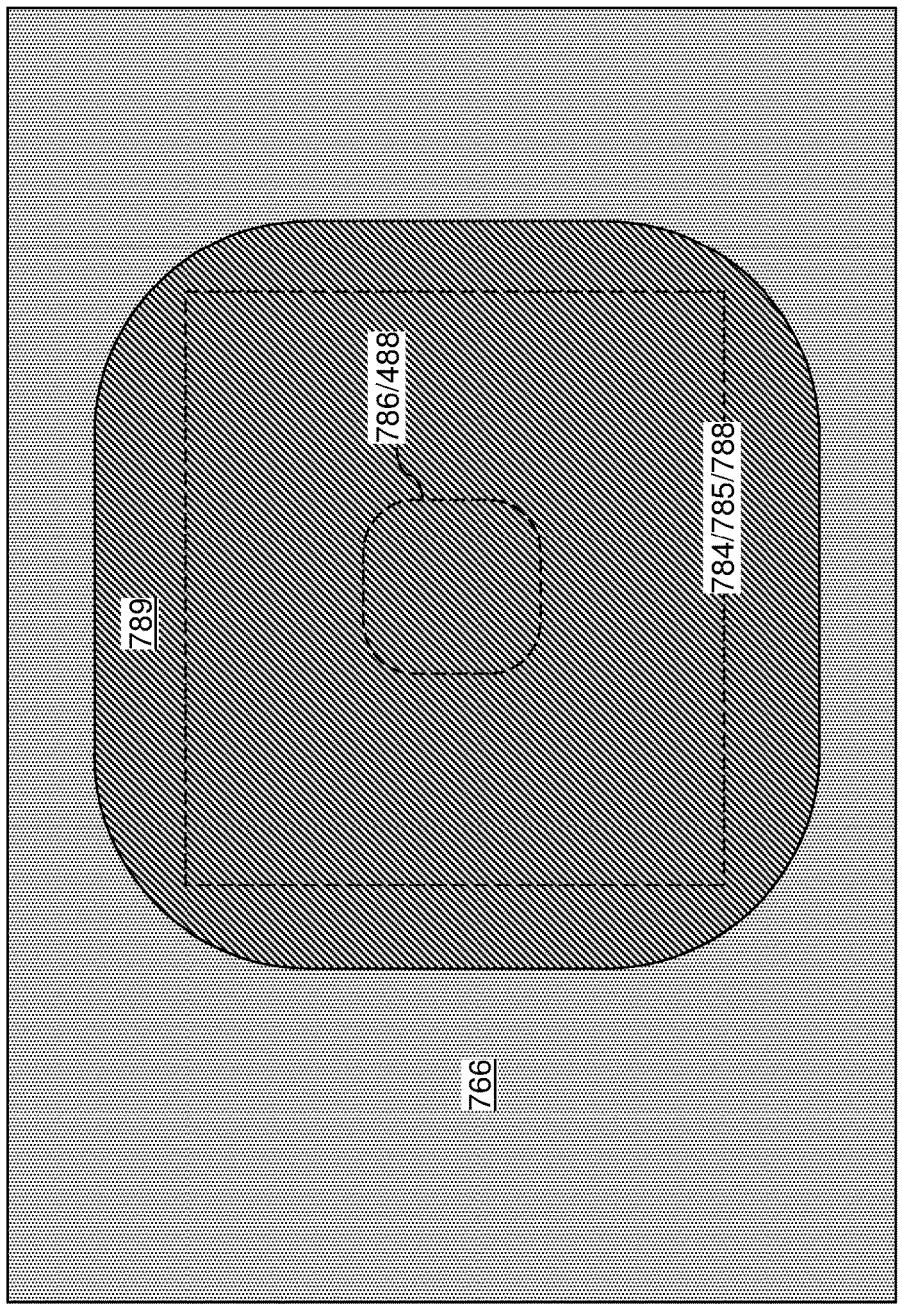
FIG. 57 is a second exemplary plan view of a region of the second exemplary structure that illustrate shapes of a titanium plate, an underlying first metal interconnect structure, and an overlying second metal interconnect structure according to an embodiment of the present disclosure.
Figure 58:
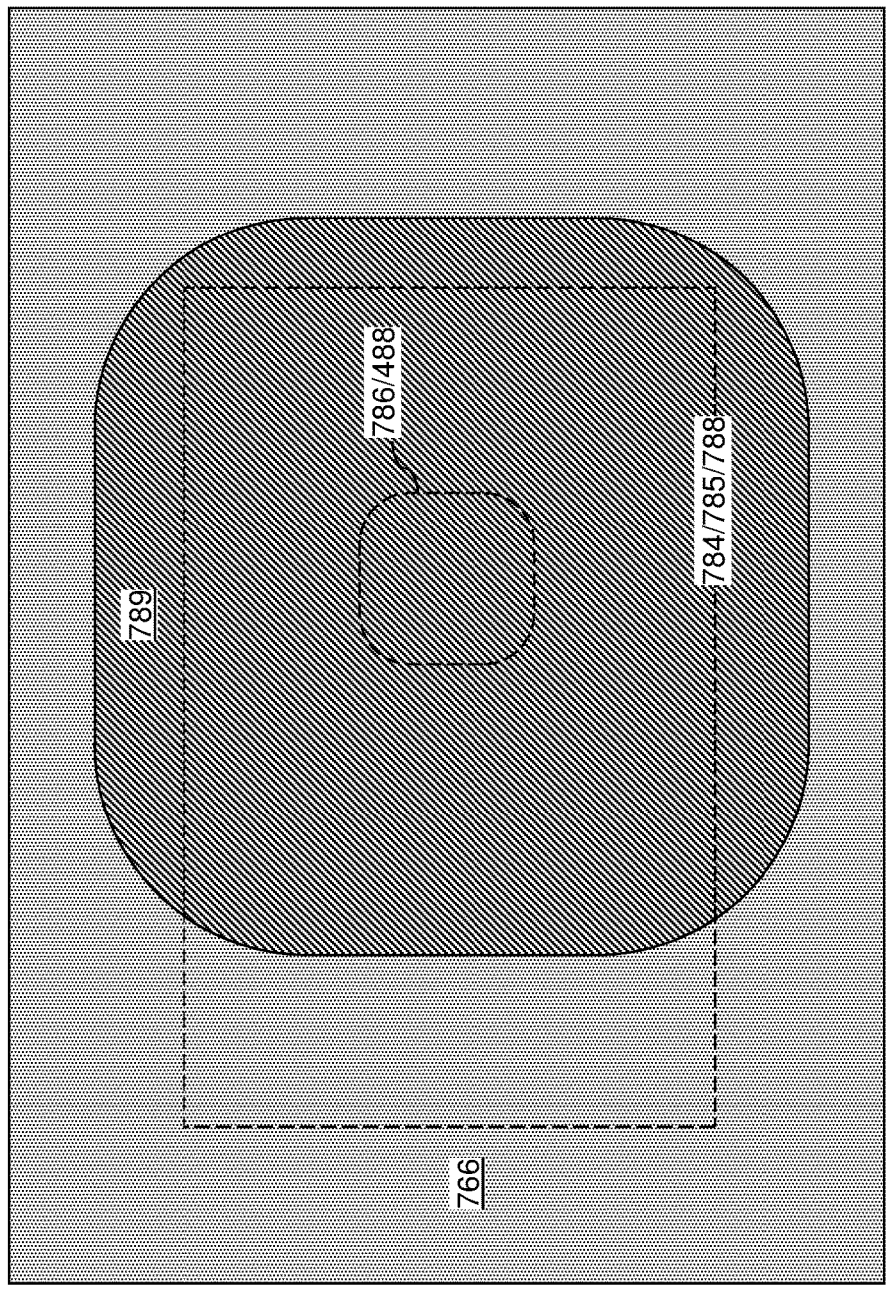
FIG. 58 is a third exemplary plan view of a region of the second exemplary structure that illustrate shapes of a titanium plate, an underlying first metal interconnect structure, and an overlying second metal interconnect structure according to an embodiment of the present disclosure.

FIGS. 56-58 illustrate first through third exemplary plan views of a region of the second exemplary structure. Shapes of a titanium plate 789, an underlying first metal interconnect structure (784, 785, 788), and an overlying second metal interconnect structure (786, 488) are illustrated.

Referring to FIG. 56, the first exemplary plan view illustrates a configuration, in which a bottom periphery of the overlying second metal interconnect structure (786, 488) is located entirely within the area of the titanium plate 789, and in which the periphery of the titanium plate 789 is entirely within a periphery of the underlying first metal interconnect structure (784, 785, 788).

Referring to FIG. 57, the second exemplary plan view illustrates a configuration, in which a bottom periphery of the overlying second metal interconnect structure (786, 488) is located entirely within the area of the underlying first metal interconnect structure (784, 785, 788), and in which the periphery of the underlying first metal interconnect structure (784, 785, 788) is entirely within the periphery of the titanium plate 789. In this configuration, the titanium plate 789 can be formed directly on a top surface of the first dielectric material layer that laterally surround the underlying first metal interconnect structure (784, 785, 788).

Referring to FIG. 58, the third exemplary plan view illustrates a configuration, in which a bottom periphery of the overlying second metal interconnect structure (786, 488) is located entirely within the area of the underlying first metal interconnect structure (784, 785, 788) and entirely within the periphery of the titanium plate 789. The area of the underlying first metal interconnect structure (784, 785, 788) can be partly within the periphery of the titanium plate 789 and partly outside the periphery of the titanium plate 789. Further, the area of the titanium plate 789 can be partly within the periphery of the underlying first metal interconnect structure (784, 785, 788) and partly outside the periphery of the underlying first metal interconnect structure (784, 785, 788). In this configuration, the titanium plate 789 can be formed directly on a top surface of the first dielectric material layer that laterally surround the underlying first metal interconnect structure (784, 785, 788).

FIGS. 59-63 illustrate a sequence of processing steps that can be employed to form the fifth configuration of the second exemplary structure shown in FIG. 49, which includes a combination of a silicon nitride diffusion barrier layer 674 including a set of openings therein and a set of titanium plates 789A filling the set of openings. The silicon nitride diffusion barrier layer 674 located on a top surface of a planarization dielectric layer 664 and below the via level dielectric layer 666 can be formed employing the sequence of processing steps of FIGS. 59-63. The silicon nitride diffusion barrier layer 674 formed by the sequence of processing steps of FIGS. 59-63 is herein referred to as a second-type silicon nitride diffusion barrier layer.

Figure 59:
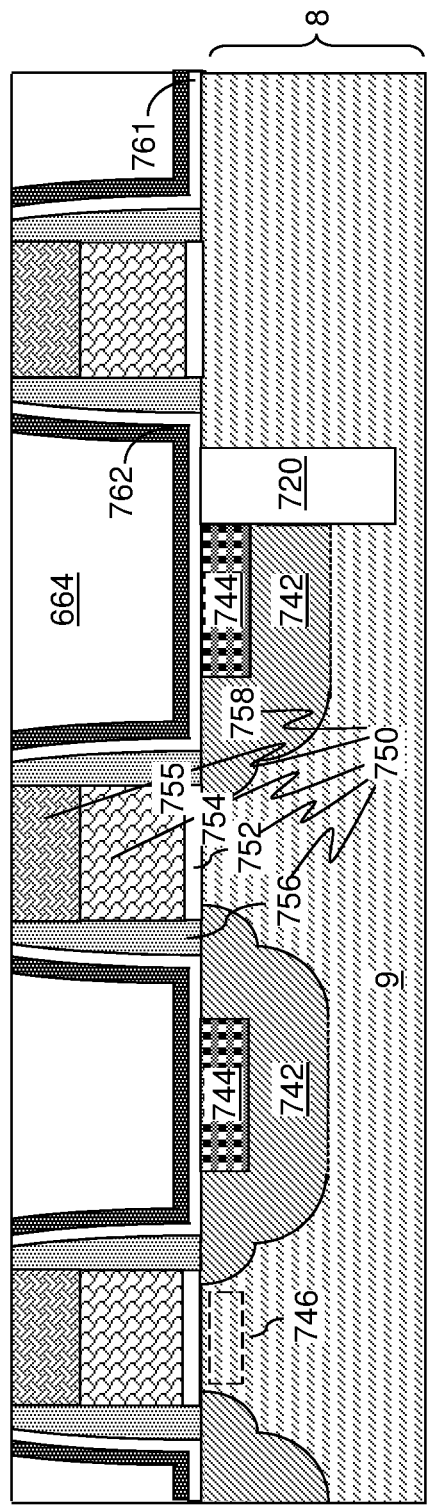
FIG. 59 is a vertical cross-sectional view of a region of the second exemplary structure that can be incorporated into various configurations after planarization of a planarization dielectric layer according to an embodiment of the present disclosure.

Referring to FIG. 59, a configuration of the second exemplary structure can be derived from the first exemplary structure of FIG. 1 by depositing and planarizing the dielectric material of the planarization dielectric layer 664 such that portions of the silicon nitride liner 762, portions of the silicon oxide liner 761, gate cap dielectric 758, and portions of the dielectric gate spacers 756 that overlie a horizontal plane including the top surfaces of the gate electrodes (754, 755) are removed by the planarization process. The planarization process can be a chemical mechanical planarization (CMP) process that employs top surfaces of the gate electrodes (754, 755) as stopping surfaces. The continuous remaining portion of the planarization dielectric material comprises the planarization dielectric layer 664. Physically exposed surfaces of the remaining portions of the silicon nitride liner 762, remaining portions of the silicon oxide liner 761, remaining portions of the dielectric gate spacers 756, and the gate electrodes (754, 755) can be within the same horizontal plane as the top surface of the planarization dielectric layer 664 after the planarization process. Each gate electrode (754, 755) is a conductive structure of a respective field effect transistor that is physically exposed by the planarization process.

Figure 60:
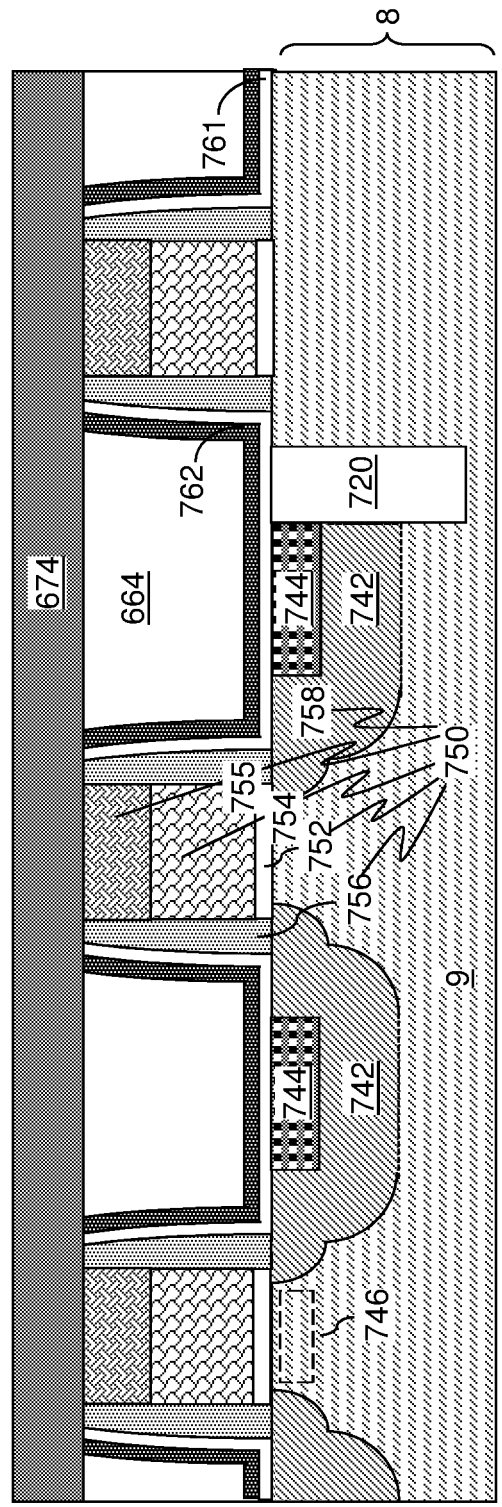
FIG. 60 is a vertical cross-sectional view of a region of the second exemplary structure after formation of a second-type silicon nitride diffusion barrier layer according to an embodiment of the present disclosure.

Referring to FIG. 60, the silicon nitride diffusion barrier layer 674 can be formed directly on the topmost surfaces of the planarization dielectric layer 664 (which is also referred to as a first dielectric material layer herein) and the gate electrode (754, 755) (which are conductive structures of the semiconductor devices 710). The silicon nitride diffusion barrier layer 674 can be formed on planar top surfaces of the dielectric gate spacers 756 that laterally surround a respective one of the gate electrodes (754, 755). The silicon nitride diffusion barrier layer 674 can be formed by low pressure chemical vapor deposition (LPCVD) process employing dichlorosilane (DCS) and ammonia as reactant gases at a temperature in a range from 600 degrees Celsius and 900 degrees Celsius and at a pressure in a range from 100 mTorr to 500 mTorr. However, other materials, pressures and temperatures may be used. For example, the silicon nitride may be deposited from other reactant gases or by a method other than LPCVD, or another dielectric material may be used instead of or in addition to silicon nitride. The silicon nitride diffusion barrier layer 674 can be stoichiometric, i.e., have an atomic ratio of 3:4 between silicon atoms and nitrogen atoms. The thickness of the silicon nitride diffusion barrier layer 766 can be in a range from 10 nm to 100 nm, such as from 20 nm to 60 nm, although lesser and greater thicknesses can also be employed. In one embodiment, the silicon nitride diffusion barrier layer 674 has a planar top surface.

Figure 61:
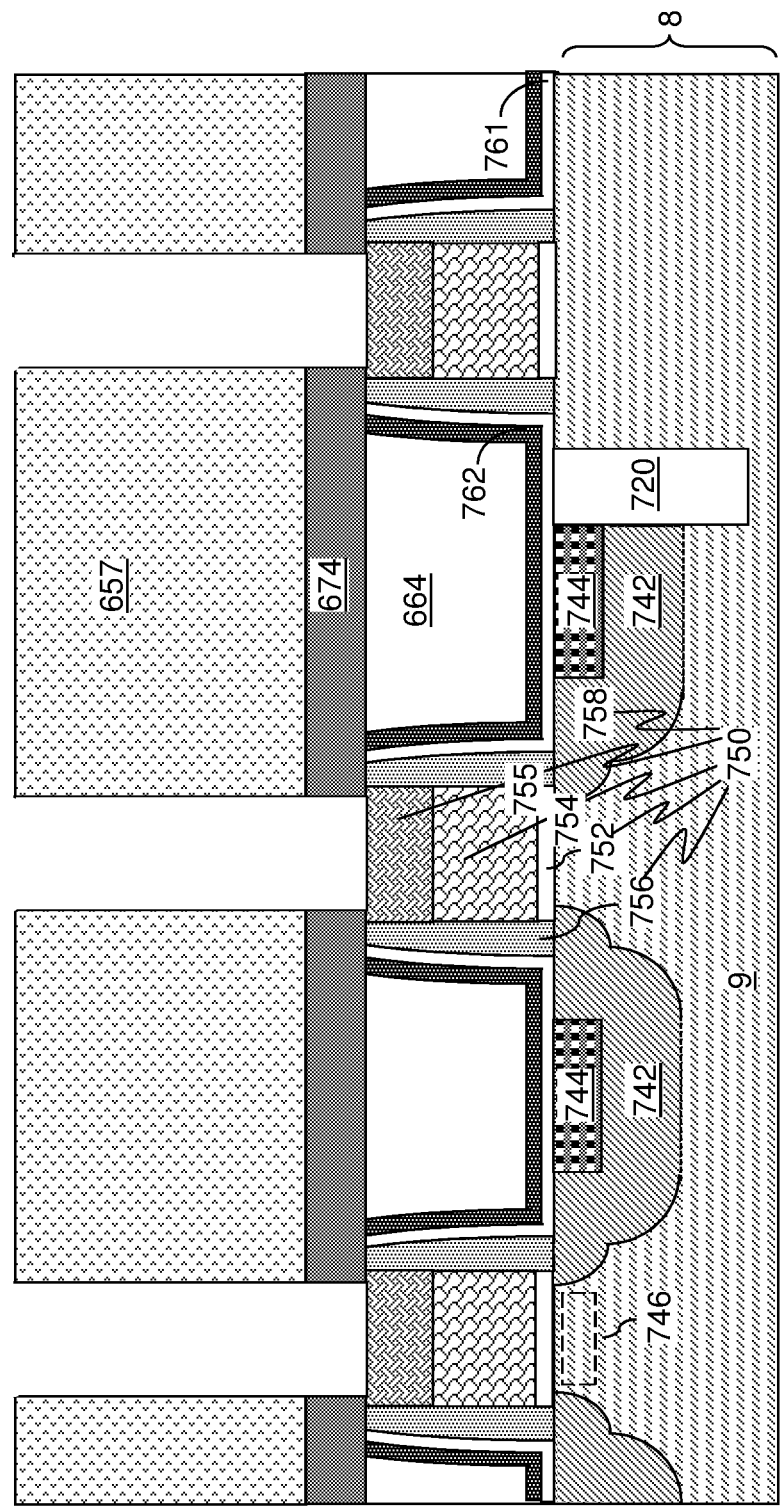
FIG. 61 is a vertical cross-sectional view of a region of the second exemplary structure after formation of openings through the second-type silicon nitride diffusion barrier layer according to an embodiment of the present disclosure.

Referring to FIG. 61, an etch mask layer 657 including openings is formed over the silicon nitride diffusion barrier layer 674. For example, a photoresist layer (not shown) can be applied over the silicon nitride diffusion barrier layer 674. Openings can be formed in the photoresist layer by lithographic exposure and development. The pattern of the openings in the photoresist layer can be selected such that the openings overlie the areas of the conductive structures that contact the bottom surface of the silicon nitride diffusion barrier layer 674. For example, the openings in the photoresist layer can overlie the areas of the gate electrodes (754, 755). Each of the openings may be entirely within the areas of a gate electrode (754, 755), may have a periphery that crosses a periphery of a gate electrode (754, 755) at least twice, or may have a periphery that is laterally offset outward from the periphery of a gate electrode (754, 755).

An etch process can be performed to etch uncovered portions, i.e., physically exposed portions, of the silicon nitride diffusion barrier layer 674. A set of openings is formed through portions of the silicon nitride diffusion barrier layer 674 that underlie the openings in the photoresist layer. Surfaces of the conductive structures (such as the gate electrodes (754, 755)) are physically exposed. In one embodiment, the etch process can be selective to the conductive structures (such as the gate electrodes (754, 755)). The photoresist layer can be subsequently removed, for example, by ashing.

Figure 62:
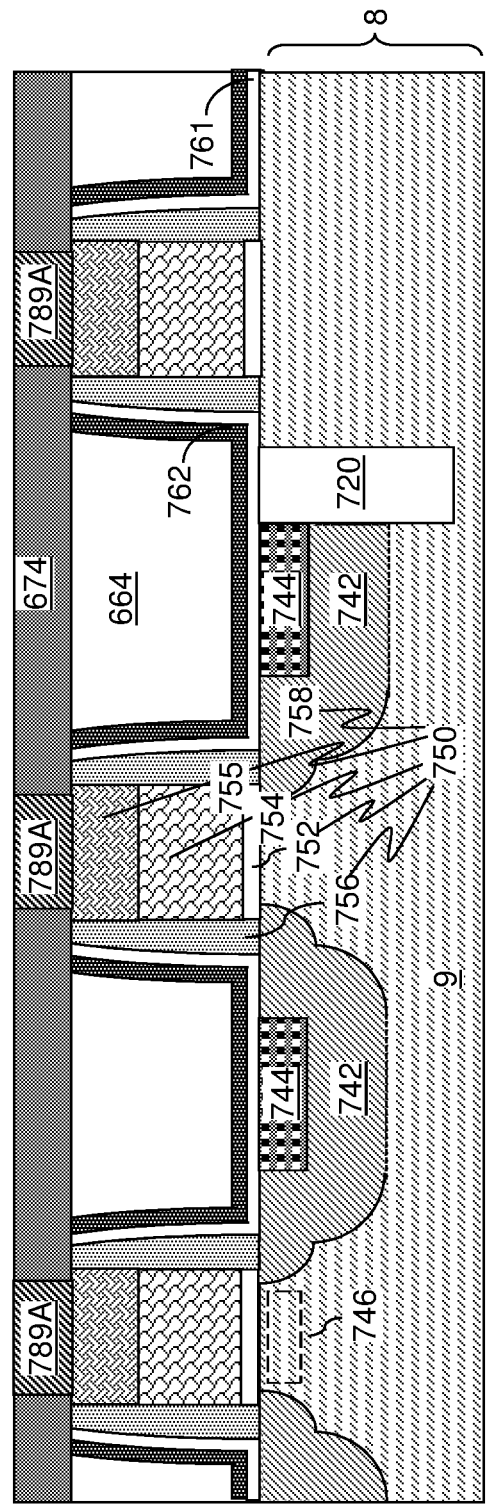
FIG. 62 is a vertical cross-sectional view of a region of the second exemplary structure after formation of titanium plates according to an embodiment of the present disclosure.

Referring to FIG. 62, a titanium layer can be deposited in the openings and over the silicon nitride diffusion barrier layer 674. The titanium layer can be deposited by a non-conformal deposition process such as physical vapor deposition (PVD) or by a conformal deposition process such as chemical vapor deposition (CVD). The titanium layer continuously extends over the silicon nitride diffusion barrier layer 674 and fills the set of openings in the silicon nitride diffusion barrier layer 674. The thickness of the horizontal portion of the titanium layer within the openings in the silicon nitride diffusion barrier layer 674 is greater than the thickness of the silicon nitride diffusion barrier layer 674, and may be in a range from 15 nm to 200 nm, such as from 30 nm to 120 nm, although lesser and greater thicknesses can also be employed. The titanium layer can consist essentially of titanium.

Portions of the titanium layer overlying a horizontal plane including the top surface of the silicon nitride diffusion barrier layer 674 can be removed by a planarization process. For example, a chemical mechanical planarization (CMP) process can be employed for the planarization process. Each remaining portions of the titanium layer constitutes a titanium plate 789A. Generally, a set of openings can be formed in the silicon nitride diffusion barrier layer 674, and a set of titanium plates 789A can be formed in the set of openings in the silicon nitride diffusion barrier layer 674. The set of titanium plates 789A can fill the set of openings in the silicon nitride diffusion barrier layer 674. Each titanium plate 789A among the set of titanium plates 789A can consist essentially of titanium. The silicon nitride diffusion barrier layer 674 and the set of titanium plates 789A complimentarily provide a continuous structure (674, 789A) extending over the semiconductor substrate 8 and functioning as a continuous hydrogen diffusion barrier layer.

Figure 63:
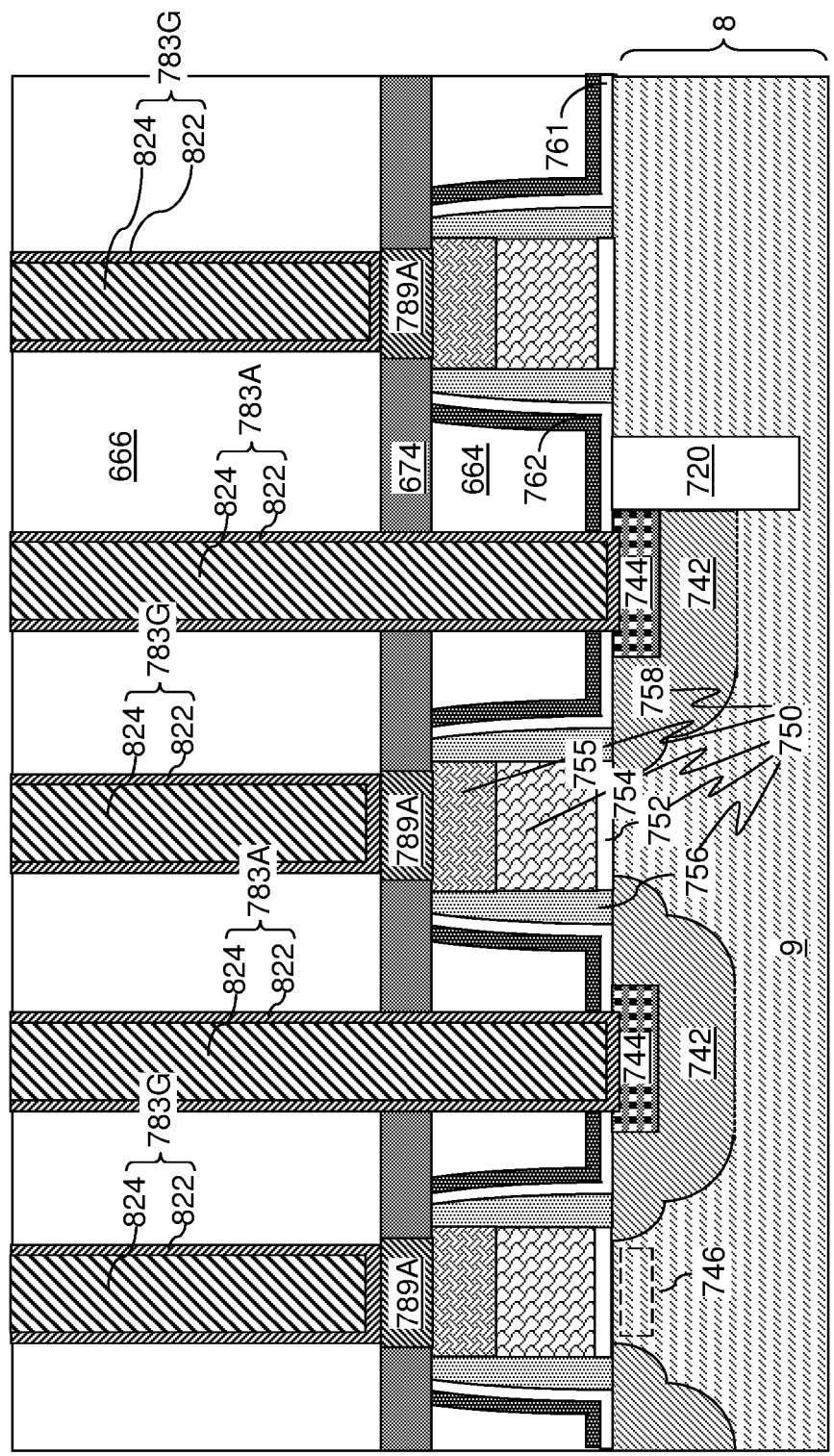
FIG. 63 is a vertical cross-sectional view of a region of the second exemplary structure after formation of a second dielectric material layer, first metal interconnect structures, and second metal interconnect structure according to an embodiment of the present disclosure.

Referring to FIG. 63, a via level dielectric layer 666, which is herein referred to as a second dielectric material layer, can be formed on the combination of the silicon nitride diffusion barrier layer 674 and the set of titanium plates 789A. Via cavities can be formed through the via level dielectric layer 666, the silicon nitride diffusion barrier layer 674, the planarization dielectric layer 664, the silicon nitride liner 762, and the silicon oxide liner 761. The via cavities include substrate via cavities extending to active regions 742 within the silicon substrate 8 or metal silicide portions 744 located on the active regions 742, and gate via cavities extending to a top surface of a respective one of the titanium plates 789A. A top surface of a titanium plate 789A is physically exposed at the bottom of each gate via cavity.

At least one conductive material is deposited in the substrate via cavities and in the gate via cavities. The at least one conductive material can be deposited directly on top surfaces of the set of titanium plates 789A by a conformal or a non-conformal deposition process. Excess portions of the at least conductive material can be removed from above the topmost surface of the second dielectric material layer (which can be the via level dielectric layer 666). Each remaining portion of the at least one conductive material that fills a substrate via cavity constitutes a substrate contact via structure 783A. Each remaining portion of the at least one conductive material that fills a gate via cavity constitutes a gate contact via structure 783G. The substrate contact via structures 783A are herein referred to as first metal interconnect structures, and the gate contact via structures 783G are herein referred to as second metal interconnect structures. Thus, the second metal interconnect structures 783G comprise via structures. Each of the first metal interconnect structures 783A and the second metal interconnect structures 783G (i.e., the substrate contact via structures 783A and the gate contact via structures 783G) can include a metallic liner 822 and a metal fill portion 824. The metallic liners 822 can include a conductive metal nitride such as TiN, TaN, or WN. The metal fill portions 824 can include an elemental metal such as tungsten, copper, cobalt, molybdenum, or ruthenium. Each of the second metal interconnect structures 783G can be formed on a top surface of a respective titanium plate 789A among the set of titanium plates 789A.

As illustrated in the second through fifth configurations of the second exemplary structure, more than two vertically spaced combinations of a silicon nitride diffusion barrier layer (766, 7661, 7662, 7663, 674) and a set of titanium plates (789, 789A, 789B, 789C, 789D) can be formed in the second exemplary structure. Thus, after formation of a combination of a silicon nitride diffusion barrier layer (766, 7661, 7662, 674) and a set of titanium plates (789, 789A, 789B, 789C), additional processing steps can be performed to form another combination of a silicon nitride diffusion barrier layer (766, 7661, 7662, 7663) and a set of titanium plates (789, 789B, 789C, 789D). A sequence of such processing steps for forming such an additional combination of a silicon nitride diffusion barrier layer (766, 7661, 7662, 7663) and a set of titanium plates (789, 789B, 789C, 789D) can include, for example, forming an additional silicon nitride diffusion barrier layer (766, 7661, 7662, 7663) over the second dielectric material layer (763, 764), forming a set of additional openings through the additional silicon nitride diffusion barrier layer (766, 7661, 7662, 7663), and forming a set of additional titanium plates (789, 789B, 789C, 789D) in the set of additional openings. The additional silicon nitride diffusion barrier layer (766, 7661, 7662, 7663) and the set of additional titanium plates (789, 789B, 789C, 789D) complimentarily provide an additional continuous structure extending over the underlying continuous structure that functions as a continuous hydrogen diffusion barrier layer. Another one of the second metal interconnect structures (784, 785, 788) contacts a bottom surface of an additional titanium plate (789, 789B, 789C, 789D) among the set of additional titanium plates (789, 789B, 789C, 789D). Third metal interconnect structures (786, 488) is embedded within a third dielectric material layer (764, 768) and located over the additional silicon nitride diffusion barrier layer (766, 7661, 7662, 7663). One of the third metal interconnect structures (786, 488) is formed on a top surface of the additional titanium plate (789, 789B, 789C, 789D) among the set of additional titanium plates (789, 789B, 789C, 789D).

A three-dimensional NAND memory array can be formed over the second dielectric material layer (763, 764, 768) and/or the third dielectric material layer (764, 768). The semiconductor devices 710 can comprise a driver circuit of the three-dimensional NAND memory array.

In one embodiment, each titanium plate (789, 789A, 789B, 789C, 789D) can have a respective uniform thickness, and the silicon nitride diffusion barrier layer (766, 7661, 7662, 7663, 674) laterally surrounding the titanium plate (789, 789A, 789B, 789C, 789D) can have the same uniform thickness.

For each combination of a silicon nitride diffusion barrier layer (766, 7661, 7662, 7663, 674) and a set of titanium plates (789, 789A, 789B, 789C, 789D) laterally surrounded by the silicon nitride diffusion barrier layer (766, 7661, 7662, 7663, 674), a planar top surface of each titanium plate (789, 789A, 789B, 789C, 789D) can be within a horizontal plane containing a top surface of the silicon nitride diffusion barrier layer (766, 7661, 7662, 7663, 674), and a planar bottom surface of each titanium plate (789, 789A, 789B, 789C, 789D) can be with another horizontal plane containing a bottom surface of the silicon nitride diffusion barrier layer (766, 7661, 7662, 7663, 674). In one embodiment, each titanium plate (789, 789A, 789B, 789C, 789D) among the set of titanium plates (789, 789A, 789B, 789C, 789D) consists essentially of titanium.

In one embodiment, a portion of a bottom surface of a titanium plate (789, 789A, 789B, 789C, 789D) among the set of titanium plates (789, 789A, 789B, 789C, 789D) directly contacts the first dielectric material layer (664, 763, 764), a portion of a top surface of the titanium plate (789, 789A, 789B, 789C, 789D) among the set of titanium plates (789, 789A, 789B, 789C, 789D) directly contacts the second dielectric material layer (763, 764, 768), and an entire periphery of a bottom surface of one of the second metal interconnect structures (786, 488) contacts another portion of the top surface of the titanium plate (789, 789A, 789B, 789C, 789D).

In one embodiment, the conductive structure contacting a bottom surface of one of a titanium plate (789, 789B, 789C, 789D) comprises one of the first metal interconnect structures (784, 785, 788), a bottom surface of the first dielectric material layer (682, 764) is more distal from the semiconductor substrate 8 than a topmost surface of the semiconductor devices 710 is from the semiconductor substrate 8, and a second metal interconnect structure (786, 488) contacting a top surface of a titanium plate 789A comprises a via structure.

In one embodiment, the conductive structure contacting a bottom surface of one of a titanium plate 789A comprises a gate electrode (754, 755) of a field effect transistor, the first dielectric material layer 664 comprises a material selected from an undoped silicate glass, a doped silicate glass, and an organosilicate glass, and laterally surrounds the gate electrode (754, 755), and one of the second metal interconnect structures 783G contacting a top surface of the titanium plate 789A comprises a via structure. In one embodiment, the silicon nitride diffusion barrier layer 674 contacts a planar top surface of a dielectric gate spacer 756 that laterally surrounds the gate electrode (754, 755).

The semiconductor structure can further comprise an additional silicon nitride diffusion barrier layer (766, 7661, 7662, 7663) overlying the second dielectric material layer (666, 764, 768) and including a set of additional openings therein. A set of additional titanium plates (789, 789B, 789C, 789C) fill the set of additional openings. The additional silicon nitride diffusion barrier layer (766, 7661, 7662, 7663) and the set of additional titanium plates (789, 789B, 789C, 789C) complimentarily provide an additional continuous hydrogen diffusion barrier structure extending over the continuous hydrogen diffusion barrier structure, and another one of the second metal interconnect structures (784, 785, 788) contacts a bottom surface of an additional titanium plate (789, 789B, 789C, 789C) among the set of additional titanium plates (789, 789B, 789C, 789C). Third metal interconnect structures (786, 488) are embedded within a third dielectric material layer (764, 768) overlying the additional silicon nitride diffusion barrier layer (766, 7661, 7662, 7663). One of the third metal interconnect structures (786, 488) contacts a top surface of the additional titanium plate (789, 789B, 789C, 789C) among the set of additional titanium plates (789, 789B, 789C, 789C).

A three-dimensional NAND memory array can be located over the second dielectric material layer. The semiconductor devices 710 can comprise a driver circuit of the three-dimensional NAND memory array.

One or more combinations of a silicon nitride diffusion barrier layer with openings therein and a set of titanium plates filling the openings can be employed as at least one continuous hydrogen diffusion barrier structure that reduces or prevents hydrogen diffusion into the semiconductor devices 710 from overlying structures such as a three-dimensional NAND memory array. Performance degradation of the semiconductor devices 710 on the semiconductor substrate 8 due to hydrogen diffusion from overlying structures can be eliminated or significantly reduced by the at least one continuous hydrogen diffusion barrier structure of embodiments of the present disclosure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A semiconductor structure, comprising:
   a semiconductor device located on a semiconductor substrate;
   a planarization dielectric layer located on the semiconductor device and over the semiconductor substrate;
   a silicon nitride diffusion barrier layer located on the planarization dielectric layer;
   a via level dielectric layer overlying the silicon nitride diffusion barrier layer; and
   a composite contact via structure in contact with a component of the semiconductor device and extending through the planarization dielectric layer, the silicon nitride diffusion barrier layer, and the via level dielectric layer, wherein the composite contact via structure comprises, from bottom to top:
   a lower metallic via structure in contact with the component of the semiconductor device;
   a titanium diffusion barrier structure in contact with a top surface of the lower metallic via structure and contacting the silicon nitride diffusion barrier layer; and
   an upper metallic via structure overlying, and electrically contacts the titanium diffusion barrier structure and extending through the via level dielectric layer,
   wherein:
   a top surface of the lower metallic via structure contacts the titanium diffusion barrier structure; and
   the top surface of the lower metallic via structure is located between a horizontal plane including a top surface of the silicon nitride diffusion barrier layer and a horizontal plane including a bottom surface of the silicon nitride diffusion barrier layer.

2. The semiconductor structure of claim 1, wherein the semiconductor device is a field effect transistor, and the component of the semiconductor device is selected a gate electrode, a source region or a drain region of the field effect transistor.

3. The semiconductor structure of claim 2, further comprising a three-dimensional NAND memory array located over the composite contact via structure and over the field effect transistor, wherein the field effect transistor is a part of a driver circuit of the three-dimensional NAND memory array.

4. The semiconductor structure of claim 1, wherein:
the lower metallic via structure comprises a lower metal nitride liner in contact with the component of the semiconductor device and a lower metal fill portion consisting essentially of at least one first metal element and embedded in the lower metal nitride liner and contacting a bottom surface of the titanium diffusion barrier structure; and
the upper metallic via structure comprises an upper metal nitride liner and an upper metal fill portion consisting essentially of at least one second metal element and embedded in the upper metal nitride liner.

5. The semiconductor structure of claim 1, wherein a sidewall of the titanium diffusion barrier structure and a sidewall of the upper metallic via structure contact only dielectric surfaces and do not contact any conductive surface.

6. The semiconductor structure of claim 1, wherein:
an upper portion of a sidewall of the lower metallic via structure contacts a lower portion of a sidewall of the silicon nitride diffusion barrier layer; and
a top surface of the composite contact via structure is within a same horizontal plane as a top surface of the via level dielectric layer.

7. The semiconductor structure of claim 1, wherein a top surface of the titanium diffusion barrier structure is located below a horizontal plane including a top surface of the silicon nitride barrier layer.

8. The semiconductor structure of claim 1, wherein a sidewall of the titanium diffusion barrier structure contacts a sidewall of the silicon nitride diffusion barrier layer and is vertically coincident with an outer sidewall of the upper metallic via structure, and with an outer sidewall of the lower metallic via structure.

9. The semiconductor structure of claim 1, wherein:
a sidewall of the titanium diffusion barrier structure contacts a sidewall of the silicon nitride diffusion barrier layer and is vertically coincident with an outer sidewall of the upper metallic via structure; and
the titanium diffusion barrier structure has a greater maximum lateral dimension than a maximum lateral dimension of the lower metallic via structure.

10. The semiconductor structure of claim 1, wherein the upper metallic via structure has a lesser maximum lateral dimension than a maximum lateral dimension of the titanium diffusion barrier structure.

11. The semiconductor structure of claim 1, wherein the titanium diffusion barrier structure consists essentially of titanium.

12. The semiconductor structure of claim 1, wherein a top surface of the lower metallic via structure and a horizontal surface of the silicon nitride diffusion barrier layer contact a bottom surface of the titanium diffusion barrier structure.

13. The semiconductor structure of claim 1, wherein an entirety of an interface between the titanium diffusion barrier structure and the silicon nitride diffusion barrier layer is vertically coincident with an entirety of an interface between the upper metallic via structure and the via level dielectric layer.

14. The semiconductor structure of claim 13, wherein an entirety of an interface between the upper metallic via structure and the silicon nitride diffusion barrier layer is vertically coincident with the entirety of the interface between the upper metallic via structure and the via level dielectric layer.

15. The semiconductor structure of claim 13, wherein an entirety of an interface between the lower metallic via structure and the planarization dielectric layer is vertically coincident with the entirety of the interface between the titanium diffusion barrier structure and the silicon nitride diffusion barrier layer.

16. The semiconductor structure of claim 1, wherein:
the upper metallic via structure has a same lateral dimension irrespective of a distance from the substrate between an interface with the titanium diffusion barrier structure and a horizontal plane including a top surface of the via level dielectric layer; and
an entirety of a sidewall of the upper metallic via structure is vertically coincident with an entirety of a sidewall of the titanium diffusion barrier structure.

17. The semiconductor structure of claim 1, wherein:
an entirety of a bottom surface of the titanium diffusion barrier structure contacts an entirety of a top surface of the lower metallic via structure;
an entirety of a sidewall of the titanium diffusion barrier structure contacts a sidewall of the silicon nitride diffusion barrier layer; and
an entirety of a top surface of the titanium diffusion barrier structure contacts an entirety of a bottom surface of the lower metallic via structure.

* * * * *